(12) United States Patent
Herbert et al.

(10) Patent No.: US 12,043,634 B2
(45) Date of Patent: Jul. 23, 2024

(54) METAL COMPLEXES, METHODS OF MAKING THE SAME, AND USES THEREOF

(71) Applicant: University of Manitoba, Winnipeg (CA)

(72) Inventors: David E. Herbert, Winnipeg (CA); Jason D. Braun, Winnipeg (CA)

(73) Assignee: The University of Manitoba, Winnipeg (CA)

( * ) Notice: Subject to any disclaimer, the term of this patent is extended or adjusted under 35 U.S.C. 154(b) by 627 days.

(21) Appl. No.: 17/414,912

(22) PCT Filed: Dec. 9, 2019

(86) PCT No.: PCT/CA2019/051766
§ 371 (c)(1),
(2) Date: Jun. 16, 2021

(87) PCT Pub. No.: WO2020/124206
PCT Pub. Date: Jun. 25, 2020

(65) Prior Publication Data
US 2022/0064198 A1 Mar. 3, 2022

Related U.S. Application Data

(60) Provisional application No. 62/781,553, filed on Dec. 18, 2018.

(51) Int. Cl.
| | |
|---|---|
| *H10K 30/30* | (2023.01) |
| *B01J 31/18* | (2006.01) |
| *B01J 35/39* | (2024.01) |
| *C07F 15/02* | (2006.01) |
| *H10K 50/11* | (2023.01) |
| *H10K 85/30* | (2023.01) |
| *H01G 9/20* | (2006.01) |
| *H10K 10/46* | (2023.01) |

(52) U.S. Cl.
CPC ........... *C07F 15/025* (2013.01); *B01J 31/183* (2013.01); *B01J 35/39* (2024.01); *H10K 85/331* (2023.02); *H01G 9/2059* (2013.01); *H10K 10/488* (2023.02); *H10K 30/30* (2023.02); *H10K 50/11* (2023.02)

(58) Field of Classification Search
CPC ........ C07F 15/025; B01J 35/39; B01J 31/183; H10K 85/331; H10K 30/30; H10K 50/11; H10K 10/488; H01G 9/2059
See application file for complete search history.

(56) References Cited

U.S. PATENT DOCUMENTS 9,169,282 B2    10/2015  Stoessel et al.
11,932,659 B2 *  3/2024  Stoessel ............... H10K 85/342

FOREIGN PATENT DOCUMENTS

WO    2006013048 A1    2/2006

OTHER PUBLICATIONS

Macrae, C. F. et al., "Mercury CSD 2.0—New Features for the Visualization and Investigation of Crystal Structures", J. Appl. Cryst. (2008) 41, pp. 466-470.
Ashley, D. C. & Jakubikova, E., "Ironing out the photochemical and spin-crossover behavior of Fe(II) coordination compounds with computational chemistry", Coord. Chem. Rev. (2017) 337, pp. 97-111.
Francés-Monerris, A. et al., "Synthesis and computational study of a pyridylcarbene Fe(II) complex: Unexpected effects of fac/mer isomerism in metal-to-ligand triplet potential energy surfaces", Inorg. Chem. 57 (2018) pp. 10431-10441.
Ardo, S. et al., "Pathways to electrochemical solar-hydrogen technologies", Energy Environ. Sci., (2018), vol. 11, pp. 2768-2783.
Aubock, G. et al., "Sub-50-fs photoinduced spin crossover in [Fe(bpy)3]2+", Nat. Chem. (2015), Vo. 7, pp. 629-633.
Betley, T. A. et al., "Group VIII Coordination chemistry of a pincer-type bis(8-quinolinyl)amido ligand.", Inorg. Chem, (2008), vol. 47, pp. 11570-11582.
Braterman, P. S. et al., "Electronic absorption spectra of the iron(II) complexes of 2,2'-bipyridine, 2,2'-bipyrimidine, 1, 10-phenanthroline, and 2,2':6',2"-terpyridine and their reduction products", Inorg. Chem., (1992), vol. 31, pp. 555-559.

(Continued)

*Primary Examiner* — Timothy R Rozof
(74) *Attorney, Agent, or Firm* — Melissa M. Hayworth; E. Joseph Gess; Merchant & Gould, P.C.

(57) ABSTRACT

The present disclosure relates to new metal complexes, including derivatives thereof, methods of making the metal complexes, and uses thereof, including uses, for example, as photosensitizers and as photocatalysts. In an embodiment, a metal complex having the structure of Formula (I): a salt, hydrate, solvate, tautomer, optical isomer, or combination thereof.

38 Claims, 36 Drawing Sheets

Formula I

(56) References Cited

OTHER PUBLICATIONS

Brown, A. M. et al., "Spectroelectrochemical identification of charge-transfer excited states in transition metal-based polypyridyl complexes", Dalton Trans., (2014), vol. 43, pp. 17635-17646.
Chábera, P. et al., "A Low-spin Fe(III) complex with 100-ps ligand-to-metal charge transfer photoluminescence", Nature (2017) vol. 543, pp. 695-699.
Chábera, P. et al., "Fe(II) hexa N-heterocyclic carbene complex with a 528 ps metal-to-ligand charge-transfer excited-state lifetime", J. Phys. Chem., (2018), Lett. 9, pp. 459-463.
Connelly, N. G. et al, "Chemical Redox Agents for Organometallic Chemistry", Chem. Rev., (1996) vol. 96, pp. 877-910.
Dixon, I. M. et al., "Probing the photophysical capability of mono and cis(cyclometallated) Fe(II) polypyridine complexes using inexpensive ground state DFT", Dalton Trans., (2014), vol. 43, pp. 15898-15905.
Fatur, S. M. et al., "A synthetically tunable system to control MLCT excited-state lifetimes and spin sates in iron(II) polypyridines", J. Am. Chem. Soc., (2017), vol. 139, pp. 4493-4505.
Frazier, B. A. et al., "Unusual electronic features and reactivity of the dipyridylazaallyl ligand: Characterizations of (smif)2M [M=Fe, Co, Co+, Ni; smif= {(2-py)CH}2N] and [(TMS)2NFe]2(smif)2", J. Am. Chem. Soc., (2009), vol. 131, pp 3428-3429.
Gawelda, W. et al., "Ultrafast Nonadiabatic Dynamics of [FeII(bpy)3]2+ in Solution", J. Am. Chem. Soc. 129, 8199-8206 (2007).
Hagfeldt, A. et al., "Dye-sensitized solar cells, Chem. Rev.", (2010), vol. 110, pp. 6595-6663.
Hartwig, John F., "Transition Metal Catalyzed Synthesis of Arylamines and Aryl Ethers from Aryl Halides and Triflates Scope and Mechanism", Angew, Chem. Int. Ed 37, (1998), vol. 37, pp. 2047-2067.
Hewage, J. S. et al., "Homoleptic nickel(II) complexes of redox-tunable pincer-type ligands", Inorg. Chem., (2014, vol. 53, pp. 10070-10084.
Larsen, C. B. et al., "Photoredox catalysis with metal complexes made from earth-abundant elements", Chem.—Eur. J., (2018), vol. 24, pp. 2039-2058.
Lee, J. Y. et al., "Synthesis and Binding Properties of Anion Receptors Containing Multiple Hydrogen Bond Donors", Supramol. Chem., (2007), vol. 19, pp. 257-263.
Lever, A. B. P., "Electrochemical parametrization of metal complex redox potentials, using the ruthenium(III)/ruthenium (II) couple to generate a ligand electrochemical series", Inorg. Chem., (1990), vol. 29, pp. 1271-1285.
Lu, T. et al., "A Multifunctional Wavefunction Analyzer, J. Comput. Chem.", (2012) vol. 33, pp. 580-592.
Mandapati, P. et al., "Phenanthridine-Containing Pincer-like Amido Complexes of Nickel, Palladium, and Platinum, Inorg. Chem.", (2017), vol. 56, pp. 3674-3685.

Marenich, A. V. et al., "Universal Solvation Model Based on Solute Electron Density and on a Continuum Model of the Solvent Defined by the Bulk Dielectric Constant and Atomic Surface Tensions", J. Phys. Chem., (2009), B 113, pp. 6378-6396.
Martin, R. L., "Natural Transition Orbitals", J. Chem. Phys., (2003), vol. 118, pp. 4775-4777.
Materna, K. L. et al., "Anchoring Groups for Photocatalytic Water Oxidation on Metal Oxide Surface", Chem. So. Rev., (2017) vol. 46, pp. 6099-6110.
Mondal, R. et al., "Site-selective benzannulation of N-heterocycles in bidentate ligands leads to blue-shifted emission from [(P(N)Cu]2(μ-X)2 dimers", Inorg. Chem., (2018), vol. 57, pp. 4966-4978.
Mukherjee, S. et al., "HOMO inversion as a strategy for improving the light-absorption properties of Fe(II) chromophores", Chem. Sci., (2017), vol. 8, pp. 8115-8126.
O'Boyle, N. M. et al., "Software News and Updates cclib: a Library for Package-Independent Computational Chemistry Algorithms", J. Comput. Chem. (2008), vol. 29, pp. 839-845.
O'Regan, B. et al., "A low-cost, high-efficiency solar cell based on dye-sensitized colloidal titanium dioxide films", Nature, (1991), vol. 353, pp. 737-740.
Prier, C. K. et al., "Visible light photoredox catalysis with transition metal complexes: Applications in organic synthesis", Chem. Rev., (2013), vol. 113, pp. 5322-5363.
Reiff, W. M. et al., "Binuclear, oxygen-bridged complexes of iron(III). New iron(III)-2,2',2''-terpyridine complexes", J. Am. Chem. Soc., (1968), vol. 90, pp. 4794-4800.
Sheldrick, G. M., "A Short History of SHELX, Acta Cryst.", (2008) vol. A64, pp. 112-122.
Shepard, S. G. et al., "Highly Strained Iron(II) Polypyridines: Exploiting the Quintet Manifold to Extend the Lifetime of MLCT Excited States", J. Am. Chem. Soc., (2016), vol. 138, pp. 2949-2952.
Spek, A. L., "Structure Validation in Chemical Crystallography", Acta Cryst., (2009), vol. D65, pp. 148-155.
Stoll, S. et al., "EasySpin, a comprehensive software package for spectral simulation and analysis in EPR", J. Magn. Reson., (2006), vol. 178, pp. 42-55.
Wenger, O. S., "Photoactive Complexes with Earth-Abundant Metals", J. Am. Chem. Soc., (2018), vol. 140, pp. 13522-13533.
Zhao, Y. et al. "The M06 Suite of Density Functionals for Main Group Thermochemistry, Thermochemical Kinetics, Noncovalent Interactions, Excited States, and Transition Elements: Two New Functionals and Systematic Testing of Four M06-class Functionals and 12 Other Functionals", Theor. Chem. Acc. (2008) vol. 120, pp. 215-241.
International Search Report mailed Feb. 17, 2020 in PCT/CA2019/051766.
International Preliminary Report on Patentability and Written Opinion issued in PCT/CA2019/051766 dated Jun. 16, 2021.

* cited by examiner

METAL COMPLEXES, METHODS OF MAKING THE SAME, AND USES THEREOF

RELATED APPLICATIONS

The present application is a U.S. National Stage filing under 35 U.S.C. § 371 of International Application No. PCT/CA2019/051766 filed 9 Dec. 2019, which claims priority to U.S. Provisional Application No. 62/781,553 filed 18 Dec. 2018.

FIELD

The present disclosure relates to new metal complexes, including derivatives thereof, methods of making the metal complexes, and uses thereof, including uses, for example, as photosensitizers and as photocatalysts.

BACKGROUND

Despite solar energy's potential for mitigating the environmental impacts of powering our planet, the cost of light-harvesting materials still presents a barrier to widespread adoption. In this respect, sensitizing wide band-gap semiconductors by anchoring light-absorbing molecules to their surfaces (O'Regan, B. & Graetzel, M. A low-cost, high-efficiency solar cell based on dye-sensitized colloidal titanium dioxide films. *Nature* 353, 737-740 (1991)) offers appealing advantages in that practical devices ("dye-sensitized solar cells", DSSCs) can be constructed from inexpensive, abundant semiconductor materials with low fabrication costs (Hagfeldt, A., Boschloo, G., Sun, L., Kloo, L. & Pettersson, H. Dye-sensitized solar cells. *Chem. Rev.* 110, 6595-6663 (2010)). In DSSCs, light absorbing compounds, such as photosensitizers, can be needed to boost the efficiency with which sunlight is harvested and converted into electric current. Similarly, light-absorbing compounds have application in photochemical processes, where (visible) light can be used to drive chemical reactions via the catalytic intercession of a photocatalyst, often changing/improving selectivity in addition to sustainability.

In both applications, dyes constructed from coordination complexes of organic molecules (ligands) bound to metals are particularly useful, as these complexes have low-energy excited states wherein electron charge is transferred from metal orbitals to ligand-based ones upon exposure to light (i.e. charge-transfer (CT) states, in this case, metal to ligand charge transfer (MLCT)). If these CT states have a sufficiently long lifetime, charge can be injected into a semiconducting material from the dye (or transferred to a substrate), thereby converting incident photons (light) to charge carriers (i.e. moving electrons that generate electricity). One approach to extend charge transfer excited-state lifetimes has been to use intersystem crossing to 'flip' the spin of the photo-excited electron, giving rise to a triplet metal-to-ligand charge transfer, or $^3$MLCT excited state. To relax back to the singlet ground state ($^1$GS), the electron spin flips back to its original orientation, in order to pair with a second electron. This process is quantum mechanically 'forbidden', meaning it happens at a much slower rate, resulting in longer lifetimes for $^3$MLCT states (Hagfeldt, A., Boschloo, G., Sun, L., Kloo, L. & Pettersson, H. Dye-sensitized solar cells. *Chem. Rev.* 110, 6595-6663 (2010)).

It is preferred when designing materials for the global market that high-performing sensitizers are based on abundant and affordable elements. This is also true of increasing the sustainability of materials used for solar fuel-forming catalysis (Ardo, S. et al. Pathways to electrochemical solar-hydrogen technologies. *Energy Environ. Sci.*, 11, 2768-2783 (2018)) and photochemical synthesis (Prier, C. K., Rankic, D. A. & MacMillan, D. W. C. Visible light photoredox catalysis with transition metal complexes: Applications in organic synthesis. *Chem. Rev.* 113, 5322-5363 (2013); Larsen, C. B. & Wenger, O. S. Photoredox catalysis with metal complexes made from earth-abundant elements. *Chem.-Eur. J.* 24, 2039-2058 (2018)). To do so, coordination complexes can be constructed to, ideally, broadly absorb visible light and exhibit the type of sufficiently long-lived CT excited states for efficient charge injection or for building up sufficient concentrations of reactive excited states for synthesis.

As heavier elements (e.g., precious metals) tend to exhibit high rates of intersystem crossing thanks to large spin-orbit coupling constants, photosensitizer design has traditionally been dominated by scarce and expensive transition metals such as ruthenium (Ru) and iridium (Ir). These metals also exhibit strong ligand fields necessary to promote long-lived CT states over unproductive, fast-relaxing metal-centered (MC) ones. Cheaper, more easily available metals, such as other, lighter, transition metals, are known to have faster rates of intersystem crossing and can populate triplet $^3$MLCT excited states upon light absorption. But while faster rates of intersystem crossing are apparently accessible for lighter transition metals, excited state lifetimes are still comparatively short (Wenger, O. S. Photoactive Complexes with Earth-Abundant Metals. *J. Am. Chem. Soc.* 140, 13522-13533 (2018)).

Engineering compounds with longer excited state lifetimes would enable the production of useful photosensitizers based on cheaper and more easily available metals, and introduce sustainability into dye design as the natural abundance and ease of extraction of other metals presents economic and environmental advantages over the heavier, rarer metals.

Therefore, a need exists for the development of other photosensitizers as alternatives to existing photosensitizers and, in other aspects, photosensitizers that may obviate or mitigate at least one of the disadvantages described above or that provides a useful alternative.

The background herein is included solely to explain the context of the disclosure. This is not to be taken as an admission that any of the material referred to was published, known, or part of the common general knowledge as of the priority date.

SUMMARY

In an aspect, there is provided a metal complex having the structure of Formula I:

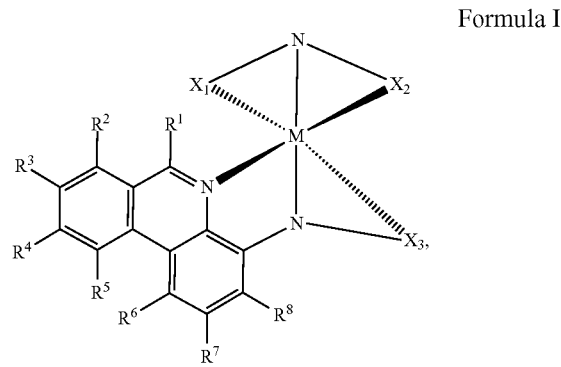

Formula I a salt, hydrate, solvate, tautomer, optical isomer, or combination thereof; wherein: $R^1$ to $R^8$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

In another aspect, there is provided a metal complex having the structure selected from:

Formula Ia

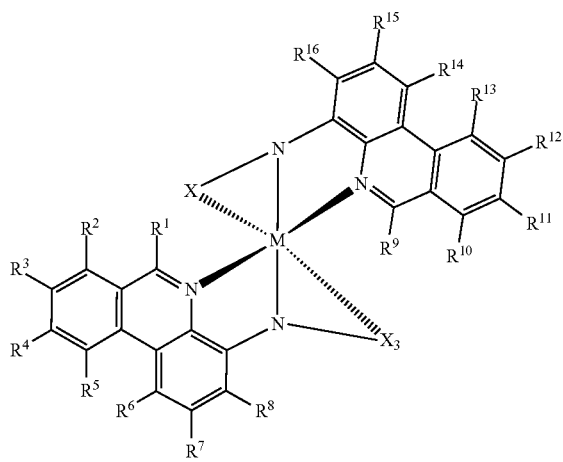

Formula Ib

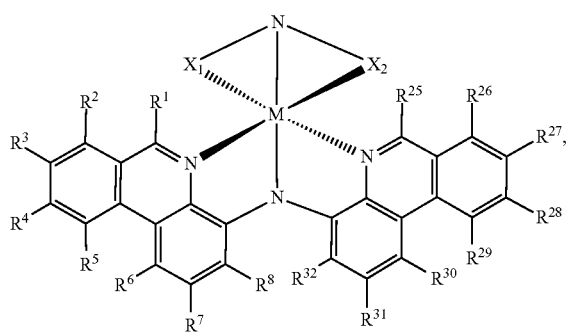

Formula Ic

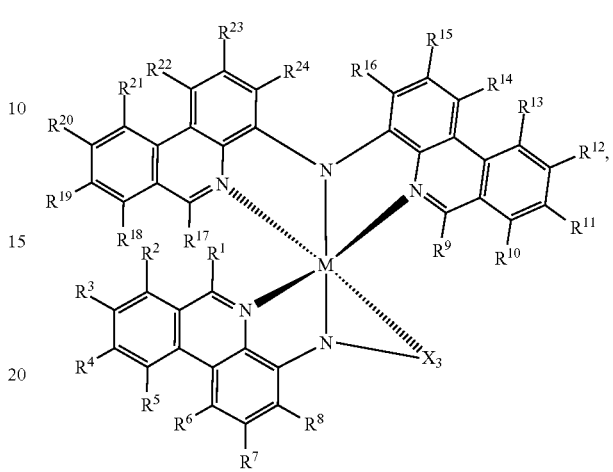

Formula Id

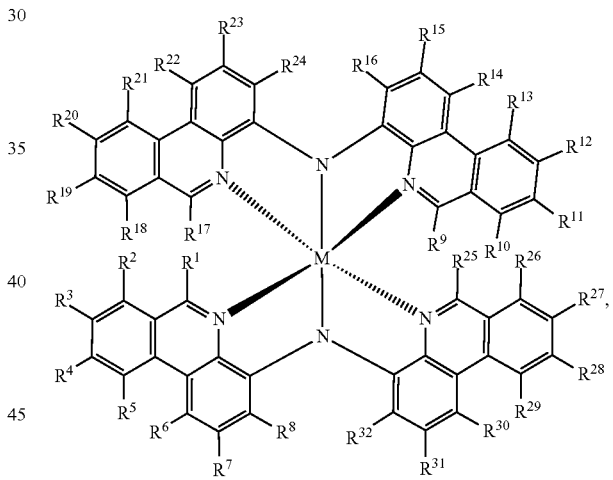

a salt, hydrate, solvate, tautomer, optical isomer, or combination thereof; wherein: $R^1$ to $R^{32}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

In another aspect, there is provided a metal complex having the structure selected from:

Formula Ie

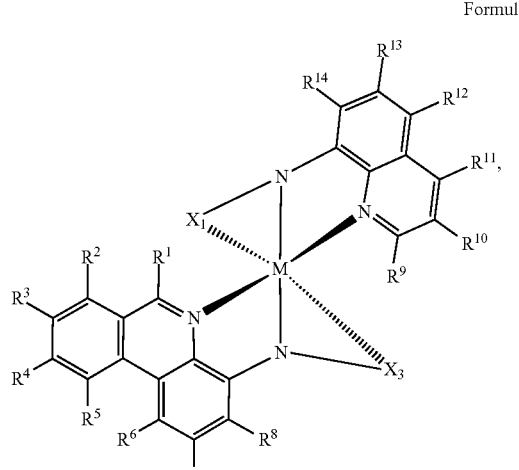

Formula Ih

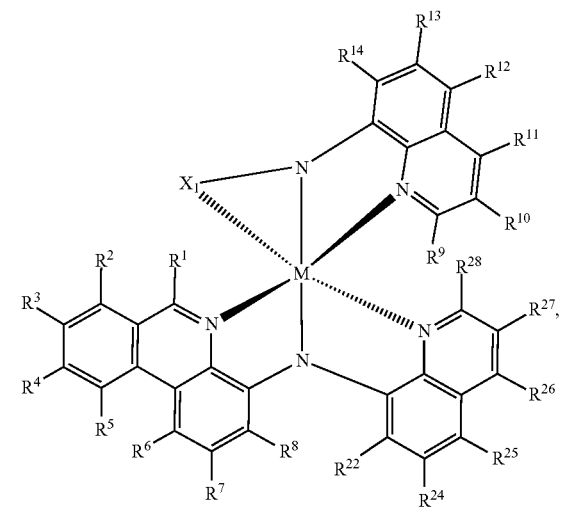

Formula If

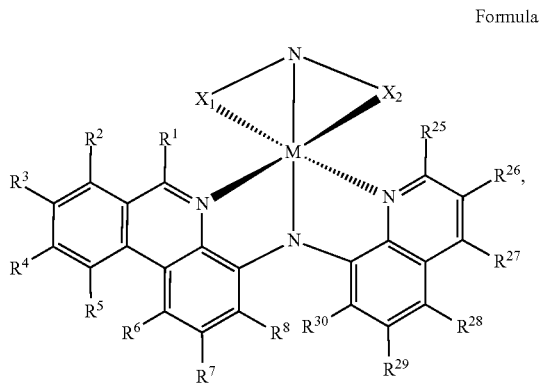

Formula Ig

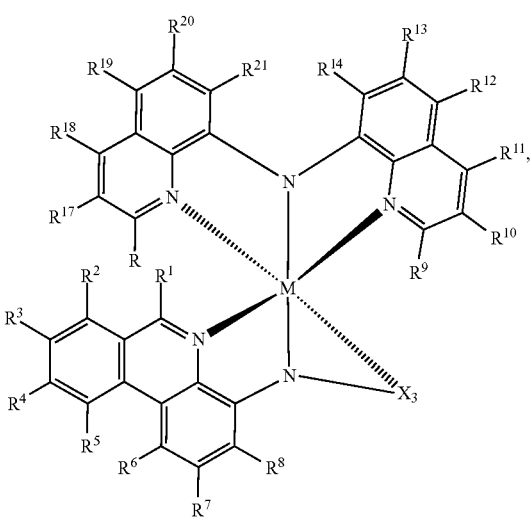

Formula Ii a salt, hydrate, solvate, tautomer, optical isomer, or combination thereof; wherein: $R^1$ to $R^{14}$, $R^{16}$ to $R^{22}$, $R^{24}$ to $R^{28}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

In another aspect, there is provided a metal complex having the structure selected from:

Formula Ij

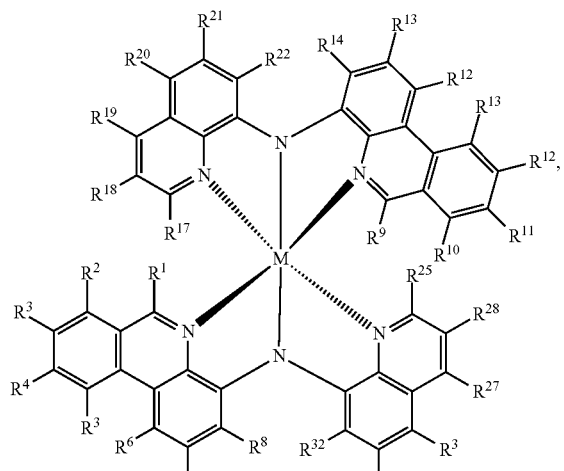

Formula In

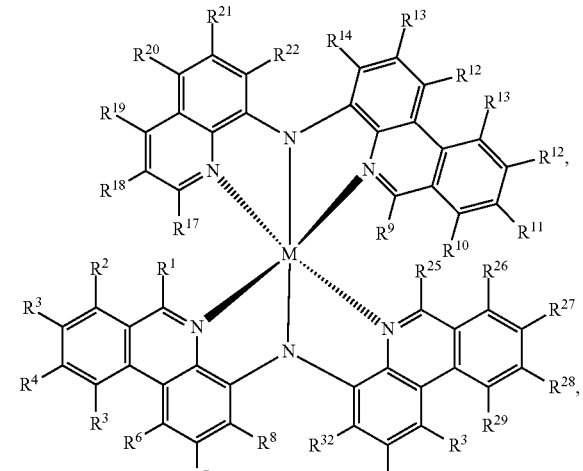

a salt, hydrate, solvate, tautomer, optical isomer, or combination thereof; wherein: $R^1$ to $R^{32}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxyl-hydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

In another aspect, there is provided a metal complex having the structure selected from:

Formula Ik

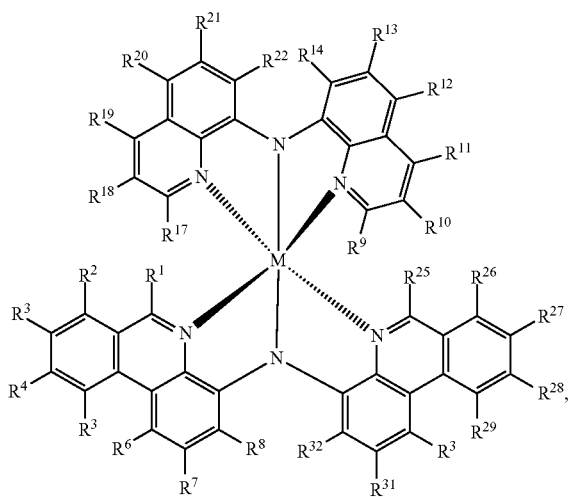

Formula Im

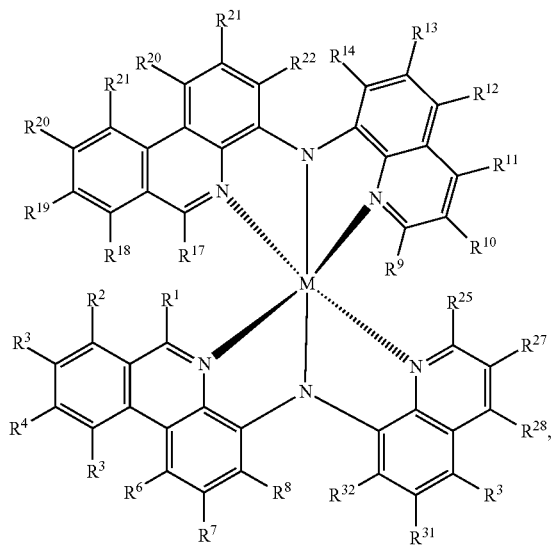

3a

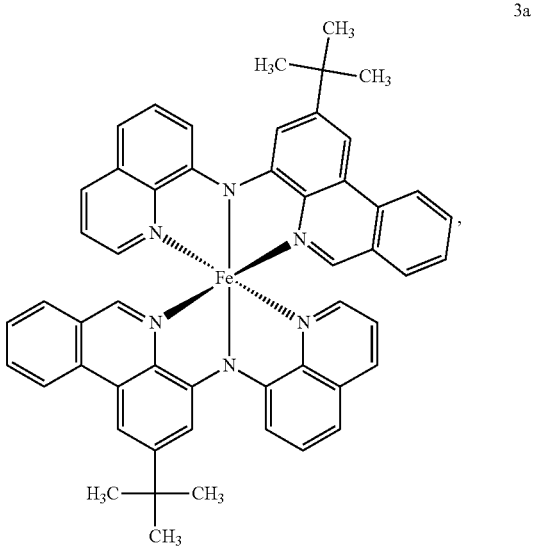

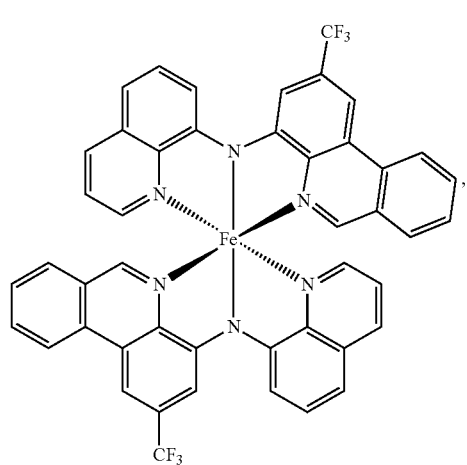
3b
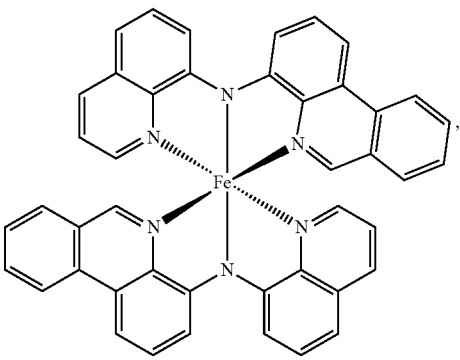
3e
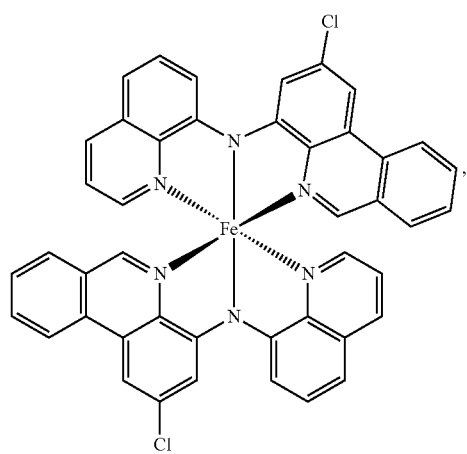
3c
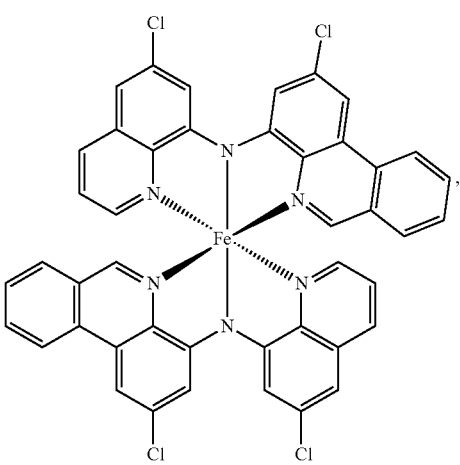
3f
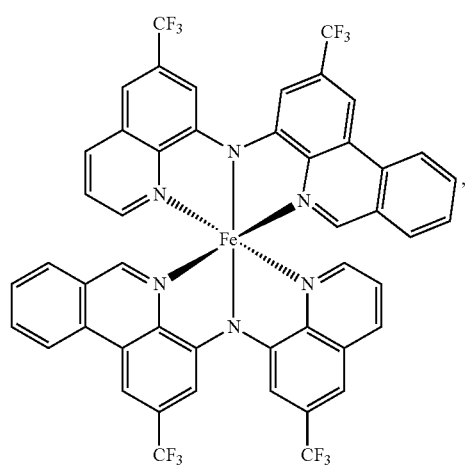
3d
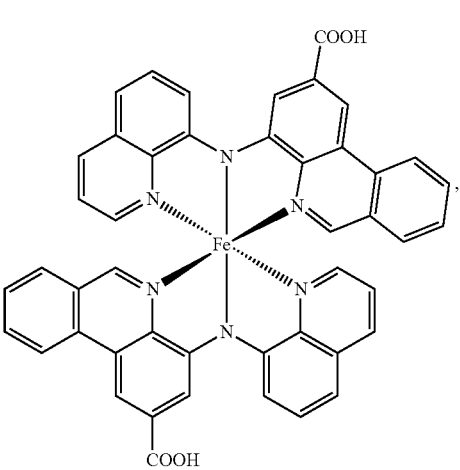
3g 3h
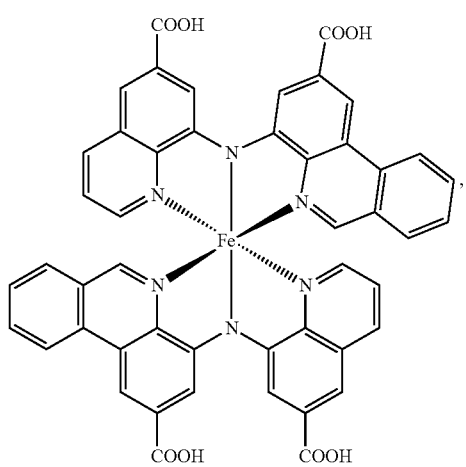
3i
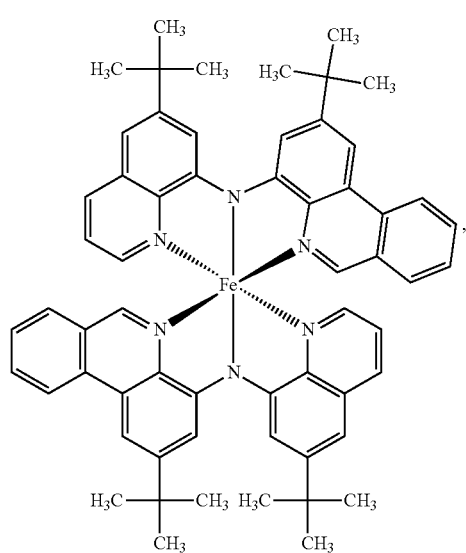
3j
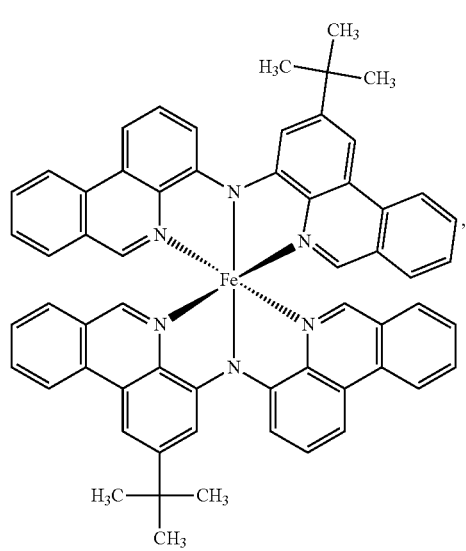
3k
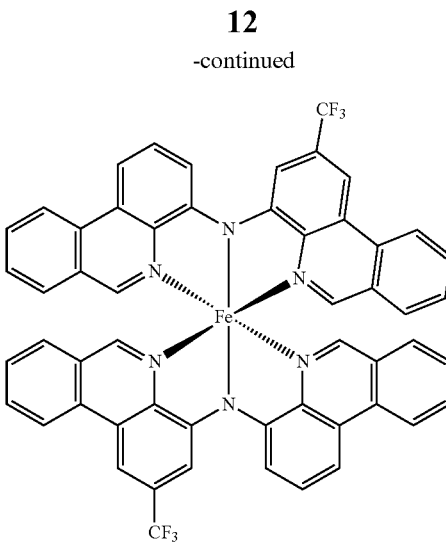
3l
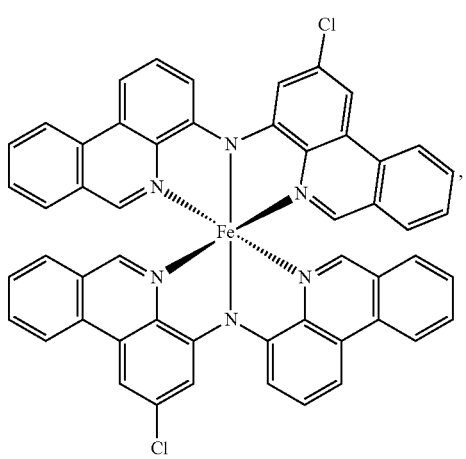
3m
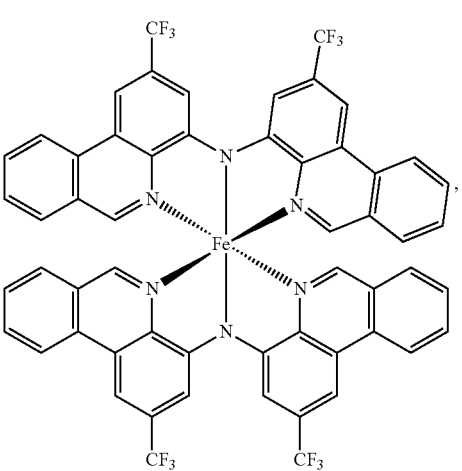

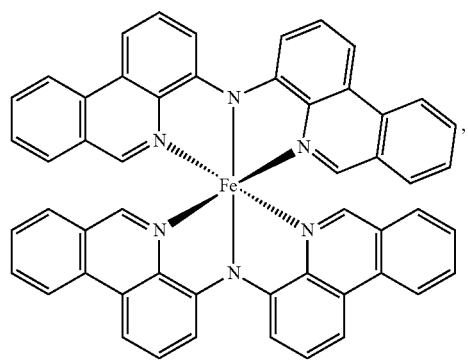

3n

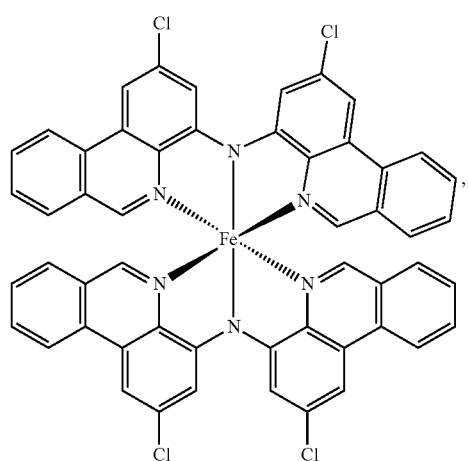

3o

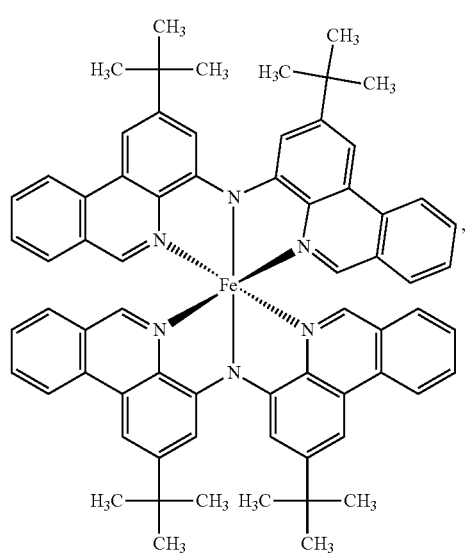

3p

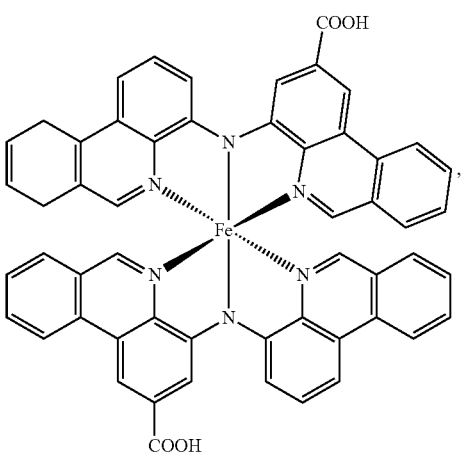

3q

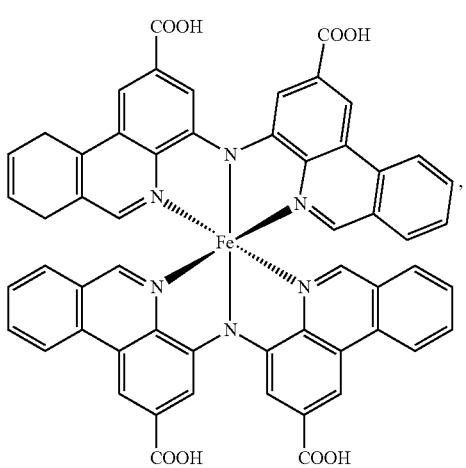

3r a salt, hydrate, solvate, tautomer, optical isomer, or combination thereof.

In other aspects, the metal complex is selected from 3c, 3d, 3f, 3k, 3l, 3m, 3o, a salt, hydrate, solvate, tautomer, optical isomer, or combination thereof.

In other aspects, wherein the complex is a salt. In other aspects, wherein the salt has at least one counterion selected from halide ions, $NO_3^-$, $ClO_4^-$, $OH^-$, $H_2PO_4^-$, $HSO_4^-$, $^-BF_4$, $^-PF_6$, sulfonate ions, carboxylate ions or combinations thereof.

In other aspects, wherein the complex excludes:

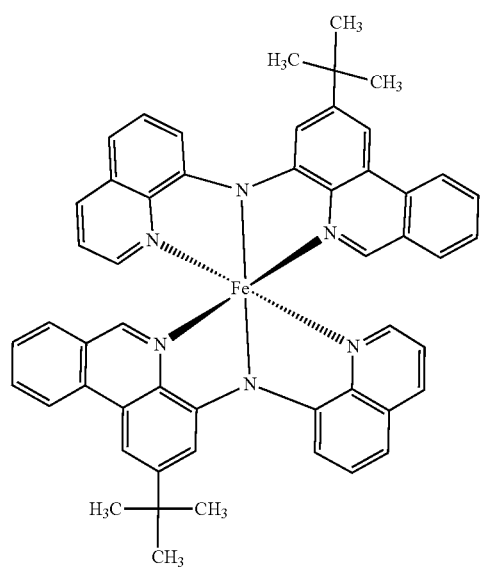

3a or

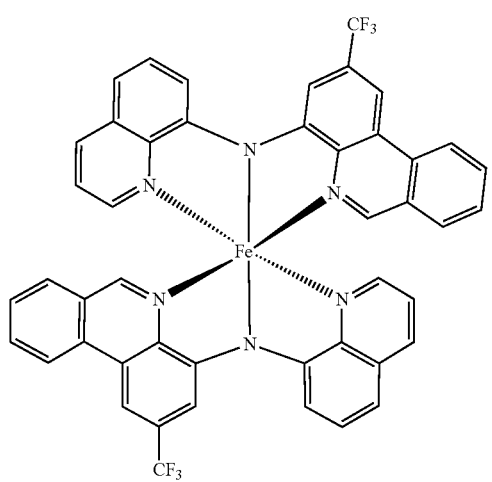

3b

In other aspects, wherein the complex is substantially stable towards oxidation. In other aspects, wherein the complex is substantially stable towards oxidation in ambient air. In other aspects, wherein at least one of the R groups is a group useful for tethering to a semiconductor. In other aspects, wherein the at least one of the R groups is carboxylic acid or phosphate group.

In other aspects, wherein the complex exhibits panchromatic absorption. In other aspects, wherein the panchromatic absorption is in the visible range of the electromagnetic spectrum. In other aspects, wherein the complex is capable of absorbing sunlight. In other aspects, wherein the complex is capable of absorbing visible light of all colors (less than about 920 nm). In other aspects, wherein the complex has a molar absorptivity cross-section that is about 10 mM$^{-1}$cm$^{-1}$ to about 30 mM$^{-1}$cm$^{-1}$, about 15 mM$^{-1}$ cm$^{-1}$ to about 30 mM$^{-1}$cm$^{-1}$, about 10 mM$^{-1}$cm$^{-1}$ to about 25 mM$^{-1}$cm$^{-1}$, or about 10 mM$^{-1}$cm$^{-1}$ to about 20 mM$^{-1}$cm$^{-1}$. In other aspects, wherein the complex has a long-lived charge-transfer excited state. In other aspects, wherein the complex has a charge-transfer excited state lifetime from about 1 ns to about 7 ns; about 1 ns to about 6 ns; about 1 ns to about 5 ns; about 2 ns to about 4.5 ns, about 2 ns to about 4.3 ns; about 2.2 ns to about 5 ns; about 2.5 ns to about 5 ns; or about 3 ns to about 5 ns.

In other aspects, there is provided a composition comprising at least one metal complex described herein. In other aspects, there is provided a photosensitizer comprising at least one metal complex described herein. In other aspects, there is provided a catalyst comprising at least one metal complex described herein. In other aspects, there is provided an electronic device comprising at least one metal complex described herein. In other aspects, there is provided use of at least one of the metal complexes described herein as a photosensitizer. In other aspects, there is provided use of at least one of the metal complexes described herein as a catalyst. In other aspects, there is provided use of at least one of the metal complexes described herein as a photocatalyst. In other aspects, there is provided use of at least one of the metal complexes described herein in an electronic device.

In other aspects, there is provided a method for making the metal complex, wherein the method comprises: a) a compound of Formula IA is reacted with X$_3$—NH$_2$ and undergoes metal catalyzed amination to form an intermediate of Formula IB:

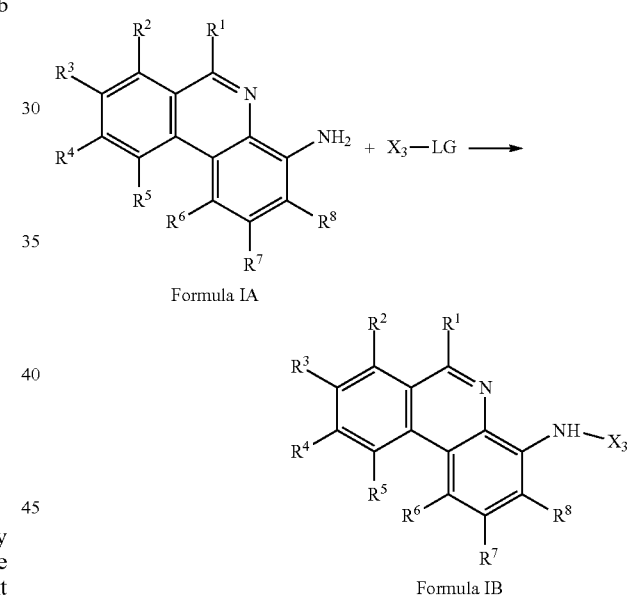

Formula IA

Formula IB wherein LG is a leaving group; and b) the intermediate of Formula IB is reacted with X$_1$—NH—X$_2$ and a metal (M) Lewis acid to form Formula IC.

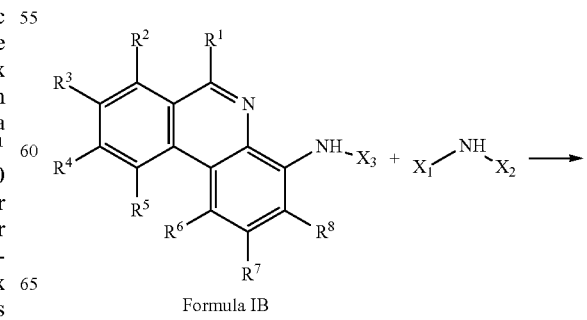

Formula IB

-continued

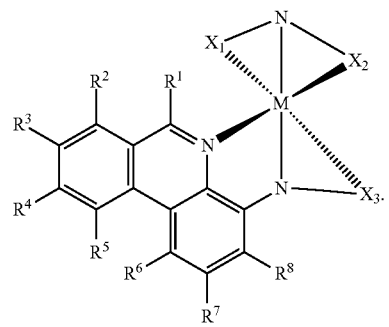

Formula IC

In other aspects, there is provided a method for making the metal complex, wherein the method comprises: a) a compound of Formula IAA reacts with $X_3$—$NH_2$ and undergoes metal catalyzed amination to form an intermediate of Formula IB:

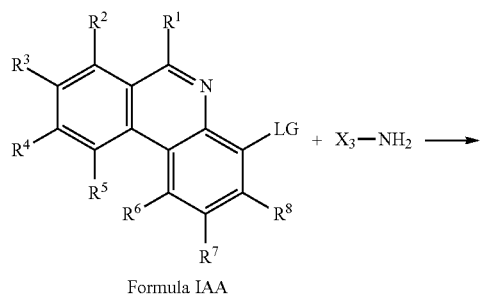

Formula IAA

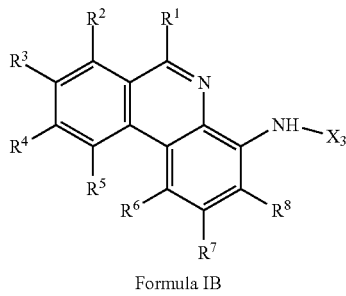

Formula IB wherein LG is a leaving group; and b) the intermediate of Formula IB is reacted with $X_1$—NH—$X_2$ and a metal (M) Lewis acid to form Formula IC.

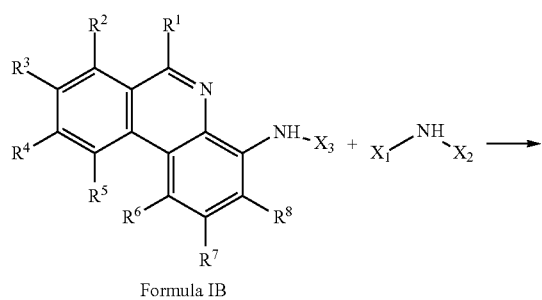

Formula IB

-continued

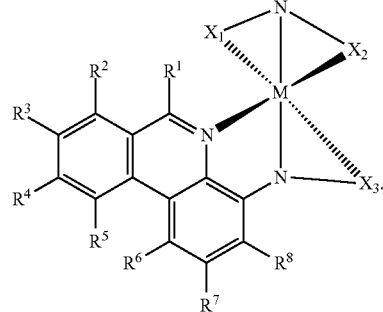

Formula IC

The novel features of the present invention will become apparent to those of skill in the art upon examination of the following detailed description of the invention. It should be understood, however, that the detailed description of the invention and the specific examples presented, while indicating certain aspects of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

Embodiments will be further understood from the following description with reference to the Figures, in which:

FIG. 25 shows examples of (a) steady-state absorption spectrum of $[3b]^{0/+}$ (top) and transient absorption (TA) spectra (bottom) of 3b in $CH_3CN$ at indicated time delays. (b) Global fit analysis principle components constructed from TA data. Spectra were generated using an excitation wavelength of 780 nm, as noted in the figure. The two shown components model the main spectral changes: a red shift of the initial ESA and formation of the transient bleaching. (c) Kinetic traces at indicated wavelengths (see legend) and exponential fits (solid lines, fitting results are summarized in Table 6a.

DETAILED DESCRIPTION OF CERTAIN ASPECTS

Definitions

Figure 1:
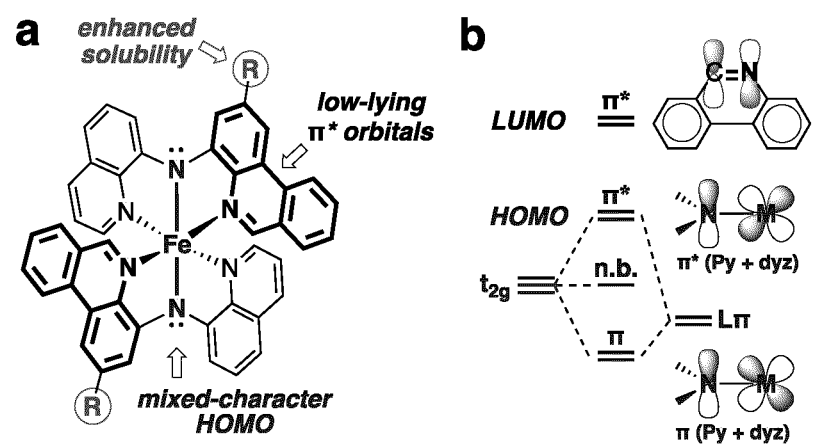
FIG. 1 shows an example of a metal complex: (a) Fe((4-phenanthridinyl)(8-quinolinyl)amido))$_2$ complexes; and (b) schematic showing the design principle in this invention: unoccupied phenanthridine-based π* orbitals and interactions between the $t_{2g}$ orbital set on Fe (using symmetry labels of a fully symmetric octahedral complex) with amido ligand-centered N(2p) orbitals, where significant mixing destabilizes the HOMO, decreasing electron density at Fe.

Unless otherwise explained, all technical and scientific terms used herein have the same meaning as commonly understood by one of ordinary skill in the art to which this disclosure belongs. Although any methods and materials similar or equivalent to those described herein can be used in the practice for testing of the present invention, the typical materials and methods are described herein. In describing and claiming the present invention, the following terminology will be used.

When introducing elements disclosed herein, the articles "a", "an", "the", and "said" are intended to mean that there may be one or more of the elements.

Any range described herein is understood to include any incremental ranges or individual values therebetween.

In understanding the scope of the present application, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. It will be understood that any embodiments described as "comprising" certain components may also "consist of" or "consist essentially of," wherein "consisting of" has a closed-ended or restrictive meaning and "consisting essentially of" means including the components specified but excluding other components except for materials present as impurities, unavoidable materials present as a result of processes used to provide the components, and components added for a purpose other than achieving the technical effects described herein. For example, a composition defined using the phrase "consisting essentially of" encompasses any known pharmaceutically acceptable additive, excipient, diluent, carrier, and the like. Typically, a composition consisting essentially of a set of components will comprise less than 5% by weight, typically less than 3% by weight, more typically less than 1% by weight of non-specified components.

It will be understood that any component defined herein as being included may be explicitly excluded from the claimed invention by way of proviso or negative limitation, such as any specific compounds or method steps, whether implicitly or explicitly defined herein.

In addition, all ranges given herein include the end of the ranges and also any intermediate range points, whether explicitly stated or not.

Finally, terms of degree such as "substantially", "about" and "approximately" as used herein mean a reasonable amount of deviation of the modified term such that the end result is not significantly changed. These terms of degree should be construed as including a deviation of at least ±5% of the modified term if this deviation would not negate the meaning of the word it modifies.

The abbreviation, "e.g." is derived from the Latin exempli gratia, and is used herein to indicate a non-limiting example. Thus, the abbreviation "e.g." is synonymous with the term "for example." The word "or" is intended to include "and" unless the context clearly indicates otherwise.

The phrase "at least one of" is understood to be one or more. The phrase "at least one of . . . and . . . " is understood to mean at least one of the elements listed or a combination thereof, if not explicitly listed. For example, "at least one of A, B, and C" is understood to mean A alone or B alone or C alone or a combination of A and B or a combination of A and C or a combination of B and C or a combination of A, B, and C. "At least one of at least one of A, at least one of B, and at least one of C" is understood to mean at least one of A alone or at least one of B alone or at least one of C alone or a combination of at least one of A and at least one of B or a combination of at least one of A and at least one of C or a combination of at least one of B and at least one of C or a combination of at least one of A, at least one of B, and at least one of C.

With respect to compound terminology, generally, reference to a certain element such as hydrogen or H is meant to, if appropriate, include all isotopes of that element.

Where the term "alkyl group" is used, either alone or within other terms such as "haloalkyl group" and "alkylamino group", it encompasses linear or branched carbon radicals having, for example, one to about twenty carbon atoms or, in specific embodiments, one to about twelve carbon atoms. In other embodiments, alkyl groups are "lower alkyl" groups having one to about six carbon atoms. Examples of such groups include, but are not limited thereto, methyl, ethyl, n-propyl, isopropyl, n-butyl, isobutyl, sec-butyl, tert-butyl, pentyl, iso-amyl, hexyl and the like. In more specific embodiments, lower alkyl groups have one to four carbon atoms.

The term "alkenyl group" encompasses linear or branched carbon radicals having at least one carbon-carbon double bond. The term "alkenyl group" can encompass conjugated and non-conjugated carbon-carbon double bonds or combinations thereof. An alkenyl group, for example and without being limited thereto, can encompass two to about twenty carbon atoms or, in a particular embodiment, two to about twelve carbon atoms. In embodiments, alkenyl groups are "lower alkenyl" groups having two to about four carbon atoms. Examples of alkenyl groups include, but are not limited thereto, ethenyl, propenyl, allyl, propenyl, butenyl and 4-methylbutenyl. The terms "alkenyl group" and "lower alkenyl group", encompass groups having "cis" and "trans" orientations, or alternatively, "E" and "Z" orientations.

The term "alkynyl group" denotes linear or branched carbon radicals having at least one carbon-carbon triple bond. The term "alkynyl group" can encompass conjugated and non-conjugated carbon-carbon triple bonds or combinations thereof. Alkynyl group, for example and without being limited thereto, can encompass two to about twenty carbon atoms or, in a particular embodiment, two to about twelve carbon atoms. In embodiments, alkynyl groups are "lower alkynyl" groups having two to about ten carbon atoms. Some examples are lower alkynyl groups having two to about four carbon atoms. Examples of such groups include propargyl, butynyl, and the like.

The term "halo" means halogens such as fluorine, chlorine, bromine or iodine atoms.

The term "haloalkyl group" encompasses groups wherein any one or more of the alkyl carbon atoms is substituted with halo as defined above. Specifically encompassed are monohaloalkyl, dihaloalkyl and polyhaloalkyl groups including perhaloalkyl. A monohaloalkyl group, for one example, may have either an iodo, bromo, chloro or fluoro atom within the group. Dihalo and polyhaloalkyl groups may have two or more of the same halo atoms or a combination of different halo groups. "Lower haloalkyl group" encompasses groups having 1-6 carbon atoms. In some embodiments, lower haloalkyl groups have one to three carbon atoms. Examples of haloalkyl groups include fluoromethyl, difluoromethyl, trifluoromethyl, chloromethyl, dichloromethyl, trichloromethyl, pentafluoroethyl, heptafluoropropyl, difluorochloromethyl, dichlorofluoromethyl, difluoroethyl, difluoropropyl, dichloroethyl and dichloropropyl.

The term "hydroxyalkyl group" encompasses linear or branched alkyl groups having, for example and without being limited thereto, one to about ten carbon atoms, any one of which may be substituted with one or more hydroxyl groups. In embodiments, hydroxyalkyl groups are "lower hydroxyalkyl" groups having one to six carbon atoms and one or more hydroxyl groups. Examples of such groups include hydroxymethyl, hydroxyethyl, hydroxypropyl, hydroxybutyl and hydroxyhexyl.

The term "alkoxy group" encompasses linear or branched oxy-containing groups each having alkyl portions of, for example and without being limited thereto, one to about ten carbon atoms. In embodiments, alkoxy groups are "lower alkoxy" groups having one to six carbon atoms. Examples of such groups include methoxy, ethoxy, propoxy, butoxy and tert-butoxy. In certain embodiments, lower alkoxy groups have one to three carbon atoms. The "alkoxy" groups may be further substituted with one or more halo atoms, such as fluoro, chloro or bromo, to provide "haloalkoxy" groups. In other embodiments, lower haloalkoxy groups have one to three carbon atoms. Examples of such groups include fluoromethoxy, chloromethoxy, trifluoromethoxy, trifluoroethoxy, fluoroethoxy, and fluoropropoxy.

The term "aromatic group" or "aryl group" means an aromatic group having one or more rings wherein such rings may be attached together in a pendent manner or may be fused. In particular embodiments, an aromatic group is one, two or three rings. Monocyclic aromatic groups may contain 4 to 10 carbon atoms, typically 4 to 7 carbon atoms, and more typically 4 to 6 carbon atoms in the ring. Typical polycyclic aromatic groups have two or three rings. Polycyclic aromatic groups having two to three rings typically have 8 to 16 carbon atoms, preferably 8 to 14 carbon atoms in the rings. Examples of aromatic groups include, but are not limited to, phenyl, naphthyl, tetrahydronaphthyl, indanyl, biphenyl, phenanthryl, anthryl or acenaphthyl.

The term "heteroatom" means an atom other than carbon. Typically, heteroatoms are selected from the group consisting of sulfur, phosphorous, nitrogen and oxygen atoms. Groups containing more than one heteroatom may contain different heteroatoms.

The term "heteroaromatic group" or "heteroaryl group" means an aromatic group having one or more rings wherein such rings may be attached together in a pendent manner or may be fused, wherein the aromatic group has at least one heteroatom. Monocyclic heteroaromatic groups may contain 4 to 10 member atoms, typically 4 to 7 member atoms, and more typically 4 to 6 member atoms in the ring. Typical polycyclic heteroaromatic groups have two or three rings. Polycyclic aromatic groups having two to three rings typically have 8 to 16 member atoms, more typically 8 to 14 member atoms in the rings. Examples of heteroaromatic groups include, but are not limited thereto, pyrrole, imidazole, thiazole, oxazole, furan, thiophene, triazole, pyrazole, isoxazole, isothiazole, pyridine, pyrazine, pyridazine, pyrimidine, triazine, indole, benzofuran, benzothiophene, benzimidazole, benzthiazole, quinoline, isoquinoline, quinazoline, quinoxaline and the like.

The term "carbocyclic group" means a saturated or unsaturated carbocyclic hydrocarbon ring. Carbocyclic groups are not aromatic. Carbocyclic groups are monocyclic or polycyclic. Polycyclic carbocyclic groups can be fused, spiro, or bridged ring systems. Monocyclic carbocyclic groups may contain 4 to 10 carbon atoms, typically 4 to 7 carbon atoms, and more typically 5 to 6 carbon atoms in the ring. Bicyclic carbocyclic groups may contain 8 to 12 carbon atoms, typically 9 to 10 carbon atoms in the rings.

The term "heterocyclic group" means a saturated or unsaturated ring structure containing carbon atoms and 1 or more heteroatoms in the ring. Heterocyclic groups are not aromatic. Heterocyclic groups are monocyclic or polycyclic. Polycyclic heterocyclic groups can be fused, spiro, or bridged ring systems. Monocyclic heterocyclic groups may contain 4 to 10 member atoms (i.e., including both carbon atoms and at least 1 heteroatom), typically 4 to 7, and more typically 5 to 6 in the ring. Bicyclic heterocyclic groups may contain 8 to 18 member atoms, typically 9 or 10 member atoms in the rings. Representative heterocyclic groups include, by way of example, pyrrolidine, imidazolidine, pyrazolidine, piperidine, 1,4-dioxane, morpholine, thiomorpholine, piperazine, 3-pyrroline and the like.

The term "heterogeneous group" means a saturated or unsaturated chain comprising carbon atoms and at least one heteroatom. Heterogeneous groups typically have 1 to 25 member atoms. More typically, the chain contains 1 to 12 member atoms, 1 to 10, and most typically 1 to 6. The chain may be linear or branched. Typical branched heterogeneous groups have one or two branches, more typically one branch. Typically, heterogeneous groups are saturated. Unsaturated heterogeneous groups may have one or more double bonds, one or more triple bonds, or both. Typical unsaturated heterogeneous groups have one or two double bonds or one triple bond. More typically, the unsaturated heterogeneous group has one double bond.

The term "hydrocarbon group" or "hydrocarbyl group" means a chain of carbon atoms. In certain aspects, the term includes 1 to 25 carbon atoms, typically 1 to 12 carbon atoms, more typically 1 to 10 carbon atoms, and most typically 1 to 8 carbon atoms. Hydrocarbon groups may have a linear or branched chain structure. Typical hydrocarbon groups have one or two branches, typically one branch. The hydrocarbon groups encompass saturated, unsaturated, conjugated, unconjugated, and combinations thereof. Unsaturated hydrocarbon groups may have one or more double bonds, one or more triple bonds, or combinations thereof.

When the term "unsaturated" is used in conjunction with any group, the group may be fully unsaturated or partially unsaturated. However, when the term "unsaturated" is used in conjunction with a specific group defined herein, the term maintains the limitations of that specific group. For example, an unsaturated "carbocyclic group", based on the limitations of the "carbocyclic group" as defined herein, does not encompass an aromatic group.

The terms "carboxy group" or "carboxyl group", whether used alone or with other terms, such as "carboxylalkyl group", denotes —(C=O)—O—.

The term "carbonyl group", whether used alone or with other terms, such as "aminocarbonyl group", denotes —(C=O)—.

The terms "alkylcarbonyl group" denotes carbonyl groups which have been substituted with an alkyl group. In certain embodiments, "lower alkylcarbonyl group" has lower alkyl group as described above attached to a carbonyl group.

The term "aminoalkyl group" encompasses linear or branched alkyl groups having one to about ten carbon atoms any one of which may be substituted with one or more amino groups. In some embodiments, the aminoalkyl groups are "lower aminoalkyl" groups having one to six carbon atoms and one or more amino groups. Examples of such groups include aminomethyl, aminoethyl, aminopropyl, aminobutyl and aminohexyl.

The term "alkylaminoalkyl group" encompasses aminoalkyl groups having the nitrogen atom independently substituted with an alkyl group. In certain embodiments, the alkylaminoalkyl groups are "loweralkylaminoalkyl" groups having alkyl groups of one to six carbon atoms. In other embodiments, the lower alkylaminoalkyl groups have alkyl groups of one to three carbon atoms. Suitable alkylaminoalkyl groups may be mono or dialkyl substituted, such as N-methylaminomethyl, N, N-dimethyl-aminoethyl, N, N-diethylaminomethyl and the like.

The term "aralkyl group" encompasses aryl-substituted alkyl groups. In embodiments, the aralkyl groups are "lower aralkyl" groups having aryl groups attached to alkyl groups having one to six carbon atoms. In other embodiments, the lower aralkyl groups phenyl is attached to alkyl portions having one to three carbon atoms. Examples of such groups include benzyl, diphenylmethyl and phenylethyl. The aryl in said aralkyl may be additionally substituted with halo, alkyl, alkoxy, haloalkyl and haloalkoxy.

The term "arylalkenyl group" encompasses aryl-substituted alkenyl groups. In embodiments, the arylalkenyl groups are "lower arylalkenyl" groups having aryl groups attached to alkenyl groups having two to six carbon atoms. Examples of such groups include phenylethenyl. The aryl in said arylalkenyl may be additionally substituted with halo, alkyl, alkoxy, haloalkyl and haloalkoxy.

The term "arylalkynyl group" encompasses aryl-substituted alkynyl groups. In embodiments, arylalkynyl groups are "lower arylalkynyl" groups having aryl groups attached to alkynyl groups having two to six carbon atoms. Examples of such groups include phenylethynyl. The aryl in said arylalkyl may be additionally substituted with halo, alkyl, alkoxy, haloalkyl and haloalkoxy. The terms benzyl and phenylmethyl are interchangeable.

The term "alkylthio group" encompasses groups containing a linear or branched alkyl group, of one to ten carbon atoms, attached to a divalent sulfur atom. In certain embodiments, the lower alkylthio groups have one to three carbon atoms. An example of "alkylthio" is methylthio, ($CH_3S$—).

The term "alkylamino group" denotes amino groups which have been substituted with one alkyl group and with two alkyl groups, including terms "N-alkylamino" and "N,N-dialkylamino". In embodiments, alkylamino groups are "lower alkylamino" groups having one or two alkyl groups of one to six carbon atoms, attached to a nitrogen atom. In other embodiments, lower alkylamino groups have one to three carbon atoms. Suitable "alkylamino" groups may be mono or dialkylamino such as N-methylamino, N-ethylamino, N,N-dimethylamino, N,N-diethylamino and the like.

The term "arylamino group" denotes amino groups which have been substituted with one or two aryl groups, such as N-phenylamino. The "arylamino" groups may be further substituted on the aryl ring portion of the group.

The term "heteroarylamino" denotes amino groups which have been substituted with one or two heteroaryl groups, such as N-thienylamino. The "heteroarylamino" groups may be further substituted on the heteroaryl ring portion of the group.

The term "aralkylamino group" denotes amino groups which have been substituted with one or two aralkyl groups. In other embodiments, there are phenyl-$C_1$-$C_3$-alkylamino groups, such as N-benzylamino. The "aralkylamino" groups may be further substituted on the aryl ring portion of the group.

The term "alkylaminoalkylamino group" denotes alkylamino groups which have been substituted with one or two alkylamino groups. In embodiments, there are $C_1$-$C_3$-alkylamino-$C_1$-$C_3$-alkylamino groups.

The term "arylthio group" encompasses aryl groups of six to ten carbon atoms, attached to a divalent sulfur atom. An example of "arylthio" is phenylthio. The term "aralkylthio group" encompasses aralkyl groups as described above, attached to a divalent sulfur atom. In certain embodiments there are phenyl-$C_1$-$C_3$-alkylthio groups. An example of "aralkylthio" is benzylthio.

The term "aryloxy group" encompasses optionally substituted aryl groups, as defined above, attached to an oxygen atom. Examples of such groups include phenoxy.

The term "aralkoxy group" encompasses oxy-containing aralkyl groups attached through an oxygen atom to other groups. In certain embodiments, aralkoxy groups are "lower aralkoxy" groups having optionally substituted phenyl groups attached to lower alkoxy group as described above.

The term "cycloalkyl group" includes saturated carbocyclic groups. In certain embodiments, cycloalkyl groups include $C_3$-$C_6$ rings. In embodiments, there are compounds that include, cyclopentyl, cyclopropyl, and cyclohexyl.

The term "cycloalkenyl group" includes carbocyclic groups that have one or more carbon-carbon double bonds; conjugated or non-conjugated, or a combination thereof. "Cycloalkenyl" and "cycloalkyldienyl" compounds are included in the term "cycloalkenyl". In certain embodiments, cycloalkenyl groups include $C_3$-$C_6$ rings. Examples include cyclopentenyl, cyclopentadienyl, cyclohexenyl and cycloheptadienyl. The "cycloalkenyl" group may have 1 to 3 substituents such as lower alkyl, hydroxyl, halo, haloalkyl, nitro, cyano, alkoxy, lower alkylamino, and the like.

The term "suitable substituent", "substituent" or "substituted" used in conjunction with the groups described herein refers to a chemically acceptable group, i.e., a moiety that maintains the utility of the inventive compounds. It is understood that substituents and substitution patterns on the compounds of the invention may be selected by one of ordinary skill in the art to provide compounds that are chemically stable and that can be readily synthesized by techniques known in the art, as well as those methods set forth below. If a substituent is itself substituted with more than one group, it is understood that these multiple groups may be on the same carbon/member atom or on different carbons/member atoms, as long as a stable structure results. Illustrative examples of some suitable substituents include, cycloalkyl, heterocyclyl, hydroxyalkyl, benzyl, carbonyl, halo, haloalkyl, perfluoroalkyl, perfluoroalkoxy, alkyl, alkenyl, alkynyl, hydroxy, oxo, mercapto, alkylthio, alkoxy, aryl or heteroaryl, aryloxy or heteroaryloxy, aralkyl or heteroaralkyl, aralkoxy or heteroaralkoxy, HO—(C=O)—, amido, amino, alkyl- and dialkylamino, cyano, nitro, carbamoyl, alkylcarbonyl, alkoxycarbonyl, alkylaminocarbonyl, dialkylaminocarbonyl, arylcarbonyl, aryloxycarbonyl, alkylsulfonyl, and arylsulfonyl. Typical substituents include aromatic groups, substituted aromatic groups, hydrocarbon groups including alkyl groups such as methyl groups, substituted hydrocarbon groups such as benzyl, and heterogeneous groups including alkoxy groups such as methoxy groups.

The term "fused" means in which two or more carbons/member atoms are common to two adjoining rings, e.g., the rings are "fused rings".

The term "isotopic forms" refer to variants of a particular chemical element. All isotopes of a given element share the same number of protons, and each isotope differs from the others in its number of neutrons.

The term "transition metal" refers to the element as it appears in Groups 3 through 12 of the Periodic Table of the Elements, or an isotopic form thereof. The transition metals include, for example, iron (Fe), cobalt (Co), chromium (Cr), nickel (Ni), ruthenium (Ru), rhodium (Rh), manganese (Mn), technetium (Tc), palladium (Pd) and etc.

The term "solvate" refers to solvate forms of the metal complexes described herein that are associated with a solvent, usually by a solvolysis reaction. This physical association may include hydrogen bonding. Conventional solvents include water, methanol, ethanol, acetic acid, DMSO, THF, diethyl ether, and the like. The complexes described herein may be prepared, e.g., in crystalline form, and may be solvated. Suitable solvates include both stoichiometric solvates and non-stoichiometric solvates. In certain instances, the solvate will be capable of isolation, for example, when one or more solvent molecules are incorporated in the crystal lattice of a crystalline solid. "Solvate" encompasses both solution-phase and isolatable solvates. Representative solvates include hydrates, ethanolates, and methanolates.

The term "salt(s)" includes salts of the complex(es) which are prepared from suitable acids or bases, depending on the particular substituents found on the complex(es) described herein. When the complex(es) contain relatively acidic functionalities, base addition salts can be obtained by contacting the neutral form of such complex(es) with a sufficient amount of the desired base. Examples of base addition salts include sodium, potassium, calcium, ammonium, organic amino, or magnesium salt, or a similar salt. When complex(es) described herein contain relatively basic functionalities, acid addition salts can be obtained by contacting the neutral form of such complex(es) with a sufficient amount of the desired acid. Examples of acid addition salts include those derived from inorganic acids like hydrochloric, hydrobromic, nitric, carbonic, monohydrogencarbonic, phosphoric, monohydrogenphosphoric, dihydrogenphosphoric, sulfuric, monohydrogensulfuric, hydriodic, or phosphorous acids, and the like, as well as the salts derived from relatively organic acids like acetic, propionic, isobutyric, butyric, maleic, malic, malonic, benzoic, succinic, suberic, fumaric, lactic, mandelic, phthalic, benzenesulfonic, p-tolylsulfonic, citric, tartaric, methanesulfonic, and the like. Certain specific complex(es) described herein contain both basic and acidic functionalities that allow the complex(es) to be converted into either base or acid addition salts.

With respect to the formation of suitable salts, any suitable counterions may form. A "counterion" or "anionic counterion" is a negatively charged group associated, for example, with a cationic quaternary amino group in order to maintain electrostatic neutrality. Exemplary counterions include halide ions (e.g., F⁻, Cl⁻, Br⁻, I⁻) $NO_3^-$, $ClO_4^-$, OH⁻, $H_2PO_4^-$, $HSO_4^-$, $^-BF_4$, $^-PF_6$, sulfonate ions, and carboxylate ions.

The salts of the complex(es) described herein can be synthesized from the complex(es) described herein which contain a basic or acidic moiety by conventional chemical methods. Generally, the salts of the basic complex(es) are prepared by reacting the free base with stoichiometric amounts or with an excess of the desired salt-forming inorganic or organic acid in a suitable solvent or various combinations of solvents. Similarly, the salts of the acidic complex(es) are formed by reactions with the appropriate inorganic or organic base.

The term "derivative" generally refers to a molecule that has been modified and/or changed in any way relative to a reference molecule or starting molecule.

The term "leaving group" is well understood in the art and is a molecular fragment that departs with a pair of electrons in a heterolytic bond cleavage. Leaving groups can be anions or neutral molecules, and is able to stabilize the additional electron density that results from bond heterolysis.

The recitation of a listing of chemical groups in any definition of a variable herein includes definitions of that variable as any single group or combination of listed groups. The recitation of an embodiment for a variable herein includes that embodiment as any single embodiment or in combination with any other embodiments or portions thereof.

Metal Complex(es)

Metal complex(es), including derivative(s) thereof, are described herein. In embodiments, the metal complex(es) have long-lived charge-transfer excited states. The metal complex(es) described herein may be useful for light harvesting and energy conversion photovoltaic/photochemical applications, including as photosensitizers and photocatalysts.

Certain embodiments include a metal complex having the structure of Formula I:

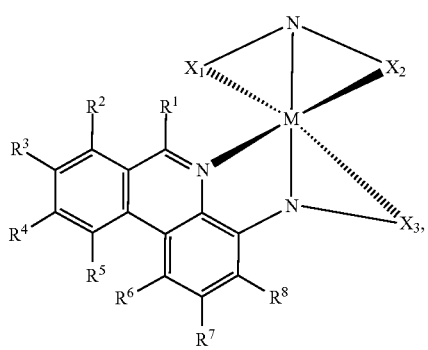

Formula I a salt, hydrate, solvate, tautomer, optical isomer, or combination thereof; wherein: $R^1$ to $R^8$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

With respect to the options for $R^1$ to $R^8$, $X_1$ to $X_3$ and M, $R^1$ to $R^8$, $X_1$ to $X_3$ and M may be any suitable embodiment listed above and as follows, in any combination:

In further embodiments, $R^1$ to $R^8$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted arylalkenyl group, substituted or unsubstituted arylalkynyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group.

In further embodiments, $R^1$ to $R^8$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group. In further embodiments, $R^1$ to $R^8$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group. In further embodiments, $R^1$ to $R^8$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^8$ are each independently selected from H, a carboxylic acid group, carboxyl group, phosphate group, halo group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^8$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group. In yet other embodiments, one of $R^1$ to $R^8$ is selected from any one of the groups listed above and the other $R^1$ to $R^8$ are each independently selected from H or substituted or unsubstituted alkyl group. In more embodiments, the other $R^1$ to W are each independently selected from H or substituted or unsubstituted $C_1$-$C_6$ alkyl group. In yet another embodiment, $R^7$ is selected from any one of the groups listed above and $R^2$ to $R^6$ and $R^8$ are each independently selected from H or substituted or unsubstituted alkyl group. In more embodiments, $R^2$ to $R^6$ and $R^8$ are each independently selected from H or substituted or unsubstituted $C_1$-$C_6$ alkyl group. In further embodiments, $R^2$ to $R^6$ and $R^8$ are each H. In particular embodiments, $R^7$ is selected from H, a carboxylic acid group, carboxyl group, phosphate group, halo group, substituted or unsubstituted alkyl group, or substituted or unsubstituted haloalkyl group and $R^2$ to $R^6$ and $R^8$ are each independently selected from H or substituted or unsubstituted alkyl group. In particular embodiments, $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^2$ to $R^6$ and $R^8$ are each independently selected from H or substituted or unsubstituted $C_1$-$C_6$ alkyl group. In particular embodiments, $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^2$ to $R^6$ and $R^8$ are each H. In other embodiments, $R^7$ is selected from a carboxylic acid group, carboxyl group, phosphate group, halo group, substituted or unsubstituted $C_1$-$C_6$ alkyl group, or substituted or unsubstituted $C_1$-$C_6$ haloalkyl group. In other embodiments, $R^7$ is selected from a carboxylic acid group, carboxyl group, halo group group, $C_1$-$C_6$ alkyl group, or $C_1$-$C_6$ haloalkyl group.

In other embodiments described herein, $X_1$ to $X_3$ are each independently selected from substituted or unsubstituted monocyclic aromatic groups, substituted or unsubstituted polycyclic aromatic groups, substituted or unsubstituted monocyclic heteroaromatic groups, or substituted or unsubstituted polycyclic heteroaromatic groups. In other embodiments described herein, wherein the substituted or unsubstituted monocyclic aromatic groups are selected from 4 to 10 carbon atoms, typically 4 to 7 carbon atoms, and more typically 4 to 6 carbon atoms in the ring.

In other embodiments described herein, wherein the substituted or unsubstituted monocyclic heteroaromatic groups are selected from 4 to 10 member atoms, which include carbon atoms and at least one heteroatom, typically 4 to 7 member atoms, and more typically 4 to 6 member atoms in the ring. In other embodiments described herein, wherein the substituted or unsubstituted polycyclic aromatic groups has two to three rings, fused or pendent, typically having 8 to 16 carbon atoms, more typically 8 to 14 carbon atoms in the rings. In other embodiments described herein, wherein the substituted or unsubstituted polycyclic heteroaromatic groups has two to three rings, fused or pendent, typically having 8 to 16 member atoms, including carbon atoms and at least one heteroatom, more typically 8 to 14 member atoms in the rings. In other embodiments described herein, $X_1$ to $X_3$ are each independently selected from substituted or unsubstituted phenyl, substituted or unsubstituted naphthyl, substituted or unsubstituted tetrahydronaphthyl, substituted or unsubstituted indanyl, substituted or unsubstituted biphenyl, substituted or unsubstituted phenanthryl, substituted or unsubstituted anthryl, substituted or unsubstituted acenaphthyl, substituted or unsubstituted pyrrolyl, substituted or unsubstituted imidazolyl, substituted or unsubstituted thiazolyl, substituted or unsubstituted oxazolyl, substituted or unsubstituted furanyl, substituted or unsubstituted thiophenyl, substituted or unsubstituted triazolyl, substituted or unsubstituted pyrazolyl, substituted or unsubstituted isoxazolyl, substituted or unsubstituted isothiazolyl, substituted or unsubstituted pyridinyl, substituted or unsubstituted pyrazinyl, substituted or unsubstituted pyridazinyl, substituted or unsubstituted pyrimidinyl, substituted or unsubstituted triazinyl, substituted or unsubstituted indolyl, substituted or unsubstituted benzofuranyl, substituted or unsubstituted benzothiophenyl, substituted or unsubstituted benzimidazolyl, substituted or unsubstituted benzthiazolyl, substituted or unsubstituted quinolinyl, substituted or unsubstituted isoquinolinyl, substituted or unsubstituted quinazolinyl, or substituted or unsubstituted quinoxalinyl. In other embodiments described herein, $X_1$ to $X_3$ are each independently selected from substituted or unsubstituted quinolinyl. In other embodiments, if $X_1$ to $X_3$ are each independently selected from substituted or unsubstituted heteroaromatic groups, at least one heteroatom of the ring of the heteroaromatic group is covalently bonded to M. In other embodiments, if $X_1$ to $X_3$ are each independently selected from substituted or unsubstituted quinolinyl, the nitrogen of the quinolinyl is covalently bonded to M.

With respect to the embodiments described herein, M is a transition metal, or an isotopic form thereof. In other embodiments, M is selected from scandium, titanium, vanadium, chromium, manganese, iron, cobalt, nickel, copper, zinc, ruthenium, rhodium, palladium, iridium, silver, platinum, or gold. In other embodiments, M is selected from scandium, titanium, vanadium, chromium, manganese, iron, cobalt, nickel, copper, zinc, ruthenium, rhodium, palladium, iridium, silver, platinum, or gold. In more typical embodiments, M is iron, chromium, iridium and rhodium.

(i) In other embodiments, wherein the metal complex is selected from:

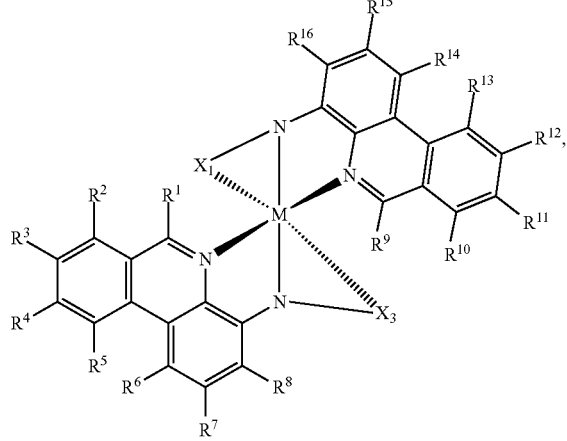

Formula Ia

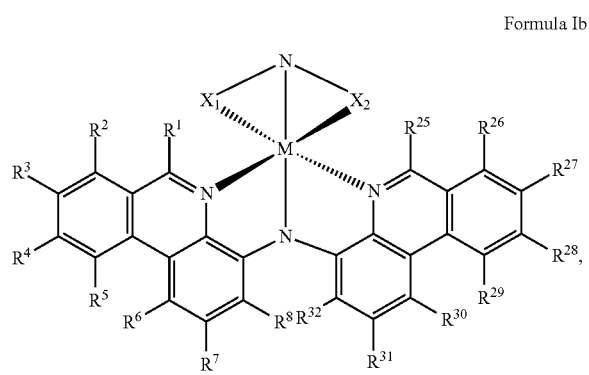

Formula Ib

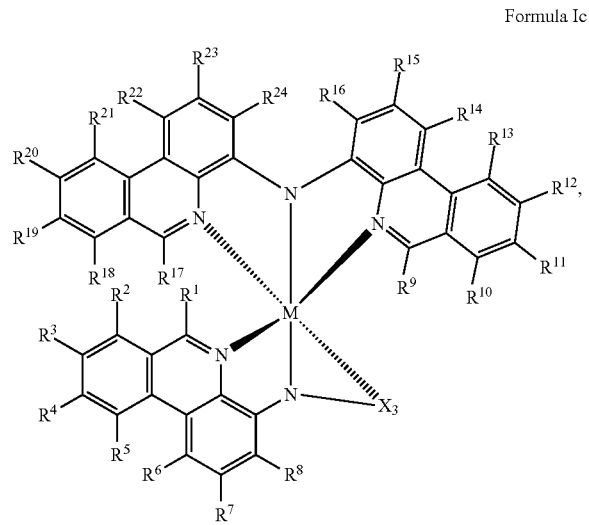

Formula Ic

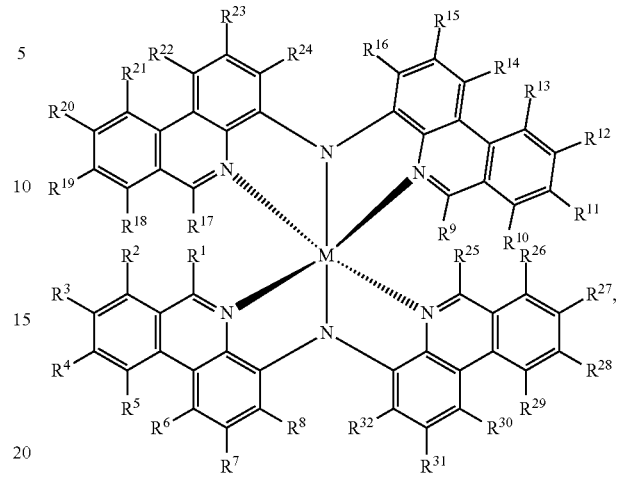

Formula Id a salt, hydrate, solvate, tautomer, optical isomer, or combination thereof; wherein: $R^1$ to $R^{32}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

With respect to the options for $R^1$ to $R^{32}$, $X_1$ to $X_3$ and M, $R^1$ to $R^{32}$, $X_1$ to $X_3$ and M may be any suitable embodiment listed above and as follows, in any suitable combination.

In further embodiments, $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted arylalkenyl group, substituted or unsubstituted arylalkynyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group.

In further embodiments, $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group. In further embodiments, $R^1$ to $R^{32}$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group. In further embodiments, $R^1$ to $R^{32}$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^{32}$ are each independently selected from H, a carboxylic acid group, carboxyl group, phosphate group, halo group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^{32}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group. In yet other embodiments, at least one of $R^1$ to $R^{32}$ is selected from any one of the groups listed above and the other $R^1$ to $R^{32}$ are each independently selected from H or substituted or unsubstituted alkyl group. In more embodiments, the other $R^1$ to $R^{32}$ are each independently selected from H or substituted or unsubstituted $C_1$-$C_6$ alkyl group. In yet another embodiment, $R^7$, $R^{15}$, $R^{23}$, and $R^{31}$ are each independently selected from any one of the groups listed above and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted alkyl group. In more embodiments, $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted $C_1$-$C_6$ alkyl group. In further embodiments, $R^1$ to $R^6$, $R^8$ to $R^{14}$, $R^{16}$ to $R^{22}$, $R^{24}$ to $R^{30}$, and $R^{32}$ are each H. In particular embodiments, $R^7$, $R^{15}$, $R^{23}$, and $R^{31}$ are each independently selected from H, a carboxylic acid group, carboxyl group, phosphate group, halo group, substituted or unsubstituted alkyl group, or substituted or unsubstituted haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted alkyl group. In particular embodiments, $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted $C_1$-$C_6$ alkyl group. In particular embodiments, $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each H. In other embodiments, $R^7$, $R^{15}$, $R^{23}$, and $R^{31}$ are each independently selected from a carboxylic acid group, carboxyl group, phosphate group, halo group, substituted or unsubstituted $C_1$-$C_6$ alkyl group, or substituted or unsubstituted $C_1$-$C_6$ haloalkyl group. In other embodiments, $R^7$, $R^{15}$, $R^{23}$, and $R^{31}$ are each independently selected from a carboxylic acid group, carboxyl group, halo group, $C_1$-$C_6$ alkyl group, or $C_1$-$C_6$ haloalkyl group.

In other embodiments described herein, $X_1$ to $X_3$ are each independently selected from substituted or unsubstituted monocyclic aromatic groups, substituted or unsubstituted polycyclic aromatic groups, substituted or unsubstituted monocyclic heteroaromatic groups, or substituted or unsubstituted polycyclic heteroaromatic groups. In other embodiments described herein, wherein the substituted or unsubstituted monocyclic aromatic groups are selected from 4 to 10 carbon atoms, typically 4 to 7 carbon atoms, and more typically 4 to 6 carbon atoms in the ring.

In other embodiments described herein, wherein the substituted or unsubstituted monocyclic heteroaromatic groups are selected from 4 to 10 member atoms, which include carbon atoms and at least one heteroatom, typically 4 to 7 member atoms, and more typically 4 to 6 member atoms in the ring. In other embodiments described herein, wherein the substituted or unsubstituted polycyclic aromatic groups has two to three rings, fused or pendent, typically having 8 to 16 carbon atoms, more typically 8 to 14 carbon atoms in the rings. In other embodiments described herein, wherein the substituted or unsubstituted polycyclic heteroaromatic groups has two to three rings, fused or pendent, typically having 8 to 16 member atoms, including carbon atoms and at least one heteroatom, more typically 8 to 14 member atoms in the rings. In other embodiments described herein, $X_1$ to $X_3$ are each independently selected from substituted or unsubstituted phenyl, substituted or unsubstituted naphthyl, substituted or unsubstituted tetrahydronaphthyl, substituted or unsubstituted indanyl, substituted or unsubstituted biphenyl, substituted or unsubstituted phenanthryl, substituted or unsubstituted anthryl, substituted or unsubstituted acenaphthyl, substituted or unsubstituted pyrrolyl, substituted or unsubstituted imidazolyl, substituted or unsubstituted thiazolyl, substituted or unsubstituted oxazolyl, substituted or unsubstituted furanyl, substituted or unsubstituted thiophenyl, substituted or unsubstituted triazolyl, substituted or unsubstituted pyrazolyl, substituted or unsubstituted isoxazolyl, substituted or unsubstituted isothiazolyl, substituted or unsubstituted pyridinyl, substituted or unsubstituted pyrazinyl, substituted or unsubstituted pyridazinyl, substituted or unsubstituted pyrimidinyl, substituted or unsubstituted triazinyl, substituted or unsubstituted indolyl, substituted or unsubstituted benzofuranyl, substituted or unsubstituted benzothiophenyl, substituted or unsubstituted benzimidazolyl, substituted or unsubstituted benzthiazolyl, substituted or unsubstituted quinolinyl, substituted or unsubstituted isoquinolinyl, substituted or unsubstituted quinazolinyl, or substituted or unsubstituted quinoxalinyl. In other embodiments described herein, $X_1$ to $X_3$ are each independently selected from substituted or unsubstituted quinolinyl. In other embodiments, if $X_1$ to $X_3$ are each independently selected from substituted or unsubstituted heteroaromatic groups, at least one heteroatom of the ring of the heteroaromatic group is covalently bonded to M. In other embodiments, if $X_1$ to $X_3$ are each independently selected from substituted or unsubstituted quinolinyl, the nitrogen of the quinolinyl is covalently bonded to M.

With respect to the embodiments described herein, M is a transition metal, or an isotopic form thereof. In other embodiments, M is selected from scandium, titanium, vanadium, chromium, manganese, iron, cobalt, nickel, copper, zinc, ruthenium, rhodium, palladium, iridium, silver, platinum, or gold. In other embodiments, M is selected from scandium, titanium, vanadium, chromium, manganese, iron, cobalt, nickel, copper, zinc, ruthenium, rhodium, palladium, iridium, silver, platinum, or gold. In more typical embodiments, M is iron, chromium, iridium and rhodium.

(ii) In other embodiments, wherein the metal complex is selected from:

Formula Ie

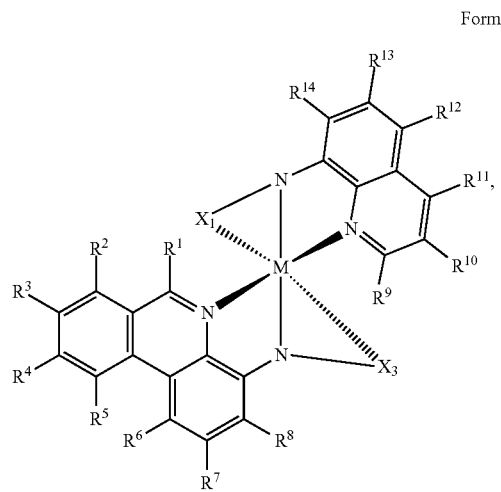

Formula If

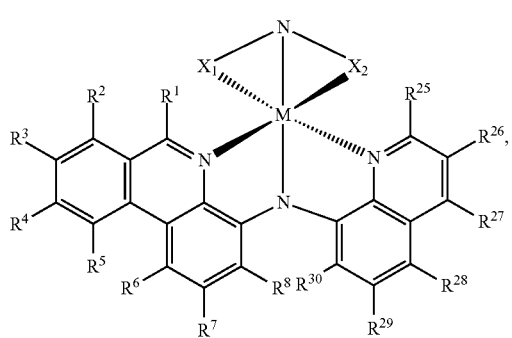

Formula Ig

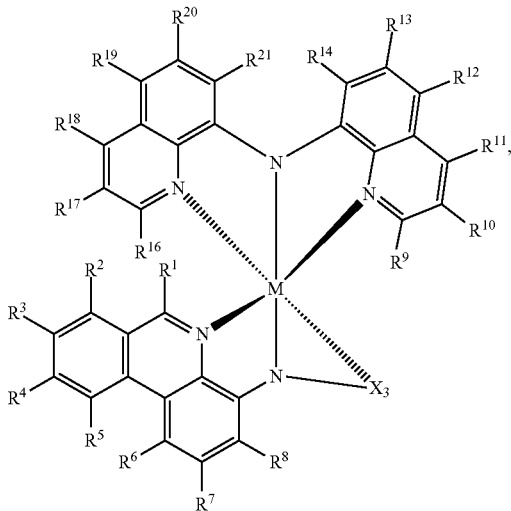

Formula Ih

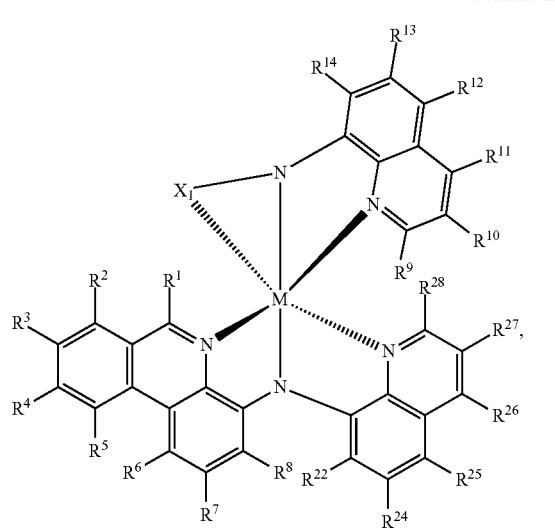

Formula Ii

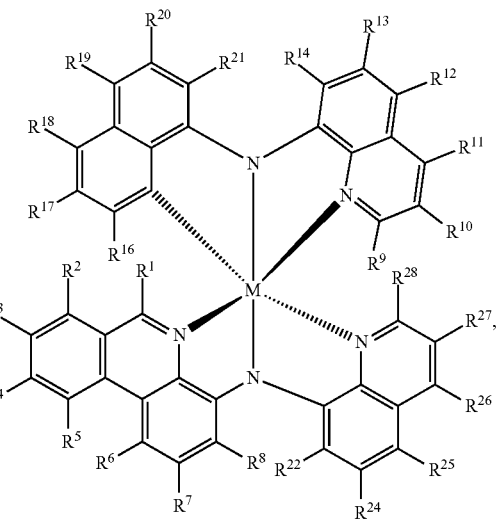

a salt, hydrate, solvate, tautomer, optical isomer, or combination thereof; wherein: $R^1$ to $R^{14}$, $R^{16}$ to $R^{22}$, $R^{24}$ to $R^{28}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

With respect to the options for $R^1$ to $R^{14}$, $R^{16}$ to $R^{22}$, $R^{24}$ to $R^{28}$, $X_1$ to $X_3$ and M, $R^1$ to $R^{14}$, $R^{16}$ to $R^{22}$, $R^{24}$ to $R^{28}$, $X_1$ to $X_3$ and M may be any suitable embodiment listed above and as follows, in any suitable combination.

In further embodiments, $R^1$ to $R^{14}$, $R^{16}$ to $R^{22}$, $R^{24}$ to $R^{28}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted arylalkenyl group, substituted or unsubstituted arylalkynyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group.

In further embodiments, $R^1$ to $R^{14}$, $R^{16}$ to $R^{22}$, $R^{24}$ to $R^{28}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group. In further embodiments, $R^1$ to $R^{14}$, $R^{16}$ to $R^{22}$, $R^{24}$ to $R^{28}$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group. In further embodiments, $R^1$ to $R^{14}$, $R^{16}$ to $R^{22}$, $R^{24}$ to $R^{28}$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^{14}$, $R^{16}$ to $R^{22}$, $R^{24}$ to $R^{28}$ are each independently selected from H, a carboxylic acid group, carboxyl group, phosphate group, halo group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^{14}$, $R^{16}$ to $R^{22}$, $R^{24}$ to $R^{28}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group. In yet other embodiments, $R^7$ is selected from any one of the groups listed above and $R^1$ to $R^6$, $R^8$ to $R^{14}$, $R^{16}$ to $R^{22}$, $R^{24}$ to $R^{28}$ are each independently selected from H or substituted or unsubstituted alkyl group. In more embodiments, $R^1$ to $R^6$, $R^8$ to $R^{14}$, $R^{16}$ to $R^{22}$, $R^{24}$ to $R^{28}$ are each independently selected from H or substituted or unsubstituted $C_1$-$C_6$ alkyl group. In further embodiments, $R^1$ to $R^6$, $R^8$ to $R^{14}$, $R^{16}$ to $R^{22}$, $R^{24}$ to $R^{28}$ are each H. In particular embodiments, $R^7$ is selected from H, a carboxylic acid group, carboxyl group, phosphate group, halo group, substituted or unsubstituted alkyl group, or substituted or unsubstituted haloalkyl group and $R^1$ to $R^6$, $R^8$ to $R^{14}$, $R^{16}$ to $R^{22}$, $R^{24}$ to $R^{28}$ are each independently selected from H or substituted or unsubstituted alkyl group. In particular embodiments, $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{28}$ are each independently selected from H or substituted or unsubstituted $C_1$-$C_6$ alkyl group. In particular embodiments, $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{28}$ are each H. In other embodiments, $R^7$ is selected from a carboxylic acid group, carboxyl group, phosphate group, halo group, substituted or unsubstituted $C_1$-$C_6$ alkyl group, or substituted or unsubstituted $C_1$-$C_6$ haloalkyl group. In other embodiments, $R^7$ is selected from a carboxylic acid group, carboxyl group, halo group, $C_1$-$C_6$ alkyl group, or $C_1$-$C_6$ haloalkyl group.

In other embodiments described herein, $X_1$ to $X_3$ are each independently selected from substituted or unsubstituted monocyclic aromatic groups, substituted or unsubstituted polycyclic aromatic groups, substituted or unsubstituted monocyclic heteroaromatic groups, or substituted or unsubstituted polycyclic heteroaromatic groups. In other embodiments described herein, wherein the substituted or unsubstituted monocyclic aromatic groups are selected from 4 to 10 carbon atoms, typically 4 to 7 carbon atoms, and more typically 4 to 6 carbon atoms in the ring.

In other embodiments described herein, wherein the substituted or unsubstituted monocyclic heteroaromatic groups are selected from 4 to 10 member atoms, which include carbon atoms and at least one heteroatom, typically 4 to 7 member atoms, and more typically 4 to 6 member atoms in the ring. In other embodiments described herein, wherein the substituted or unsubstituted polycyclic aromatic groups has two to three rings, fused or pendent, typically having 8 to 16 carbon atoms, more typically 8 to 14 carbon atoms in the rings. In other embodiments described herein, wherein the substituted or unsubstituted polycyclic heteroaromatic groups has two to three rings, fused or pendent, typically having 8 to 16 member atoms, including carbon atoms and at least one heteroatom, more typically 8 to 14 member atoms in the rings. In other embodiments described herein, $X_1$ to $X_3$ are each independently selected from substituted or unsubstituted phenyl, substituted or unsubstituted naphthyl, substituted or unsubstituted tetrahydronaphthyl, substituted or unsubstituted indanyl, substituted or unsubstituted biphenyl, substituted or unsubstituted phenanthryl, substituted or unsubstituted anthryl, substituted or unsubstituted acenaphthyl, substituted or unsubstituted pyrrolyl, substituted or unsubstituted imidazolyl, substituted or unsubstituted thiazolyl, substituted or unsubstituted oxazolyl, substituted or unsubstituted furanyl, substituted or unsubstituted thiophenyl, substituted or unsubstituted triazolyl, substituted or unsubstituted pyrazolyl, substituted or unsubstituted isoxazolyl, substituted or unsubstituted isothiazolyl, substituted or unsubstituted pyridinyl, substituted or unsubstituted pyrazinyl, substituted or unsubstituted pyridazinyl, substituted or unsubstituted pyrimidinyl, substituted or unsubstituted triazinyl, substituted or unsubstituted indolyl, substituted or unsubstituted benzofuranyl, substituted or unsubstituted benzothiophenyl, substituted or unsubstituted benzimidazolyl, substituted or unsubstituted benzthiazolyl, substituted or unsubstituted quinolinyl, substituted or unsubstituted isoquinolinyl, substituted or unsubstituted quinazolinyl, or substituted or unsubstituted quinoxalinyl. In other embodiments described herein, $X_1$ to $X_3$ are each independently selected from substituted or unsubstituted quinolinyl. In other embodiments, if $X_1$ to $X_3$ are each independently selected from substituted or unsubstituted heteroaromatic groups, at least one heteroatom of the ring of the heteroaromatic group is covalently bonded to M.

With respect to the embodiments described herein, M is a transition metal, or an isotopic form thereof. In other embodiments, M is selected from scandium, titanium, vanadium, chromium, manganese, iron, cobalt, nickel, copper, zinc, ruthenium, rhodium, palladium, iridium, silver, platinum, or gold. In other embodiments, M is selected from scandium, titanium, vanadium, chromium, manganese, iron, cobalt, nickel, copper, zinc, ruthenium, rhodium, palladium, iridium, silver, platinum, or gold. In more typical embodiments, M is iron, chromium, iridium and rhodium.

(iii) In other embodiments, wherein the metal complex is selected from:

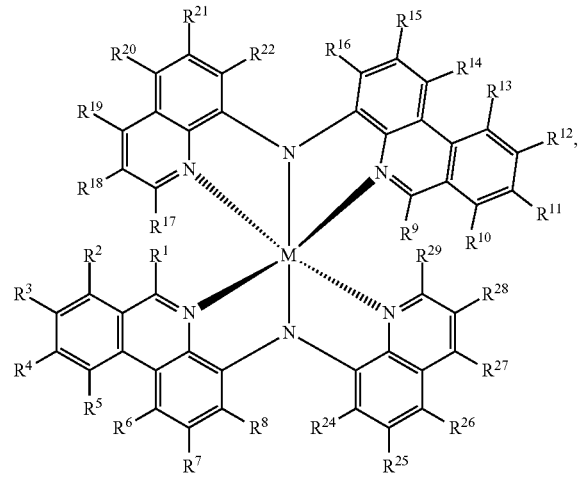

Formula Ij

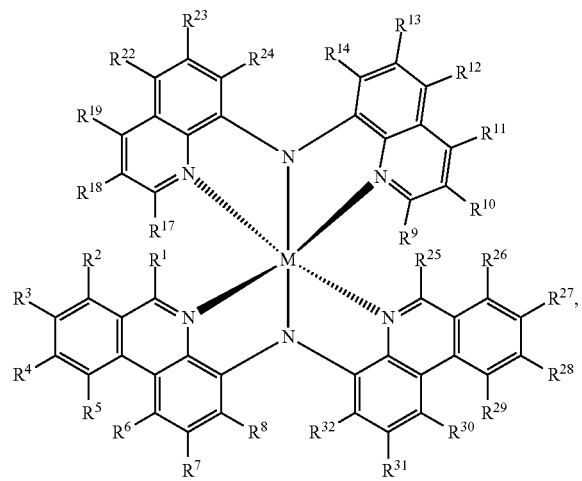

Formula Ik

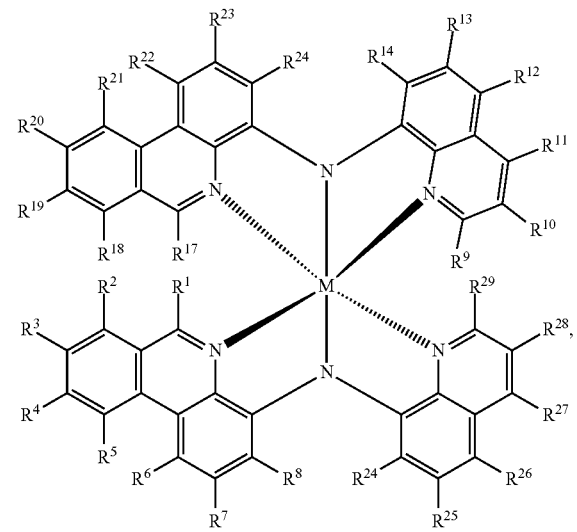

Formula Im

Formula In

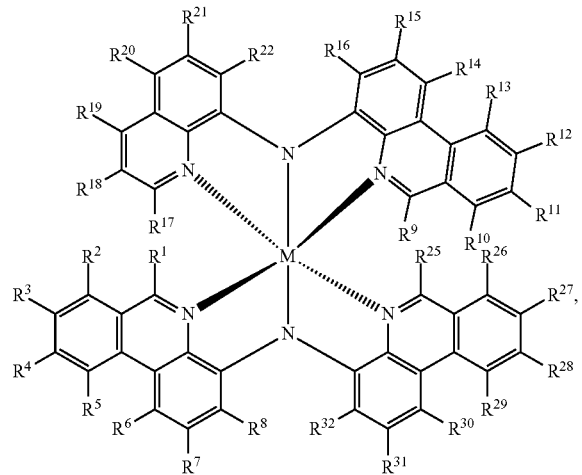

a salt, hydrate, solvate, tautomer, optical isomer, or combination thereof; wherein: $R^1$ to $R^{32}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic; $X_1$ to $X_3$ are each independently selected from a substituted or unsubstituted aromatic, or a substituted or unsubstituted heteroaromatic; and M is a metal.

With respect to the options for $R^1$ to $R^{32}$, $X_1$ to $X_3$ and M, $R^1$ to $R^{32}$, $X_1$ to $X_3$ and M may be any suitable embodiment listed above and as follows, in any suitable combination.

In further embodiments, $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted arylalkenyl group, substituted or unsubstituted arylalkynyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group.

In further embodiments, $R^1$ to $R^{32}$ are each independently selected from H, a carboxylic acid group, carboxyl group, phosphate group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group. In further embodiments, $R^1$ to $R^{32}$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group. In further embodiments, $R^1$ to $R^{32}$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^{32}$ are each independently selected from H, a carboxylic acid group, carboxyl group, phosphate group, halo group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group. In further embodiments, $R^1$ to $R^{32}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group. In yet another embodiment, $R^7$, $R^{15}$, $R^{23}$, and $R^{31}$ are each independently selected from any one of the groups listed above and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted alkyl group. In more embodiments, $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted $C_1$-$C_6$ alkyl group. In further embodiments, $R^1$ to $R^6$, $R^8$ to $R^{14}$, $R^{16}$ to $R^{22}$, $R^{24}$ to $R^{30}$, and $R^{32}$ are each H. In particular embodiments, $R^7$, $R^{15}$, $R^{23}$, and $R^{31}$ are each independently selected from H, a carboxylic acid group, carboxyl group, phosphate group, halo group, substituted or unsubstituted alkyl group, or substituted or unsubstituted haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted alkyl group. In particular embodiments, $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted $C_1$-$C_6$ alkyl group. In particular embodiments, $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each H. In particular embodiments, $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each H. In other embodiments, $R^7$, $R^{15}$, $R^{23}$, and $R^{31}$ are each independently selected from a carboxylic acid group, carboxyl group, phosphate group, halo group, substituted or unsubstituted $C_1$-$C_6$ alkyl group, or substituted or unsubstituted $C_1$-$C_6$ haloalkyl group. In other embodiments, $R^7$, $R^{15}$, $R^{23}$, and $R^{31}$ are each independently selected from a carboxylic acid group, carboxyl group, halo group, $C_1$-$C_6$ alkyl group, or $C_1$-$C_6$ haloalkyl group.

With respect to the embodiments described herein, M is a transition metal, or an isotopic form thereof. In other embodiments, M is selected from scandium, titanium, vanadium, chromium, manganese, iron, cobalt, nickel, copper, zinc, ruthenium, rhodium, palladium, iridium, silver, platinum, or gold. In other embodiments, M is selected from scandium, titanium, vanadium, chromium, manganese, iron, cobalt, nickel, copper, zinc, ruthenium, rhodium, palladium, iridium, silver, platinum, or gold. In more typical embodiments, M is iron, chromium, iridium and rhodium.

With respect to the salts of the above described embodiments, the counterion(s) of the salts may be selected from any suitable counterion(s). With respect to the formation of suitable salts, any suitable counterions may be used to form a salt with the metal complex(es) described herein. Exemplary counterions include halide ions (e.g., $F^-$, $Cl^-$, $Br^-$, $I^-$) $NO_3^-$, $ClO_4^-$, $OH^-$, $H_2PO_4^-$, $HSO_4^-$, $BF_4^-$, $PF_6^-$, sulfonate ions, and carboxylate ions.

In other embodiments, the metal complex(es) described herein may include:

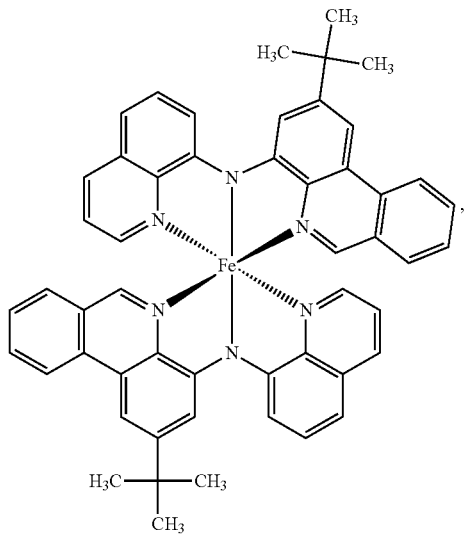

3a

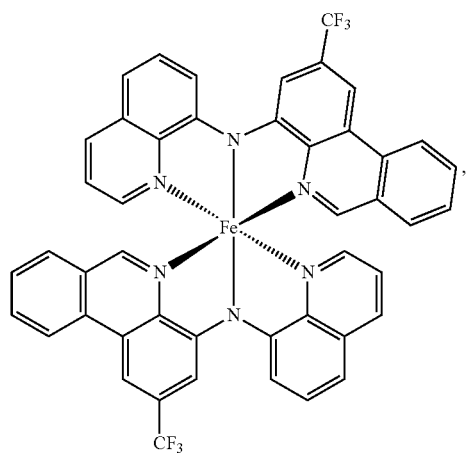

3b

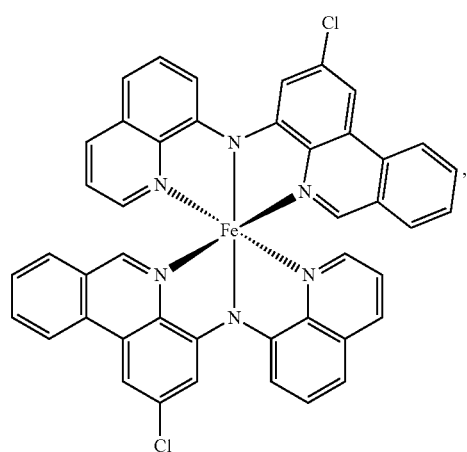

3c

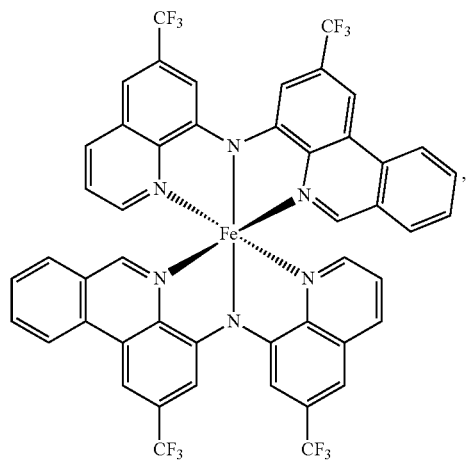

3d

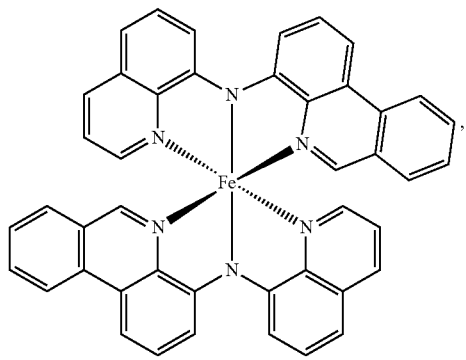
3e
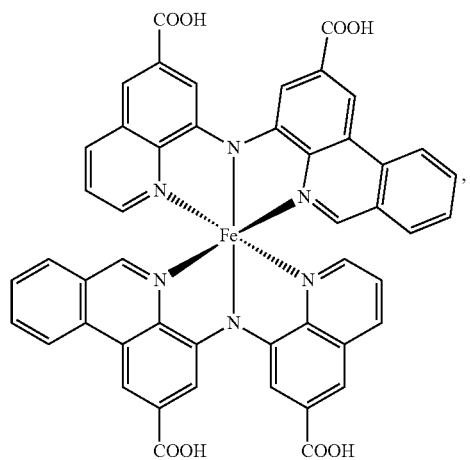
3h
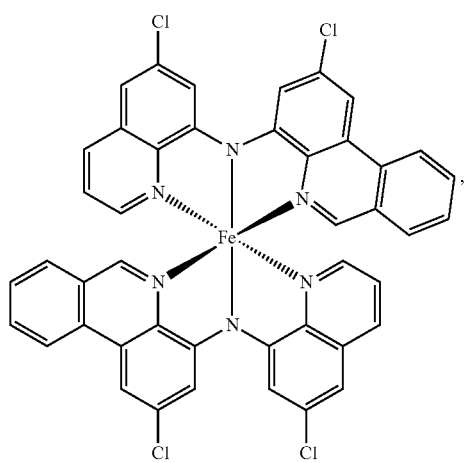
3f
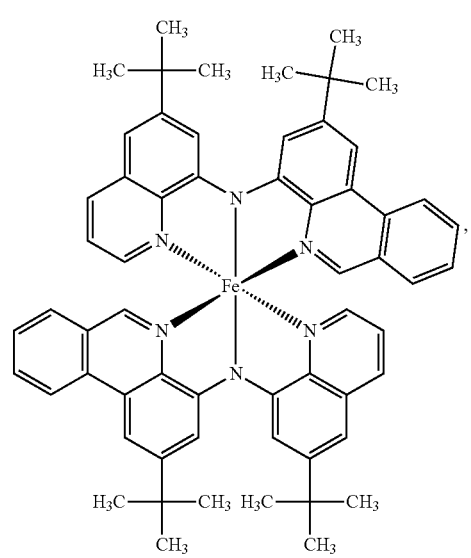
3i
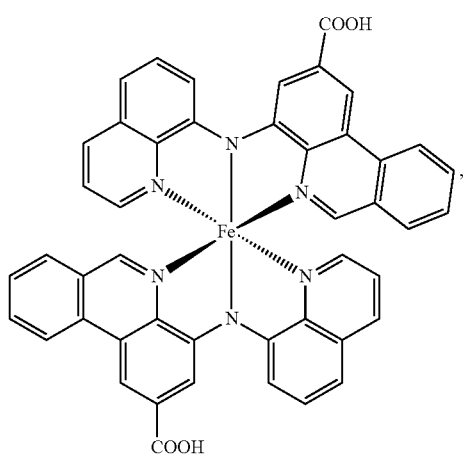
3g
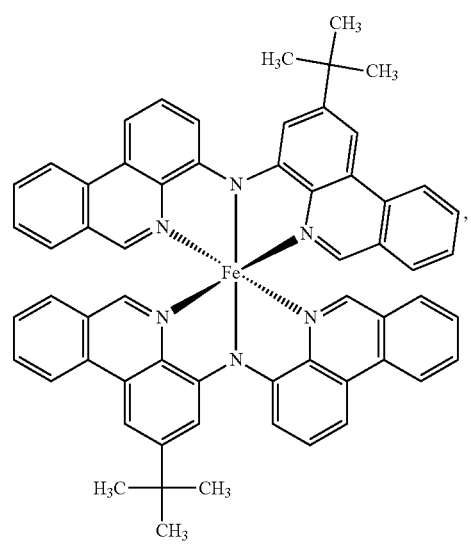
3j 3k
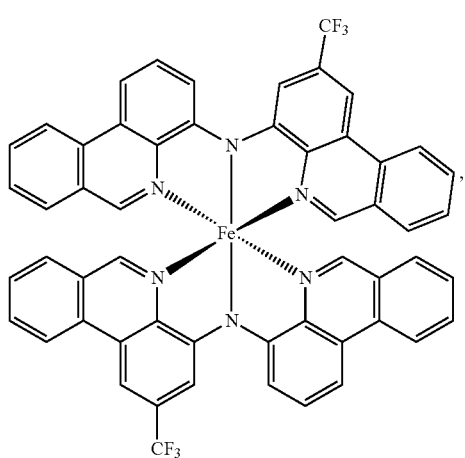
3l
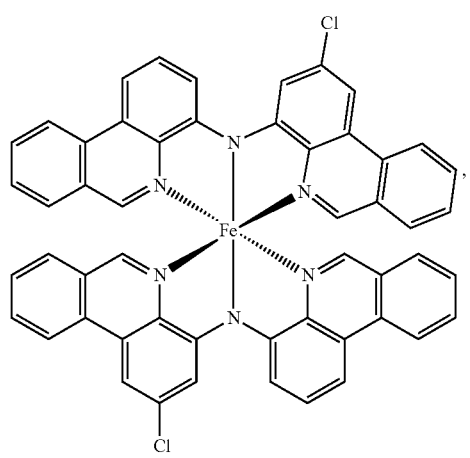
3m
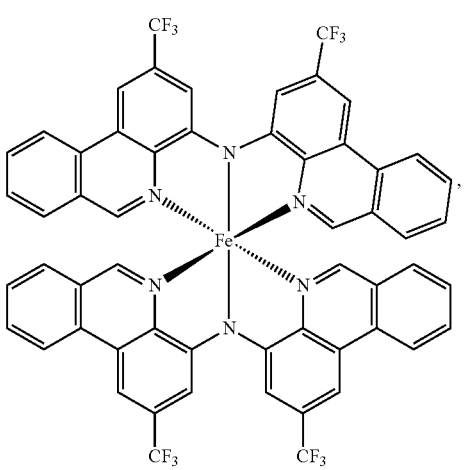
3n
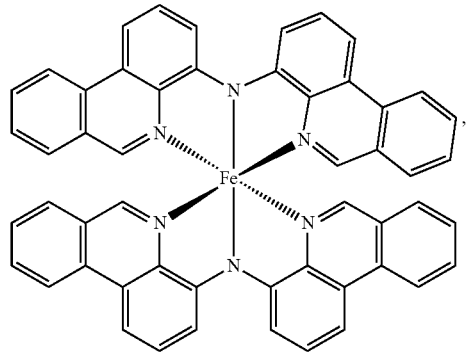
3o
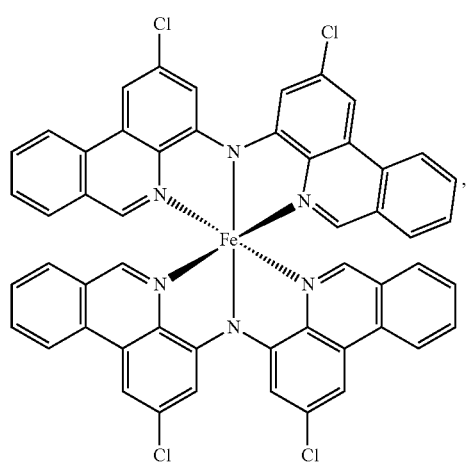
3p
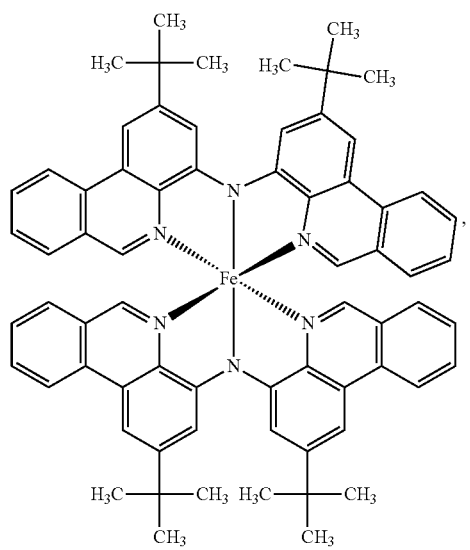

-continued

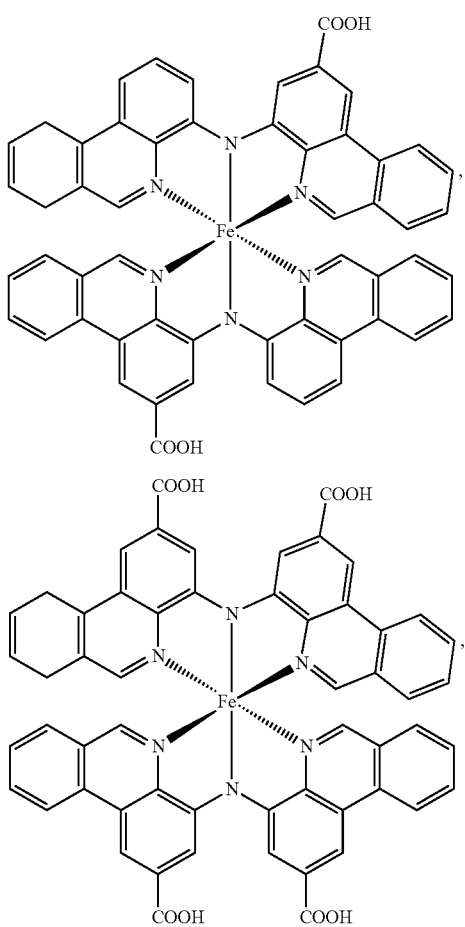

3q a salt, hydrate, solvate, tautomer, optical isomer, or combination thereof.

In other embodiments, the metal complex(es) described herein may exclude:

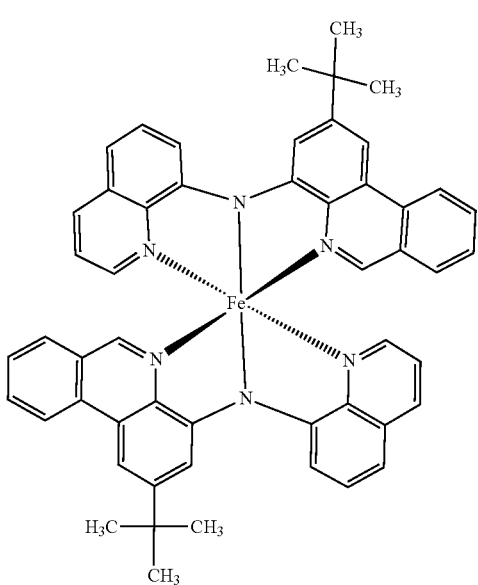

3a

-continued

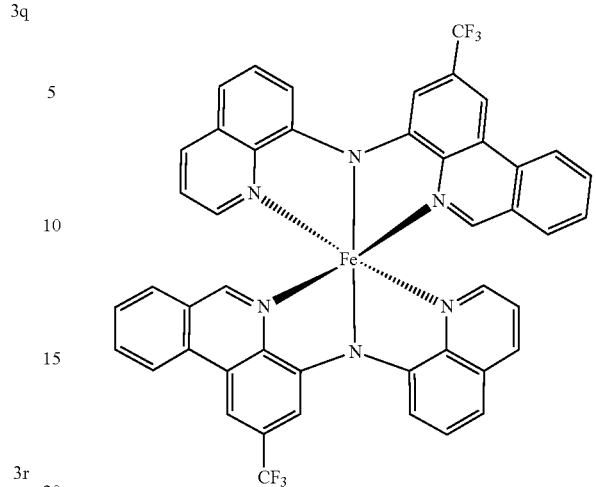

3b

In embodiments, the metal complex(es), including derivatives thereof, are substantially stable towards oxidation. In a specific embodiment, the metal complex(es) are substantially stable towards oxidation in ambient air. In other embodiments, the metal complex(es) are substantially stable as a result of electronic tuning by introduction of selective ligand substituents. Certain examples include, without being limited thereto, complexes 3c, 3d, 3f, 3k, 3l, 3m, 3o, a salt, hydrate, solvate, tautomer, optical isomer, or combination thereof.

The R group(s) of the metal complex(es) described herein, may include group(s) useful for tethering, for example, to semiconductors(s) surfaces for charge injection. The group(s) may include carboxylic acid groups and other chemical groups (e.g. phosphates, etc.) See, e.g., Materna K. L. et al., Chem. Soc. Rev., 46, 6099 (2017). In embodiments, the metal complex(es) described herein exhibit panchromatic absorption (e.g. across the visible range of the electromagnetic spectrum) with high molar absorptivity cross-section. In certain embodiments, the molar absorptivity cross-section is about 10 $mM^{-1}cm^{-1}$ to about 30 $mM^{-1}cm^{-1}$, about 15 $mM^{-1}cm^{-1}$ to about 30 $mM^{-1}cm^{-1}$, about 10 $mM^{-1}cm^{-1}$ to about 25 $mM^{-1}cm^{-1}$, or about 10 $mM^{-1}cm^{-1}$ to about 20 $mM^{-1}cm^{-1}$. In solar conversion systems, the metal complex(es) described may then be used in solar cells since such complex(es) are capable of absorbing the incoming sunlight, that is, absorb visible light of all colors (less than about 920 nm). For example, an absorption profile with high absorptive cross-section for low energy CT bands covering the spectrum from the UV to the edge of the visible (about 850 nm) means a greater proportion of the solar spectrum may be harvested with sustainable sensitizers that comprise the metal complex(es) described herein.

In other embodiments, the metal complex(es) described herein have long-lived charge-transfer excited states. In embodiments, the long-lived charge-transfer excited states that last for nanoseconds. The metal complex(es) described herein may have charge-transfer excited state lifetimes from about 1 ns to about 7 ns; about 1 ns to about 6 ns; about 1 ns to about 5 ns; about 2 ns to about 4.5 ns, about 2 ns to about 4.3 ns; about 2.2 ns to about 5 ns; about 2.5 ns to about 5 ns; or about 3 ns to about 5 ns.

Method of Making Metal Complexes and Derivatives Thereof

The compounds described herein can be made using a variety of methods. In one embodiment of the method, the compounds can be made as follows and the groups ($R^1$—$R^8$, $X_1$ to $X_3$, and M) are defined as in the previous section:

a) a compound of Formula IA is reacted with $X_3$-LG and undergoes metal catalyzed amination to form an intermediate of Formula IB:

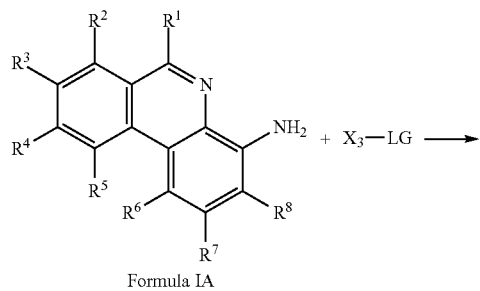

Formula IA

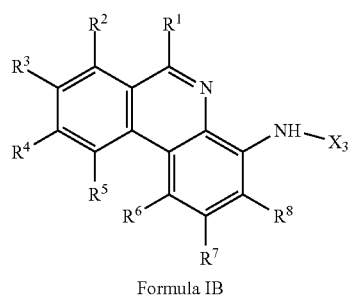

Formula IB wherein LG is selected from a suitable leaving group. Any suitable leaving group can be used and, for example, can be selected from a weak base such as halides (e.g., Cl, Br, I), tosylates, mesylates, and perfluoroalkylsulfonates. With respect to the metal catalyzed amination, the typical catalyst used is a transition metal catalyst, which includes, without being limited thereto, $Pd(OAc)_2/P(t-Bu)_3$, $Pd(OAc)_2/P(t-Bu)_3$, $Pd_2(dba)_3/BINAP$ and $Pd(OAc)_2/BINAP$. These reactions are typically carried out in solvents such as, for example, toluene or dioxane, in the presence of bases such as, for example, caesium carbonate or sodium or potassium tert-butoxide or tert-pentoxide at temperatures ranging from room temperature to reflux. See, e.g., Hartwig and Angew, Chem. Int. Ed 37, 2046 (1998). The substrates employed in the first step of the synthesis of these compounds may be obtained commercially or are prepared using methods well known to those skilled in the art.

b) the intermediate of Formula IB is reacted with $X_1$—NH—$X_2$ and a metal (M) Lewis acid to form Formula IC.

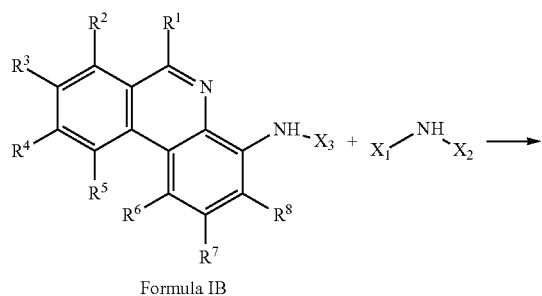

Formula IB

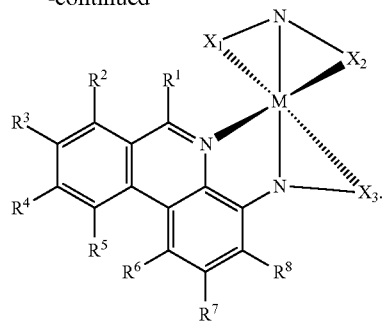

Formula IC

The metal (M) Lewis acid can be any suitable metal (M) Lewis acid to make Formula IC. The metal (M) Lewis acid may be selected from any suitable (heavy) metal Lewis acids. Heavy metal Lewis acids may be categorized as hard, borderline or soft (correlating with high-to-low oxidation states). Examples of heavy metal Lewis acids include $Sc^{3+}$, $Ti^{2+}$, $Ti^{3+}$, $Ti^{4+}$, $V^{2+}$, $V^{3+}$, $V^{4+}$, $V^{5+}$, $Cr^{2+}$, $Cr^{3+}$, $Cr^{6+}$, $Mn^{2+}$, $Mn^{3+}$, $Fe^{2+}$, $Fe^{3+}$, $Co^{2+}$, $Co^{3+}$, $Ni^{2+}$, $Cu^{+}$, $Cu^{2+}$, $Zn^{2+}$, $Y^{3+}$, $Zr^{2+}$, $Zr^{4+}$, $Nb^{3+}$, $Nb^{5+}$, $Mo^{2+}$, $Mo^{3+}$, $Mo^{4+}$, $Mo^{5+}$, $Ru^{2+}$, $Ru^{3+}$, $Ru^{4+}$, $Ru^{8+}$, $Rh^{2+}$, $Rh^{3+}$, $Pd^{2+}$, $Pd^{4+}$, $Ag^{+}$, $Cd^{2+}$, $In^{+}$, $In^{3+}$, $Sn^{2+}$, $Sn^{4+}$, $La^{3+}$, $Ce^{3+}$, $Ce^{4+}$, $Pr^{3+}$, $Nd^{3+}$, $Pm^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Lu^{3+}$, $Hf^{4+}$, $Ta^{5+}$, $W^{2+}$, $W^{3+}$, $W^{4+}$, $W^{5+}$, $Re^{3+}$, $Re^{4+}$, $Os^{2+}$, $Os^{6+}$, $Os^{8+}$, $Ir^{3+}$, $Ir^{4+}$, $Pt^{2+}$, $Pt^{4+}$, $Au^{+}$, $Au^{3+}$, $Hg^{2+}$, $Hg_2^{2+}$, $Tl^{+}$, $Pb^{2+}$, $Pb^{4+}$, $Bi^{3+}$, and $Bi^{5+}$. Typical metal Lewis acid(s) used are a transition metal Lewis acid, which includes, without being limited thereto, metal triflates (OTf=—$OSO_2CF_3$), metal tetrafluoroborates, and metal halides (chlorine, bromine or iodine), such as transition metal triflates, metal chlorides, aluminium trichloride ($AlCl_3$), copper chloride ($CuCl_2$), iron chloride ($FeCl_3$), platinum chloride ($PtCl_4)^{2-}$, palladium chloride ($PdCl_2$), iron triflate ($Fe(OTf)_2$), iridium triflate ($Ir(OTf)_3$), rhodium triflate ($Rh(OTf)_2$), zinc triflate ($Zn(OTf)_2$), copper triflate ($Cu(OTf)_2$), tin triflate ($Sn(OTf)_2$), and zinc tetrafluoroborate ($Zn(BF_4)_2$).

These reactions are typically carried out in solvents such as, for example, THF or methanol, in the presence of bases such as, for example, caesium carbonate or sodium or potassium tert-butoxide or tert-pentoxide at temperatures ranging from room temperature to reflux. Formula IC may also be converted to any suitable salt where appropriate, in-situ with (b) or in a separate reaction, using any suitable base or acid (e.g. alkali metal or alkaline earth metal bases such as, and without being limited thereto, alkali metal or alkaline earth metal hexafluorophosphate, alkoxides, halides, nitrates, phosphates, etc.). With respect to the formation of suitable salts, any suitable counterions may form. As outlined in the definitions, the counterion is a negatively charged group associated, for example, with a cationic metal complex (e.g. Formula IC) in order to maintain electrostatic neutrality. Exemplary counterions include halide ions (e.g., $F^-$, $Cl^-$, $Br^-$, $I^-$) $NO_3^-$, $ClO_4^-$, $OH^-$, $H_2PO_4^-$, $HSO_4^-$, $^-BF_4$, $^-PF_6$, sulfonate ions, and carbon/late ions (e.g., acetate, ethanoate, propanoate, benzoate, glycerate, lactate, tartrate, glycolate, and the like).

In another embodiment, the compounds can be made as follows and the groups are defined as in the previous section:

a) a compound of Formula IAA reacts with $X_3$—$NH_2$ and undergoes metal catalyzed amination to form an intermediate of Formula IB:

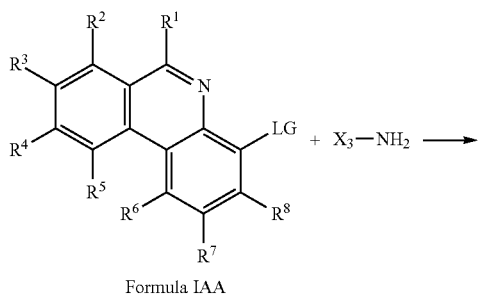

Formula IAA

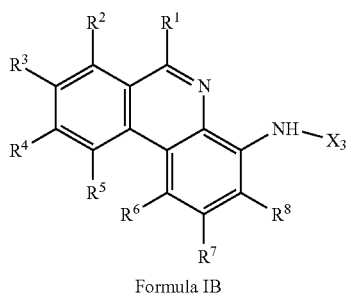

Formula IB wherein LG is selected from a suitable leaving group. Any suitable leaving group can be used and, for example, can be selected from a weak base such as halides (e.g., Cl, Br, I), tosylates, mesylates, and perfluoroalkylsulfonates. With respect to the metal catalyzed amination, the typical catalyst used is a transition metal catalyst, which includes, without being limited thereto, $Pd(OAc)_2/P(t-Bu)_3$, $Pd(OAc)_2/P(t-Bu)_3$, $Pd_2(dba)_3$/BINAP and $Pd(OAc)_2$/BINAP. These reactions are typically carried out in solvents such as toluene or dioxane, in the presence of bases such as caesium carbonate or sodium or potassium tert-butoxide or tert-pentoxide at temperatures ranging from room temperature to reflux. See, e.g., Hartwig and Angew, Chem. Int. Ed 37, 2046 (1998). The amines employed in the first step of the synthesis of these compounds may be obtained commercially or are prepared using methods well known to those skilled in the art.

b) the intermediate of Formula IB is reacted with $X_1$—NH—$X_2$ and a metal (M) Lewis acid to form Formula IC.

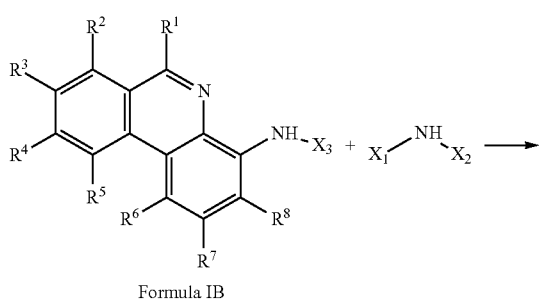

Formula IB

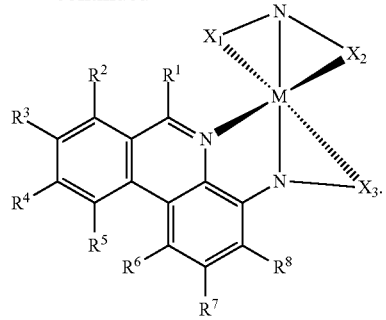

Formula IC

The metal (M) Lewis acid can be any suitable metal (M) Lewis acid to make Formula IC. The metal (M) Lewis acid may be selected from any suitable (heavy) metal Lewis acids. Heavy metal Lewis acids may be categorized as hard, borderline or soft (correlating with high-to-low oxidation states). Examples of heavy metal Lewis acids include $Sc^{3+}$, $Ti^{2+}$, $Ti^{3+}$, $Ti^{4+}$, $V^{2+}$, $V^{3+}$, $V^{4+}$, $V^{5+}$, $Cr^{2+}$, $Cr^{3+}$, $Cr^{6+}$, $Mn^{2+}$, $Mn^{3+}$, $Fe^{2+}$, $Fe^{3+}$, $Co^{2+}$, $Co^{3+}$, $Ni^{2+}$, $Cu^+$, $Cu^{2+}$, $Zn^{2+}$, $Y^{3+}$, $Zr^{2+}$, $Zr^{4+}$, $Nb^{3+}$, $Nb^{5+}$, $Mo^{2+}$, $Mo^{3+}$, $Mo^{4+}$, $Mo^{5+}$, $Ru^{2+}$, $Ru^{3+}$, $Ru^{4+}$, $Ru^{8+}$, $Rh^{2+}$, $Rh^{3+}$, $Pd^{2+}$, $Pd^{4+}$, $Ag^+$, $Cd^{2+}$, $In^+$, $In^{3+}$, $Sn^{2+}$, $Sn^{4+}$, $La^{3+}$, $Ce^{3+}$, $Ce^{4+}$, $Pr^{3+}$, $Nd^{3+}$, $Pm^{3+}$, $Sm^{2+}$, $Sm^{3+}$, $Eu^{2+}$, $Eu^{3+}$, $Gd^{3+}$, $Tb^{3+}$, $Dy^{3+}$, $Ho^{3+}$, $Er^{3+}$, $Tm^{3+}$, $Yb^{2+}$, $Yb^{3+}$, $Lu^{3+}$, $Hf^{4+}$, $Ta^{5+}$, $W^{2+}$, $W^{3+}$, $W^{4+}$, $W^{5+}$, $Re^{3+}$, $Re^{4+}$, $Os^{2+}$, $Os^{6+}$, $Os^{8+}$, $Ir^{3+}$, $Ir^{4+}$, $Pt^{2+}$, $Pt^{4+}$, $Au^+$, $Au^{3+}$, $Hg^{2+}$, $Hg_2^{2+}$, $Tl^+$, $Pb^{2+}$, $Pb^{4+}$, $Bi^{3+}$, and $Bi^{5+}$. Typical metal Lewis acid(s) used are a transition metal Lewis acid, which includes, without being limited thereto, metal triflates (OTf=—$OSO_2CF_3$), metal tetrafluoroborates, and metal halides (chlorine, bromine or iodine), such as transition metal triflates, metal chlorides, aluminium trichloride ($AlCl_3$), copper chloride ($CuCl_2$), iron chloride ($FeCl_3$), platinum chloride ($PtCl_2$), palladium chloride ($PdCl_2$), iron triflate ($Fe(OTf)_2$), iridium triflate ($Ir(OTf)_2$), rhodium triflate ($Rh(OTf)_2$), zinc triflate ($Zn(OTf)_2$), copper triflate ($Cu(OTf)_2$), tin triflate ($Sn(OTf)_2$), and zinc tetrafluoroborate ($Zn(BF_4)_2$).

These reactions are typically carried out in solvents such as, for example, THF or methanol, in the presence of bases such as, for example, caesium carbonate or sodium or potassium tert-butoxide or tert-pentoxide at temperatures ranging from room temperature to reflux. Formula IC may also be converted to any suitable salt where appropriate, in-situ with (b) or in a separate reaction, using any suitable base or acid (e.g. alkali metal or alkaline earth metal bases such as, and without being limited thereto, alkali metal or alkaline earth metal hexafluorophosphate, alkoxides, halides, nitrates, phosphates, etc.). With respect to the formation of suitable salts, any suitable counterions may form. As outlined in the definitions, the counterion is a negatively charged group associated, for example, with a cationic metal complex (e.g. Formula IC) in order to maintain electrostatic neutrality. Exemplary counterions include halide ions (e.g., $F^-$, $Cl^-$, $Br^-$, $I^-$) $NO_3$, $ClO_4^-$, $OH^-$, $H_2PO_4^-$, $HSO_4^-$, $^-BF_4$, $^-PF_6$, sulfonate ions, and carbon/late ions (e.g., acetate, ethanoate, propanoate, benzoate, glycerate, lactate, tartrate, glycolate, and the like).

Uses of the Metal Complex(es) and Derivatives Thereof

The metal complex(es) described herein can be used for many applications, such as photosensitizer(s), catalyst(s) and/or photocatalyst(s). For example, the metal complex(es) described herein may be used in light harvesting and energy conversion photovoltaic/photochemical applications, which includes photosensitizing and photocatalysis. As discussed above, the complex(es) described herein may exhibit panchromatic absorption and long-lived charge-transfer excited states, which may be enabled by the combination of vacant, energetically accessible phenanthridine-based acceptor orbitals and occupied molecular orbitals destabilized by strong mixing between amido nitrogen atoms and the metal (M).

A dye-sensitized solar cell (DSC, also sometimes referred to as DSSC or DYSC) is a particular type of solar cell in which a hole transport material (HTM) may prove useful. DSCs have gained a great interest as cost-effective alternatives to silicon-based photovoltaic devices. In the DSC, light is absorbed by a dye molecule anchored to a mesoporous wide band-gap semiconductor, such as $TiO_2$. Upon light absorption the photoexcited dye injects an electron into the conduction band of the semiconductor and its resulting oxidized state is regenerated by a redox mediator in a surrounding electrolyte. The dye may comprise the metal complex(es) described herein. The metal complex(es) may include substituents useful for tethering to semiconductor surfaces for efficient charge injection. See, e.g., Materna K. L. et al., Chem. Soc. Rev., 46, 6099 (2017).

Dyes comprising the metal complex(es) described herein are particularly useful, as these complex(es) may have low-energy excited states where electron charge is capable of being transferred from metal orbitals to ligand-based ones upon exposure to light.

The potential electronic devices the metal complex(es) may be used in are many, such as in organic and inorganic electronic devices. In certain embodiments, they may be used in organic electronic devices, such as organic transistors, or in organic optoelectronic devices such as organic light emitting diodes (OLED), organic photodetectors and organic solar cells. The above lists of electronic devices should not be construed as limiting. The metal complex(es), as mentioned, may be useful in solar cells, such as in hybrid solar cells, organic solar cells, and dye-sensitized solar cells (DSCs), such as solid-state DSCs (ssDSCs).

The above disclosure generally describes the present invention. A more complete understanding can be obtained by reference to the following specific Examples. These Examples are described solely for purposes of illustration and are not intended to limit the scope of the invention. Changes in form and substitution of equivalents are contemplated as circumstances may suggest or render expedient. Although specific terms have been employed herein, such terms are intended in a descriptive sense and not for purposes of limitation.

EXAMPLES

General Experimental Details

Unless otherwise specified, all air sensitive manipulations were carried either in a $N_2$ filled glove box or using standard Schlenk techniques under Ar. 2-Formylphenyl boronic acid (AK Scientific), 4-tert-butylaniline (Sigma Aldrich), 2-nitro-4-(trifluoromethyl)aniline (Sigma Aldrich), N-iodosuccinimide (AK Scientific), N-bromosuccinimide (Alpha Aesar), Zinc dust (BDH Chemicals), $Pd(PPh_3)_4$ (Sigma Aldrich), $Pd_2(dba)_3$ (Sigma Aldrich), $Pd(OAc)_2$ (Sigma Aldrich), (1,1'-diphenylphosphino)ferrocene (dppf, Sigma Aldrich), (±)-2,2'-bis(diphenyphosphino)-1,1'-binapthalene (rac-BINAP, Sigma Aldrich), $Na_2CO_3$ (Alfa Aesar), trifluoroacetic acid (Sigma Aldrich), sodium tert-pentoxide (NaOtPen, Sigma Aldrich), sodium tert-butoxide (NaOtBu, Sigma Aldrich), hydrazine hydrate (Sigma Aldrich), formic acid (Alfa Aesar), 8-bromoquinoline (Matrix Scientific), 8-aminoquinoline (Alfa Aesar) $Fe(OTf)_2$ (Sigma Aldrich), $FeCl_3 \cdot 6H_2O$ (Fisher Scientific), $NaPF_6$ (Alfa Aesar), and methanol (Sigma Aldrich) were purchased and used without any further purification. Organic solvents were dried and distilled using appropriate drying agents prior to use. 1- and 2D NMR spectra were recorded on Bruker Avance 300 MHz or Bruker Avance—III 500 MHz spectrometers. $^1H$ and $^{13}C\{^1H\}$ NMR spectra were referenced to residual solvent peaks. Elemental analyses were performed by Microanalytical Service Ltd., Delta, BC (Canada), and at the University of Manitoba using a Perkin Elmer 2400 Series II CHNS/O Elemental Analyzer. 2-nitro-4-tert-butylaniline (Lee, J.-Y., Lee, M.-H. & Jeong, K.-S. Synthesis and Binding Properties of Anion Receptors Containing Multiple Hydrogen Bond Donors. *Supramol. Chem.* 19, 257-263 (2007)) and 2-iodo-6-nitro-4-tert-butylaniline (Mandapati, P., Giesbrecht, P. K., Davis, R. L. & Herbert, D. E. Phenanthridine-Containing Pincer-like Amido Complexes of Nickel, Palladium, and Platinum. *Inorg. Chem.* 56, 3674-3685 (2017)) were synthesized from 4-tert-butylaniline according to literature procedures. 2-iodo-6-bromo-4-trifluoromethyl-aniline was synthesized according to Conte-Mayweg, A. et al. WO2006013048A1.

For electrochemical analysis, 5-10 mg of all compounds investigated was dissolved in 15 mL of 0.1 M $(nBu_4N)PF_6$ in $CH_3CN$, and purged with Ar for 20 minutes before analysis. All electrochemical experiments were conducted under inert (Ar) atmosphere using a CHI 760c bipotentiostat, a 3 mm diameter glassy carbon working electrode, a $Ag/Ag^+$ non-aqueous quasi-reference electrode separated by a Vycor tip, and a Pt wire counter electrode. Cyclic voltammetric (CV) experiments were conducted using scan rates of 50-800 mV/s. Differential Pulse Voltammetry (DPV) experiments were also conducted, using a 5 mV increment, 50 mV amplitude, 0.1 s pulse width, 0.0167 s sample width, and 0.5 s pulse period. Upon completion of all CV and DPV analyses, ferrocene (FcH) was added to the solution as an internal standard, with all potentials reported versus the $FcH^{0/+}$ redox couple (Connelly, N. G. & Geiger, W. E. Chemical Redox Agents for Organometallic Chemistry. *Chem. Rev.* 96, 877-910 (1996)).

Electronic absorption spectra were recorded on an Agilent Technologies Cary 5000 Series UV-Vis-NIR spectrophotometer in dual beam mode (range: 230-1600 nm). Mössbauer spectroscopy experiments were performed in transmission geometry with a 1GBq $^{57}Co$ in Rh source and a WissEl constant acceleration drive. Spectra were collected at 10 K using a Janis SHI-850 closed-cycle refrigerator and are calibrated relative to α-Fe at room temperature. EPR spectra were collected on a Bruker Elexsys 580 FT/CW EPR console at 20 K (X-band; [3a]+: frequency=9.469 GHz, power=2.050 mW; [313]+: frequency=9.472 GHz, power=2.050 mW). Spectral parameters were simulated using Easyspin (Stoll, S. & Schweiger, A. EasySpin, a comprehensive software package for spectral simulation and analysis in EPR. *J. Magn. Reson.* 178, 42-55 (2006).) incorporated in MATLAB.

X-Ray Crystallography Experimental Details

X-ray crystal structure data was collected from multi-faceted crystals of suitable size and quality selected from a representative sample of crystals of the same habit using an optical microscope. In each case, crystals were mounted on MiTiGen loops with data collection carried out in a cold stream of nitrogen (150 K; Bruker D8 QUEST ECO). All diffractometer manipulations were carried out using Bruker APEX3 software. (APEX v2016.1-0 (Madison, Wisconsin, USA, 2016).) Structure solution and refinement was carried out using XS, XT and XL software, embedded within the Bruker SHELXTL suite (Sheldrick, G. M. A Short History of SHELX. *Acta Cryst. A*64, 112-122 (2008)). For each structure, the absence of additional symmetry was confirmed using ADDSYM incorporated in the PLATON program (Spek, A. L. Structure Validation in Chemical Crystallography. *Acta Cryst. D*65, 148-155 (2009)).

Crystal structure data for 2a: X-ray quality crystals were grown by evaporation of a EtOAc/hexanes solution. Crystal structure parameters: $C_{26}H_{23}N_3$, 377.47 g/mol, monoclinic, space group $P2_1/c$; a=9.1993(2) Å, b=13.7461(3) Å, c=15.8350(4) Å, α=γ=90°, β=92.2660(10)°, V=2000.84(8) Å$^3$; Z=4, $\rho_{calcd}$=1.253 g cm$^{-3}$; crystal dimensions 0.340× 0.300×0.180 mm; diffractometer Bruker D8 QUEST ECO CMOS; Mo K$_\alpha$ radiation, 150(2) K, $\theta_{max}$=30.540°; 112931 reflections, 6123 independent ($R_{int}$=0.0840), direct methods; absorption coeff (μ=0.074 mm$^{-1}$), absorption correction semi-empirical from equivalents (SADABS); refinement (against $F_o^2$) with SHELXTL V6.1, 265 parameters, 0 restraints, $R_1$=0.0584 (I>2σ) and $wR_2$=0.1607 (all data), Goof=1.023, residual electron density 0.426/−0.243 e Å$^{-3}$.

Crystal structure data for 3a (CCDC number 1589421): X-ray quality crystals were grown as a pentane solvate from a benzene solution at −35° C. A disordered pentane molecule could be successfully modeled and is included in the final structure. A disordered tBu was modeled using the appropriate restraints. Crystal structure parameters: C54.50H49.50FeN6, 844.35 g/mol, triclinic, space group P-1; a=11.8116(11) Å, b=11.8288(11) Å, c=15.8752(15) Å, α=95.132(5)°, β=92.310(5)°, γ=102.631(5)°, V=2151.6(4) Å3; Z=2, ☐calcd=1.303 g cm-3; crystal dimensions 0.2× 0.2×0.1 mm; diffractometer Bruker D8 QUEST ECO CMOS; Mo Kα radiation, 150(2) K, θmax=30.963°; 962193 reflections, 13227 independent (Rint=0.0957), intrinsic phasing; absorption coeff (μ=0.396 mm-1), absorption correction semi-empirical from equivalents (SADABS); refinement (against Fo2) with SHELXTL V6.1, 597 parameters, restraints, R1=0.0872 (I>2σ) and wR2=0.2125 (all data), Goof=1.141, residual electron density 2.31/−1.22 e Å$^{-3}$.

Crystal structure data for 3b: X-ray quality crystals were grown as fluorobenzene solvate from a pentane solution at room temperature. Disordered $CF_3$ groups were modeled with the use of appropriate restraints. One solvent molecule could be successfully modeled; however residual electron density (1402 e$^-$) assigned to two additional co-crystallized fluorobenzene molecules was found in a solvent accessible void (5799 Å$^3$). These additional solvent molecules could seen in the initial structure and by solution NMR analysis of the crystals, but not successfully refined, and so were dealt with using the SQUEEZE protocol included in the PLATON program (Spek, A. L. Structure Validation in Chemical Crystallography. *Acta Cryst.* 2009, D65, 148-155). The results from the SQUEEZE protocol are appended to the end of the .cif, included as supporting information. Crystal structure parameters: $C_{52}H_{26}F_7FeN_6$, 923.64 g/mol, orthorhombic, space group I4$_1$/a; a=b=19.4851(11) Å, c=54.499 (3) Å, α=β=γ=90°, V=206941(3) Å$^3$; Z=16, $\rho_{calcd}$=1.186 g cm$^{-3}$; crystal dimensions 0.3×0.2×0.2 mm; diffractometer Bruker D8 QUEST ECO CMOS; Mo K$_\alpha$ radiation, 150(2) K, $\theta_{max}$=30.585°; 325859 reflections, 15793 independent ($R_{int}$=0.0685), direct methods; absorption coeff (μ=0.354 mm$^{-1}$), absorption correction semi-empirical from equivalents (SADABS); refinement (against $F_o^2$) with SHELXTL V6.1, 627 parameters, 184 restraints, $R_1$=0.0828 (I>2σ) and $wR_2$=0.2356 (all data), Goof=0.982, residual electron density 0.765/−0.711 e Å$^{-3}$.

Crystal structure data for [3a][$PF_6$]: X-ray quality crystals were grown as a fluorobenzene solvate from a pentane solution at room temperature. One fluorobenzene solvent molecule could be successfully modeled and is included in the final structure. Electron density (142 e$^-$) corresponding to 1.5 additional solvent molecules per asymmetric unit was found in a solvent accessible void (554 Å$^3$) and removed using the SQUEEZE protocol included in the PLATON program (Spek, A. L. Structure Validation in Chemical Crystallography. *Acta Cryst.* D65, 148-155 (2009)). The results from the SQUEEZE protocol are appended to the end of the .cif, included as supporting information. Crystal structure parameters: $C_{58}H_{49}F_7FeN_6P$, 1049.85 g/mol, triclinic, space group P-1; a=13.2612(8) Å, b=14.5643(9) Å, c=16.2638(10) Å, α=95.338(4)°, β=107.841(3)°, γ=103.829 (3)°, V=2856.1(3) Å$^3$; Z=2, $\rho_{calcd}$=1.221 g cm$^{-3}$; crystal dimensions 0.240×0.210×0.070 mm; diffractometer Bruker D8 QUEST ECO CMOS; Mo Kα radiation, 150(2) K, $\theta_{max}$=27.574°; 112995 reflections, 13167 independent ($R_{int}$=0.0648), direct methods; absorption coeff (μ=0.355 mm$^{-1}$), absorption correction semi-empirical from equivalents (SADABS); refinement (against $F_o^2$) with SHELXTL V6.1, 653 parameters, 57 restraints, $R_1$=0.0633 (I>2σ) and $wR_2$=0.1941 (all data), Goof=1.194, residual electron density 1.032/−0.571 e Å$^{-3}$.

Crystal structure data for [3b][$PF_6$]: X-ray quality crystals were grown as a fluorobenzene solvate from a pentane solution at room temperature. Electron density (264 e$^-$) corresponding to a co-crystallized fluorobenzene solvent molecule, whose presence was corroborated by NMR spectra of the crystallized compound, was found in a solvent accessible void (752 Å$^3$) and could not be successfully refined, and so was removed using the SQUEEZE protocol included in the PLATON program (Spek, A. L. Structure Validation in Chemical Crystallography. *Acta Cryst.* D65, 148-155 (2009)). The results from the SQUEEZE protocol are appended to the end of the .cif, included as supporting information. Crystal structure parameters: $C_{46}H_{26}F_{12}FeN_6P$, 977.55 g/mol, monoclinic, space group $P2_1/n$; a=11.1843(7) Å, b=25.0821(15) Å, c=16.3728(10) Å, α=γ=90°, β=101.949(4)°, V=4493.5(5) Å$^3$; Z=4, $\rho_{calcd}$=1.445 g cm$^{-3}$; crystal dimensions 0.200×0.050×0.050 mm; diffractometer Bruker D8 QUEST ECO CMOS; Mo Kα radiation, 150(2) K, $\theta_{max}$=24.823°; 114141 reflections, 7692 independent ($R_{int}$=0.1111), direct methods; absorption coeff (μ=0.461 mm$^{-1}$), absorption correction semi-empirical from equivalents (SADABS); refinement (against $F_o^2$) with SHELXTL V6.1, 595 parameters, 0 restraints, $R_1$=0.0879 (I>2σ) and $wR_2$=0.2368 (all data), Goof=1.541, residual electron density 0.752/−0.528 e Å$^{-3}$.

Crystal structure data for 3c: X-ray quality crystals were grown as benzene solvate from a pentane solution at room temperature. Two solvent molecules could be successfully modeled. Crystal structure parameters: $C_{49.5}H_{35}Cl_2FeN_6$, 840.58 g/mol, triclinic, space group P-1; a=12.5698(5) Å, b=17.9561(6) Å, c=18.7664(6) Å, α=82.3000(10°) β=75.4080(10°) γ=75.1090(10)°, V=3950.5(2) Å$^3$; Z=4, $\rho_{calcd}$=1.413 g cm$^{-3}$; crystal dimensions 0.44×0.23×0.2 mm; diffractometer Bruker D8 QUEST ECO CMOS; Mo K$_\alpha$ radiation, 150(2) K, $\theta_{max}$=38.508°; 180195 reflections, 41675 independent ($R_{int}$=0.0625), direct methods; absorption coeff (μ=0.562 mm$^{-1}$), absorption correction semi-empirical from equivalents (SADABS); refinement (against $F_o^2$) with SHELXTL V6.1, 1072 parameters, 48 restraints, $R_1=0.0601$ (I>2σ) and $wR_2=0.21643$ (all data), Goof=1.020, residual electron density 1.500/−1.004 e Å$^{-3}$.

Computational Details

All calculations were performed with Gaussian 09, Rev. E.01 (Gaussian 09 Program Package, Revision B.01 (Gaussian, Inc., Wallingford, C T, 2009).) and acetonitrile as solvent using the solvation model based on density (SMD) (Marenich, A. V., Cramer, C. J. & Truhlar, D. G. Universal Solvation Model Based on Solute Electron Density and on a Continuum Model of the Solvent Defined by the Bulk Dielectric Constant and Atomic Surface Tensions. *J. Phys. Chem. B* 113, 6378-6396 (2009)). Unless otherwise stated, the restricted KS formalism was used for the singlet ground state electronic configuration while the unrestricted KS formalism was used for open-shell electronic configurations (triplet, quintet, and doublet; vide infra). Optimization of model 3e and [3e]$^+$ were carried out with SMD-M06/6-31+G(d,p) (Zhao, Y. & Truhlar, D. G. The M06 Suite of Density Functionals for Main Group Thermochemistry, Thermochemical Kinetics, Noncovalent Interactions, Excited States, and Transition Elements: Two New Functionals and Systematic Testing of Four M06-class Functionals and 12 Other Functionals. *Theor. Chem. Acc.* 120, 215-241 (2008).) without symmetry constraints using the X-ray structure coordinates of 3a as starting input. The ground state geometries of the neutral complexes 3a-b (charge=0, multiplicity=1) and cationic complexes [3a-b]$^+$ (charge=1, multiplicity=2) were optimized using both O3LYP and M06 functionals with 6-31+G(d,p) basis set on all atoms. Crystal structure coordinates were used as starting inputs for all ground state geometry optimizations. It was found that O3LYP provided better agreement with the experimental bond lengths and angles; therefore, the O3LYP functional for all geometry optimizations was used. Frequency calculations were performed to confirm all structures were at a minimum.

Time-dependent DFT (TD-DFT) with equilibrium solvation (TD=eqsolv) on the first 100 states was carried out on complexes with SMD-M06/6-31+G(d,p)|LANL2DZ. TDDFT analyses were carried out with the GaussSum software (FWHM=2500 cm$^{-1}$; σ=0.2) (O'Boyle, N. M., Tenderholt, A. L. & Langner, K. M. Software News and Updates cclib: a Library for Package-Independent Computational Chemistry Algorithms. *J. Comput. Chem.* 29, 839-845 (2008).) while orbital fragment analyses were carried out using QMForge. (QMForge: A Program to Analyze Quantum Chemistry Calculations v. version 2.4.) Natural transition orbitals (Martin, R. L. Natural Transition Orbitals. *J. Chem. Phys.* 118, 4775-4777 (2003).) were calculated to simplify the orbital character assignment of transitions 4, 16 and 18 for [3e]$^+$. TD-DFT difference maps showing electron density gain (green) and electron density depletion (blue) distribution maps were generated using the Multiwfn program (Lu, T. & Chen, F. Multiwfn: A Multifunctional Wavefunction Analyzer. *J. Comput. Chem.* 33, 580-592 (2012).) with a medium quality grid.

Synthesis

Figure 2:
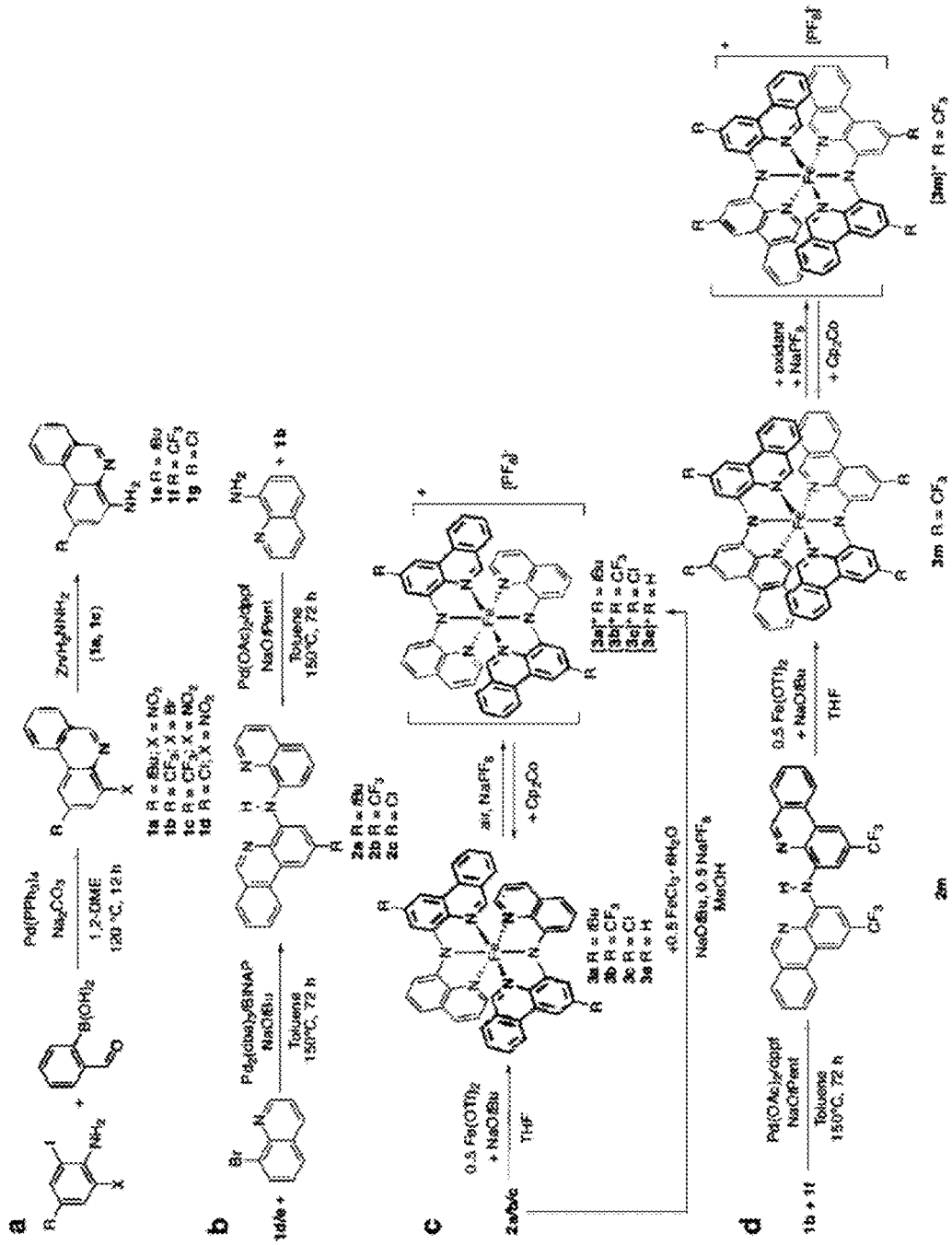
FIG. 2 shows an example of a synthetic scheme of (a) 1a-g; (b) proligands 2a-b; (c) 3a-b/[3a-b][PF$_6$]; and (d) proligand 2m and 3m/[3m][PF$_6$]. Substituted phenanthridine (3,4-benzoquinoline) precursors 1a-d amenable for elaboration into tridentate ligand scaffolds can be constructed via tandem cross-coupling/condensation reactions of appropriately substituted anilines with 2-formylphenylboronic acid. Proligands 2a-c can be assembled by Pd-catalyzed C—N bond forming reactions with either 8-amino- or 8-bromoquinoline, and then installed on Fe(II) or Fe(III) centres to form pseudo-octahedral complexes 3a-c/[3a-c]PF$_6$. The Fe(II) complexes 3a-c can be oxidized by one electron to cleanly give [3a-c]$^+$, which in turn can be reduced with an appropriate reductant such as cobaltocene [(η$^5$-C$_5$H$_5$)$_2$Co)].

4-Halo/4-amino substituted phenanthridines (1a-g) were prepared and coupled to 8-bromoquinoline/8-aminoquinoline or to the appropriately substituted phenanthridine to access proligands 2a-d in yields >90% (FIG. 2) as follows:

Preparation of 4-nitro-2-tert-butylphenanthridine (1a)

A 500 mL Teflon-stoppered flask was charged with Pd(PPh$_3$)$_4$ (1.03 g, 0.89 mmol), and 50 mL of DME. After stirring briefly to mix, 2-iodo-6-nitro-4-tert-butylaniline (5.73 g, 17.9 mmol), 2-formylphenylboronic acid (2.96 g, 19.7 mmol) and an additional 70 mL of DME were added, followed by Na$_2$CO$_3$ (5.69 g, 53.7 mmol) dissolved in 100 mL of degassed water. The flask was then sealed and the mixture stirred vigorously for 6 h in an oil bath (130° C.). The flask was then allowed to cool, charged with 130 mL of 2M HCl, and refluxed for additional 2 h. The reaction mixture was cooled, neutralized with NaOH, and pumped to dryness. The residue was then taken up in dichloromethane (100 mL) and washed with brine (3×100 mL). The organic layer was separated, dried over Na$_2$SO$_4$ and volatiles removed. Column chromatography on silica gave a pale yellow solid ($R_f$=0.42; 20% EtOAc/hexane). Isolated yield=5.54 g (96%). $^1$H NMR (CDCl$_3$, 300 MHz, 25° C.): δ 9.50 (s, 1H, C$_{Ar}$H), 8.78 (d, 1H, J$_{HH}$=2.1 Hz, C$_{Ar}$H), 8.70 (d, 1H, J$_{HH}$=8.3 Hz, C$_{Ar}$H), 8.23-8.13 (overlapped m, 2H, C$_{Ar}$H), 8.03 (m, 1H, J$_{HH}$=8.4, 7.1 Hz, C$_{Ar}$H), 7.86 (m, 1H, J$_{HH}$=8.1, 7.1 Hz; C$_{Ar}$H), 1.53 ppm (s, 9H, $^t$Bu). $^{13}$C{$^1$H} NMR (CDCl$_3$, 75 MHz, 25° C.): δ 155.0 (C$_{Ar}$), 149.8 (C$_{Ar}$), 149.2 (C$_{Ar}$), 134.0 (C$_{Ar}$), 131.8 (C$_{Ar}$), 131.3 (C$_{Ar}$), 129.1 (C$_{Ar}$), 128.6 (C$_{Ar}$), 126.4 (C$_{Ar}$), 124.9 (C$_{Ar}$), 121.9 (C$_{Ar}$), 121.4 (C$_{Ar}$), 120.5 (C$_{Ar}$), 35.6 (CC Me), 31.3 ppm (CH$_3$).

Preparation of 4-bromo-2-trifluoromethylphenanthridine (1b)

A 500 mL Teflon-stoppered flask was charged with Pd(PPh$_3$)$_4$ (1.92 g, 1.67 mmol), and 50 mL of DME. After stirring briefly to mix, 2-bromo-6-iodo-4-(trifluoromethyl)aniline (15.24 g, 41.67 mmol), 2-formylphenylboronic acid (6.87 g, 45.8 mmol) and an additional 70 mL of DME were added, followed by Na$_2$CO$_3$ (13.25 g, 125.0 mmol) dissolved in 100 mL of degassed water. The flask was then sealed and the mixture stirred vigorously for 6 h in an oil bath (130° C.). The flask was then allowed to cool, charged with 130 mL of 2M HCl, and refluxed for additional 2 h. The reaction mixture was cooled, neutralized with NaOH, and pumped to dryness. The residue was then taken up in dichloromethane (100 mL) and washed with brine (3×100 mL). The organic layer was separated, dried over Na$_2$SO$_4$ and volatiles removed. Column chromatography on silica gave a pale yellow solid ($R_f$=0.50; 20% EtOAc/hexane). Isolated yield=14.93 g (98%). $^1$H NMR (CDCl$_3$, 300 MHz, 25° C.): δ 9.35 (s, 1H, C$_{Ar}$H), 8.68 (s, 1H, C$_{Ar}$H), 8.49 (d, 1H, J$_{HH}$=8.3 Hz, C$_{Ar}$H), 8.18 (d, 1H, J$_{HH}$=1.7, C$_{Ar}$H), 8.05 (d, 1H, J$_{HH}$=8.0 Hz; C$_{Ar}$H), 7.94-7.85 (m, 1H, C$_{Ar}$H), 7.76 ppm (app t, 1H, J$_{HH}$=7.9 Hz, C$_{Ar}$H). $^{13}$C{$^1$H} NMR (CDCl$_3$, 75 MHz, 25° C.): δ 156.3 (C$_{Ar}$), 143.1 (C$_{Ar}$), 132.3 (C$_{Ar}$), 131.9 (C$_{Ar}$), 129.2 (q, C$_{Ar}$), 128.5 (C$_{Ar}$), 126.7 (C$_{Ar}$), 126.5 (C$_{Ar}$), 125.3 (C$_{Ar}$), 125.2 (C$_{Ar}$), 122.1 (C$_{Ar}$), 121.7 (C$_{Ar}$), 117.6 ppm (q, C$_{Ar}$). $^{19}$F{$^1$H} NMR (CDCl$_3$, 470 MHz, 25° C.): δ −62.0 ppm.

Preparation of 4-nitro-(2-trifluoromethyl)phenanthridine (1c)

An identical procedure to the synthesis of 1b was employed, using, 2-nitro-6-iodo-4-(trifluoromethyl)aniline (10.0 g, 30.1 mmol), 2-formylphenylboronic acid (4.97 g, 33.1 mmol) and Na$_2$CO$_3$ (9.6 g, 90.36 mmol). Column chromatography on neutral alumina gave a pale yellow solid ($R_f$=0.41; 1:5 EtOAc/hexane). Isolated yield=7.86 g (89%). $^1$H NMR (CDCl$_3$, 300 MHz, 22° C.): δ 9.50 (s, 1H; C$_{Ar}$H), 9.03 (s, 1H; C$_{Ar}$H), 8.69 (d, 1H, J$_{HH}$=8.0 Hz; C$_{Ar}$H), 8.30-8.12 (overlapped m, 2H; C$_{Ar}$H), 8.06 (ddd, 1H, J$_{HH}$=8.4, 7.2, 1.4 Hz; C$_{Ar}$H), 7.97-7.85 (m, 1H; C$_{Ar}$H), 7.76 ppm (app t, 1H, J$_{HH}$=7.9 Hz; C$_{Ar}$H). $^{13}$C{$^1$H} NMR (CDCl$_3$, 75 MHz, 22° C.): δ 156.3 ($C_{Ar}$), 143.1 ($C_{Ar}$), 132.3 ($C_{Ar}$), 131.9 ($C_{Ar}$), 129.2 (q, $C_{Ar}$), 128.5 ($C_{Ar}$), 126.7 ($C_{Ar}$), 126.5 ($C_{Ar}$), 125.3 ($C_{Ar}$), 125.2 ($C_{Ar}$), 122.1 ($C_{Ar}$), 121.7 ($C_{Ar}$), 117.6 ppm (q, $C_{Ar}$). $^{19}F\{^1H\}$ NMR (CDCl$_3$, 282 MHz, 22° C.): δ −61.99 ppm.

Preparation of 4-nitro-2-chlorophenanthridine (1d)

A 500 mL Teflon-stoppered flask was charged with Pd(PPh$_3$)$_4$ (0.39 g, 0.34 mmol), and 50 mL of DME. After stirring briefly to mix, 2-iodo-6-nitro-4-chloroaniline (2.0 g, 6.7 mmol), 2-formylphenylboronic acid (1.11 g, 7.37 mmol) and an additional 70 mL of DME were added, followed by Na$_2$CO$_3$ (2.13 g, 20.1 mmol) dissolved in 100 mL of degassed water. The flask was then sealed and the mixture stirred vigorously for 12 h in an oil bath (130° C.). The flask was then allowed to cool and pumped to dryness. The residue was then taken up in dichloromethane (100 mL) and filtered through celite and subsequently washed with brine (3×100 mL). The organic layer was separated, dried over Na$_2$SO$_4$ and volatiles removed leaving a brown solid. Isolated yield=1.12 g (65%). $^1$H NMR (CDCl$_3$, 300 MHz, 25° C.): δ 9.37 (s, 1H, $C_{Ar}H$), 8.70 (d, 1H, $J_{HH}$=2.2 Hz, $C_{Ar}H$), 8.55 (dd, 1H, $J_{HH}$=8.4, 1.0 Hz, $C_{Ar}H$), 8.14 (dd, 1H, $J_{HH}$=7.9, 1.5 Hz, $C_{Ar}H$), 8.05-7.96 (m, 1H, $C_{Ar}H$), 7.95 (d, 1H, $J_{HH}$=2.2 Hz, $C_{Ar}H$), 7.87 ppm (ddd, $J_{HH}$=8.1, 7.2, 1.1 Hz, 1H, $C_{Ar}H$). $^{13}C\{^1H\}$ NMR (CDCl$_3$, 75 MHz, 25° C.): δ 156.1 ($C_{Ar}$), 149.7 ($C_{Ar}$), 134.5 ($C_{Ar}$), 132.6 ($C_{Ar}$), 132.3 ($C_{Ar}$), 132.1 ($C_{Ar}$), 130.5 ($C_{Ar}$), 129.7 ($C_{Ar}$), 129.5 ($C_{Ar}$), 126.8 ($C_{Ar}$), 125.4 ($C_{Ar}$), 122.9 ($C_{Ar}$), 122.3 ppm (CA).

Preparation of 4-amino-2-tert-butylphenanthridine (1e)

To a stirred solution of 4-nitro-2-tert-butylphenanthridine (4.50 g, 16.1 mmol) in methanol (100 mL), Zn dust (2.10 g, 32.2 mmol), and hydrazinium monoformate solution (54 mL; prepared by slowly neutralizing equal molar amounts of hydrazine hydrate (50 mL) with 85% formic acid (4 mL) in an ice-water bath) were added, and stirred vigorously at 60° C. The resulting green suspension was cooled and filtered using celite. The filtrate was pumped dry, the residue dissolved in dichloromethane (100 mL), and washed with brine (3×60 mL). The organic layer was separated, dried over Na$_2$SO$_4$ and dried to leave a green-brown solid, which was purified using column chromatography (silica, R$_f$=0.29; 20% EtOAc/hexane). Isolated yield=3.74 g (86%). $^1$H NMR (CDCl$_3$, 300 MHz, 25° C.): δ 9.10 (s, 1H, $C_{Ar}H$), 8.61 (dd, 1H, $J_{HH}$=8.5, 1.1 Hz, $C_{Ar}H$), 8.00 (dd, 1H, $J_{HH}$=7.9, 1.5 Hz, $C_{Ar}H$), 7.93 (d, 1H, $J_{HH}$=1.9, $C_{Ar}H$), 7.81 (app td, 1H, $J_{HH}$=8.4, 7.0, 1.4 Hz, $C_{Ar}H$), 7.65 (app dt, 1H, $J_{HH}$=8.0, 7.0, 1.1 Hz, $C_{Ar}H$), 7.14 (d, 1H, $J_{HH}$=1.9 Hz, $C_{Ar}H$), 5.01 (s, 2H, NH 2), 1.48 ppm (s, 9H, tBu). $^{13}C\{^1H\}$ NMR (CDCl$_3$, 75 MHz, 25° C.): δ 150.9 ($C_{Ar}$), 149.8 ($C_{Ar}$), 144.3 ($C_{Ar}$), 133.1 ($C_{Ar}$), 132.1 ($C_{Ar}$), 130.5 ($C_{Ar}$), 128.7 ($C_{Ar}$), 127.1 ($C_{Ar}$), 126.9 ($C_{Ar}$), 124.2 ($C_{Ar}$), 122.4 ($C_{Ar}$), 110.1 ($C_{Ar}$), 107.1 ($C_{Ar}$), 35.3 (CC Me), 31.6 ppm (CH 3).

Preparation of 4-amino-(2-trifluoromethyl)phenanthridine (1f)

An identical procedure to the synthesis of 1e was employed, using 4-nitro-2-trifluoromethylphenanthridine (6.02 g, 20.5 mmol), Zn dust (2.68 g, 41.1 mmol), and hydrazinium monoformate solution (54 mL; prepared by slowly neutralizing equal molar amounts of hydrazine hydrate (50 mL) with 85% formic acid (4 mL) in an ice-water bath). Column chromatography on neutral alumina gave a pale-yellow solid (R$_f$=0.43; 1:5 EtOAc/hexane). Isolated yield=3.74 g (86%). $^1$H NMR (CDCl$_3$, 300 MHz, 22° C.): δ 9.15 (s, 1H; $C_{Ar}H$), 8.50 (d, 1H, $J_{HH}$=8.3; $C_{Ar}H$), 8.07 (s, 1H; $C_{Ar}H$), 8.01 (dd, 1H, $J_{HH}$=8.0, 1.3 Hz; $C_{Ar}H$), 7.83 (app t, 1H, $J_{HH}$=8.4, 7.0 Hz; $C_{Ar}H$), 7.70 (app t, 1H, $J_{HH}$=8.1, 7.0; $C_{Ar}H$), 7.13 (d, 1H, $J_{HH}$=1.8 Hz; $C_{Ar}H$), 5.22 ppm (br s, 2H; NH). $^{13}C\{^1H\}$ NMR (CDCl$_3$, 75 MHz, 22° C.): δ 152.2 ($C_{Ar}$), 145.6 ($C_{Ar}$), 134.5 ($C_{Ar}$), 132.7 ($C_{Ar}$), 131.3 (q, $C_{Ar}$), 128.9 ($C_{Ar}$), 128.1 ($C_{Ar}$), 126.9 ($C_{Ar}$), 124.3 ($C_{Ar}$), 122.5 ($C_{Ar}$), 107.1 (q, $C_{Ar}$), 106.7 ppm (q, $C_{Ar}$). $^{19}F\{^1H\}$ NMR (CDCl$_3$, 282 MHz, 22° C.): δ −62.28 ppm.

Preparation of 4-amino-2-chlorophenanthridine (1g)

To a stirred solution of 4-nitro-2-chlorophenanthridine (0.12 g, 0.47 mmol) in methanol (20 mL), Zn dust (0.06 g, 0.94 mmol), and hydrazinium monoformate solution (1.2 mL; prepared by slowly neutralizing equal molar amounts of hydrazine hydrate (1.1 mL) with 85% formic acid (0.09 mL) in an ice-water bath) were added, and stirred vigorously at 60° C. The resulting green suspension was cooled and filtered using celite. The filtrate was pumped dry, the residue dissolved in dichloromethane (30 mL), and washed with brine (3×20 mL). The organic layer was separated, dried over Na$_2$SO$_4$ and dried to leave a green-brown solid. Isolated yield=0.081 g (76%). $^1$H NMR (CDCl$_3$, 300 MHz, 25° C.): δ 9.07 (s, 1H, $C_{Ar}H$), 8.42 (d, 1H, $J_{HH}$=8.2 Hz; $C_{Ar}H$), 8.00 (dd, 1H, $J_{HH}$=7.9, 1.4 Hz, $C_{Ar}H$), 7.86-7.76 (m, 2H, $C_{Ar}H$), 7.73-7.61 (m, 1H $C_{Ar}H$), 6.94 (t, 1H, $J_{HH}$=2.9 Hz, $C_{Ar}H$), 5.01 ppm (s, 2H, NH$_2$). $^{13}C\{^1H\}$ NMR (CDCl$_3$, 75 MHz, 25° C.): δ 150.3 ($C_{Ar}$), 146.0 ($C_{Ar}$), 133.8 ($C_{Ar}$), 132.0 ($C_{Ar}$), 131.9 ($C_{Ar}$), 131.0 ($C_{Ar}$), 128.7 ($C_{Ar}$), 127.9 ($C_{Ar}$), 127.0 ($C_{Ar}$), 125.7 ($C_{Ar}$), 122.5 ($C_{Ar}$), 111.2 ($C_{Ar}$), 110.2 ppm ($C_{Ar}$).

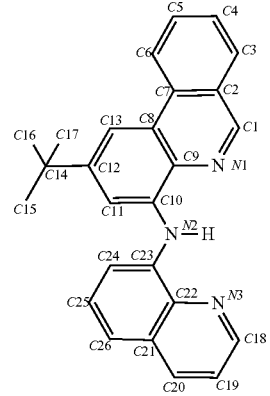

(2a)

Synthesis of $^{tBu-Phen}$NN(H)N$^{Quin}$

Figure 3:
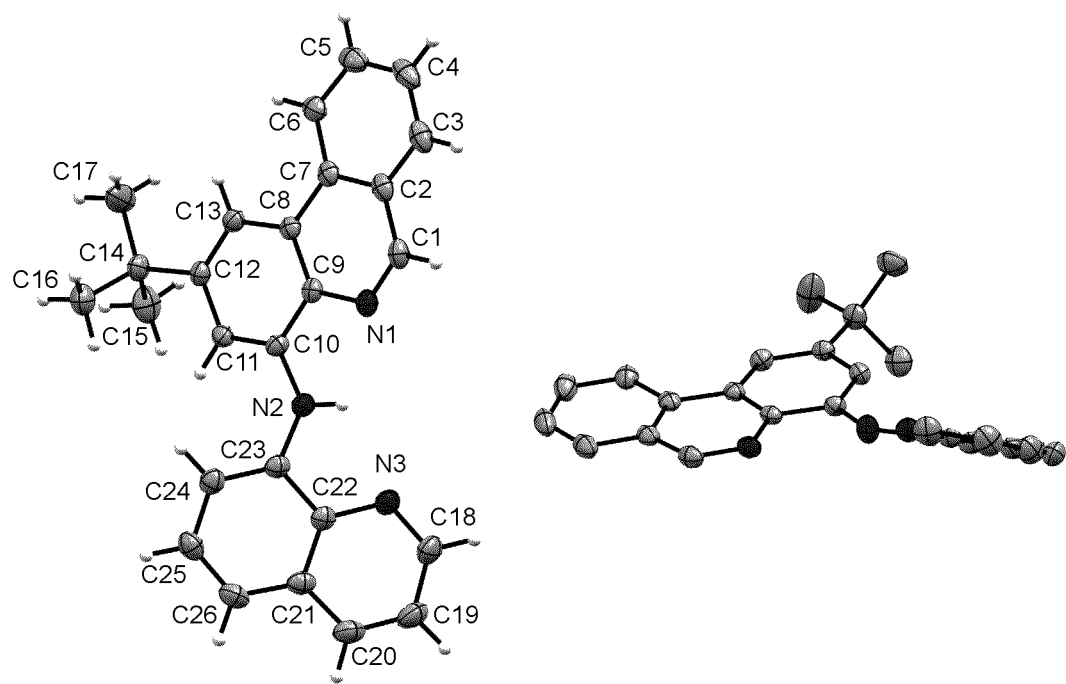
FIG. 3 shows an example of a solid-state structure of proligand 2a with thermal ellipsoids shown at 50% probability levels.

A 500 mL Teflon-stoppered flask was charged with Pd 2 (dba) 3 (0.26 g, 0.30 mmol), rac-BINAP (0.42 g, 0.70 mmol) and toluene (30 mL). After stirring for 5 min, 8-bromoquinoline (2.00 g, 10.1 mmol), 1c (2.50 g, 10.1 mmol), and an additional 20 mL of toluene were added, followed by sodium tert-butoxide (NaO$^t$Bu; 1.40 g, 15.1 mmol). The reaction mixture was stirred and subject to reflux in an oil bath at 150° C. for 72 h. After cooling the flask, the volatiles were removed and the residue was taken up in dichloromethane. The suspension was then filtered over a silica plug and the solvent was removed to leave a brown solid. Isolated yield=3.80 g (>99%). $^1$H NMR (CDCl$_3$, 300 MHz, 25° C.): δ 10.53 (s, 1H, N$_2$—H), 9.29 (s, 1H, C$_1$—H), 8.98 (dd, 1H, J$_{HH}$=4.2, 1.7 Hz, C$_{18}$—H), 8.68 (d, 1H, J$_{HH}$=8.4 Hz, C$_3$—H), 8.21-8.04 (m, 4H, C$_6$—H, C$_{13}$—H, C$_{20}$—H, C$_{26}$—H), 7.90-7.84 (m, 2H, C$_{11}$—H, C$_{25}$—H), 7.71 (ddd, 1H, J$_{HH}$=8.0, 7.0 1.1 Hz, C$_4$—H), 7.55 (t, 1H, C$_5$—H), 7.47 (dd, 1H, J$_{HH}$=8.2, 4.2 Hz, C$_{15}$—H), 7.32 (dd, 1H, J$_{HH}$=8.2, 1.2 Hz, C$_{24}$—H), 1.55 ppm (s, 9H, $^t$Bu). $^1$H NMR (C$_6$D$_6$, 500 MHz, 25° C.): δ 11.58 (s, 1H, N$_2$—H), 9.10 (s, 1H, C$_1$—H), 8.73 (dd, 1H, J$_{HH}$=4.3, 1.6 Hz, C$_{18}$—H), 8.40 (d, 1H, J$_{HH}$=8.3 Hz, C$_3$—H), 8.32 (s, 1H, C$_{13}$—H), 8.12-8.05 (m, 2H, C$_{11}$—H, C$_{26}$—H), 7.59 (dd, 1H, J$_{HH}$=8.2, 1.6 Hz, C$_{20}$—H), 7.44 (d, 1H, J$_{HH}$=7.9 Hz, C$_6$—H), 7.39 (m, 2H, C$_4$—H, C$_{25}$—H), 7.20 (t, 1H, J$_{HH}$=7.4 Hz, C$_5$—H), 7.06 (d, 1H, J$_{HH}$=8.2 Hz, C$_{24}$—H), 6.83 (dd, 1H, J$_{HH}$=8.2, 4.1 Hz, C$_{15}$—H), 1.46 ppm (s, 9H, $^t$Bu). $^{13}$C{$^1$H} NMR (CDCl$_3$, 75 MHz, 25° C.): δ 150.6 (C$_1$), 150.5 (C$_{12}$), 148.1 (C$_{18}$), 140.2 (C$_{21, 22\text{ or }23}$), 139.5 (C$_{10\text{ or }23}$), 139.2 (C$_{10\text{ or }23}$), 134.0 (C$_{20}$), 133.1 (C$_{7\text{ or }8}$), 130.7 (C$_{8\text{ or }9}$), 129.2 (C$_4$), 129.1 (C$_{21, 22\text{ or }23}$), 128.9 (C$_5$), 128.3 (C$_{25}$), 127.3 (C$_{2\text{ or }7}$), 127.3 (C$_5$), 124.3 (C$_{2\text{ or }7}$), 122.3 (C$_3$), 121.7 (C$_{15}$), 117.5 (C$_{24}$), 110.6 (C$_{13}$), 109.2 (C$_{11}$), 108.9 (C$_{26}$), 35.7 (C$_{14}$), 31.7 ppm (C$_{15, 16, 17}$). $^{13}$C{$^1$H} NMR (C$_6$D$_6$, 125 MHz, 25° C.): δ 150.5 (C$_1$), 150.5 (C$_{12}$), 148.0 (C$_{18}$), 140.8 (C$_{21, 22\text{ or }23}$), 140.2 (C$_{10\text{ or }23}$), 140.0 (C$_{10\text{ or }23}$), 135.9 (C$_{20}$), 134.6 (C$_{7\text{ or }8}$), 133.3 (C$_{8\text{ or }9}$), 130.5 (C$_4$), 129.5 (C$_{21, 22, \text{ or }23}$), 129.0 (C$_6$), 127.5 (C$_{25}$), 127.3 (C$_{2\text{ or }7}$), 127.1 (C$_5$), 124.7 (C$_{2\text{ or }7}$), 122.4 (C$_3$), 121.8 (C$_{15}$), 117.6 (C$_{24}$), 110.3 (C$_{13}$), 109.3 (C$_{11}$), 108.9 (C$_{26}$), 35.6 (C$_{14}$), 31.7 ppm (C$_{15, 16, 17}$). UV-Vis (CH$_3$CN): λ (ε) 306 (9 680), 388 nm (12 270 M$^{-1}$cm$^{-1}$). The formation of 2a was also confirmed by the single-crystal X-ray diffraction in FIG. 3.

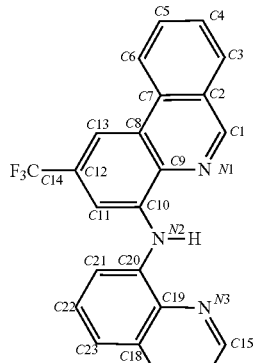

(2b)

Synthesis of $^{CF3\text{-}Phen}$NN(H)N$^{Quin}$

A 500 mL Teflon-stoppered flask was charged with Pd(OAc)$_2$ (0.040 g, 0.18 mmol), dppf (0.057 g, 0.20 mmol) and toluene (30 mL). After stirring for 5 minutes, 1 b (1.0 g, 3.1 mmol), 8-aminoquinoline (0.42 g, 2.9 mmol), and an additional 20 mL of toluene were added, followed by sodium tert-pentoxide (NaO$^t$Pent; 0.48 g, 4.4 mmol). The reaction mixture was stirred and subjected to reflux in an oil bath set at 150° C. for 72 h. After cooling the flask, the volatiles were removed and the residue was taken up in dichloromethane. The suspension was then filtered over a silica plug and the solvent was removed to leave a brown solid. Isolated yield=0.742 g (66%). $^1$H NMR (CDCl$_3$, 500 MHz, 25° C.): δ 10.80 (s, 1H, N—H), 9.38 (s, 1H, C$_1$—H), 8.98 (dd, 1H, J$_{HH}$=4.2, 1.7 Hz, C$_{15}$—H), 8.58 (d, 1H, J$_{HH}$=7.5 Hz, C$_3$—H), 8.27 (s, 1H, C$_{13}$—H), 8.16 (dd, 1H, J$_{HH}$=8.3, 1.7 Hz, C$_{17}$—H), 8.10 (m, 2H, C$_{11}$—H, C$_{23}$—H), 7.89 (m, 2H, C$_4$—H, C$_6$—H), 7.75 (td, 1H, J$_{HH}$=7.5, 6.9, 1.0 Hz C$_{22}$—H), 7.57 (t, 1H, J$_{HH}$=8.0 Hz, C$_5$—H), 7.48 (dd, 1H, J$_{HH}$=8.2, 4.2 Hz, C$_{16}$—H), 7.39 ppm (dd, 1H, J$_{HH}$=8.2, 1.1 Hz, C$_{21}$—H). $^{13}$C{$^1$H} NMR (CDCl$_3$, 125 MHz, 25° C.): 152.9 (C$_1$), 148.4 (C$_{15}$), 140.6 (C$_{10}$), 140.3 (C$_{20}$), 138.2 (C$_{2\text{ or }7}$), 136.3 (C$_{17}$), 136.3 (C$_{14}$), 132.8 (C$_{2\text{ or }7}$), 131.6 (C$_4$), 129.1 (C$_{18\text{ or }19}$), 129.1 (C$_{23}$), 128.3 (C$_{22}$), 127.2 (C$_5$), 127.0 (C$_{18\text{ or }19}$), 125.8 (C$_{8\text{ or }9}$), 124.4 (C$_{12}$), 123.7 (C$_{8\text{ or }9}$), 122.5 (C$_3$), 121.9 (C$_{16}$), 119.0 (C$_{21}$), 110.8 (C$_6$), 109.6 (q, C$_{13}$), 105.9 ppm (q, C$_{11}$). $^{19}$F{$^1$H} NMR (CDCl$_3$, 470 MHz, 25° C.): δ −62.2 ppm. UV-Vis (CH$_3$CN): λ (ε) 305 (7 070), 379 nm (12 090 M$^{-1}$cm$^{-1}$).

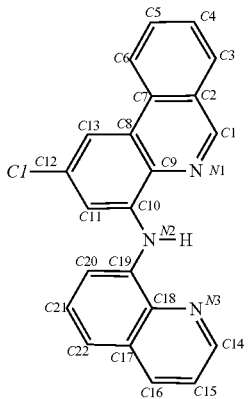

(2c)

Synthesis of $^{Cl\text{-}Phen}$NN(H)N$^{Quin}$

A 500 mL Teflon-stoppered flask was charged with Pd$_2$(dba)$_3$ (0.12 g, 0.13 mmol), DPPF (0.17 g, 0.31 mmol) and toluene (30 mL). After stirring for 5 minutes, 8-bromoquinoline (0.91 g, 4.4 mmol), 4-amino-2-chlorophenanthridine (1.0 g, 4.4 mmol), and an additional 10 mL of toluene were added, followed by sodium tert-butoxide (NaO$^t$Bu; 0.63 g, 6.6 mmol). The reaction mixture was stirred and subject to reflux in an oil bath at 150° C. for 24 h. After cooling the flask, the volatiles were removed and the residue was taken up in dichloromethane. The suspension was then filtered over a silica plug and the solvent was removed to leave a brown solid. Isolated yield=1.40 g (90%). $^1$H NMR (CDCl$_3$, 500 MHz, 25° C.): δ 10.75 (s, 1H, N$_2$—H), 9.27 (s, 1H, C$_1$—H), 8.97 (d, 1H, J$_{HH}$=4.3 Hz, C$_{14}$—H), 8.46 (d, 1H, J$_{HH}$=8.3 Hz, C$_3$—H), 8.15 (dd, 1H, J$_{HH}$=8.2, 1.7 Hz, C$_{16}$—H), 8.05 (dd, 1H, J$_{HH}$=7.9, 1.3 Hz, C$_6$—H), 7.95 (d, 1H, J$_{HH}$=2.1 Hz, C$_{13}$—H), 7.90-7.87 (m, 2H, C$_{11}$—H, C$_{22}$—H), 7.82 (ddd, 1H, J$_{HH}$=8.3, 7.0, 1.3 Hz, C$_4$—H,), 7.70 (ddd, 1H, J$_{HH}$=8.0, 7.0, 1.1 Hz, C$_5$—H), 7.55 (t, 1H, J$_{HH}$=7.9 Hz, C$_{21}$—H), 7.47 (dd, 1H, J$_{HH}$=8.2, 4.2 Hz, C$_{15}$—H), 7.37 ppm (dd, 1H, J$_{HH}$=8.2, 1.1 Hz, C$_{20}$—H). $^{13}$C{$^1$H} NMR (CDCl$_3$, 125 MHz, 25° C.): δ 150.9 (C$_1$), 148.4 (C$_{14}$), 140.8 (C$_{19}$), 140.2 (C$_{10}$) 138.2 (C$_{17\text{ or }18}$), 136.3 (C$_{16}$), 133.9 (C$_9$), 133.6 (C$_8$), 132.0 (C$_{2\text{ or }7}$), 131.1 (C$_4$), 129.1 (C$_{17\text{ or }18}$), 128.9 (C$_6$), 128.0 (C$_5$), 127.2 (C$_{21}$), 127.1 (C$_{12}$), 125.7 (C$_{2\text{ or }7}$), 122.5 (C$_3$), 121.8 (C$_{15}$), 118.8 (C$_{29}$), 111.8 (C$_{13}$), 110.9 (C$_{11\text{ or }22}$), 110.7 ppm (C$_{11\text{ or }22}$).

Synthesis of $^{CF3\text{-}Phen}$NN(H)N$^{CF3\text{-}Phen}$(2m)

A thick-walled, 100 mL Teflon-stoppered flask was charged with Pd(OAc)$_2$ (0.02 g, 0.09 mmol), dppf (0.072 g, 0.13 mmol) and toluene (30 mL). After stirring briefly, 4-bromo-trifluoromethylphenanthridine (0.65 g, 2.0 mmol) and 4-amino-2-trifluoromethyl-phenanthridine (0.53 g, 2.3 mmol) were added, along with an additional 30 mL of toluene, followed by NaOtPen (0.29 g, 2.8 mmol). The sealed flask was then stirred vigorously for 72 h in an oil bath set to 150° C. After cooling and removing the volatiles, the residue was taken up in $CH_2Cl_2$ (120 mL) with the resulting suspension filtered over Celite and dried. Following column chromatography gave a yellow-green solid (neutral alumina; 1:5 EtOAc/hexane; $R_f$=0.2). Isolated yield=0.76 g (74%). $^1$H NMR ($CDCl_3$, 500 MHz, 22° C.): δ 10.91 (br s, 1H, N—H), 9.42 (s, 2H, $C_{Ar}$H), 8.63 (d, 2H, $J_{HH}$=8.1 Hz, $C_{Ar}$H), 8.34 (s, 2H, $C_{Ar}$H), 8.20-8.08 (overlapped m, 4H, $C_{Ar}$H), 7.94 (app t, $J_{HH}$=7.4 Hz, 2H, $C_{Ar}$H), 7.83 ppm (app t, 2H, $J_{HH}$=7.3 Hz, $C_{Ar}$H). $^{13}$C{$^1$H} NMR ($CDCl_3$, 125 MHz, 22° C.): δ 153.3 ($C_{Ar}$), 140.0 ($C_{Ar}$), 136.5 ($C_{Ar}$), 132.8 ($C_{Ar}$), 131.8 ($C_{Ar}$), 129.2 ($C_{Ar}$), 129.2 ($C_{Ar}$), 128.5 ($C_{Ar}$), 128.4 ($C_{Ar}$), 127.1 ($C_{Ar}$), 124.7 ($C_{Ar}$), 122.6 ($C_{Ar}$), 110.7 ($C_{Ar}$), 106.7 ppm ($C_{Ar}$). $^{19}$F{$^1$H} NMR ($CDCl_3$, 470 MHz): δ −62.45 ppm.

Addition of base to solutions of any of proligand 2a-d produced a deep purple color, which changed to green upon addition of ferrous iron and 3a-d were isolated as dark green solids following recrystallization. One-electron oxidized species [3a-d]$^+$ could in turn be isolated as $PF_6^-$ salts via oxidation in ambient air or another appropriate oxidant in the presence of $NaPF_6$, or synthesized directly via metallation of 2a-c with $FeCl_3 \cdot 6H_2O$ as follows:

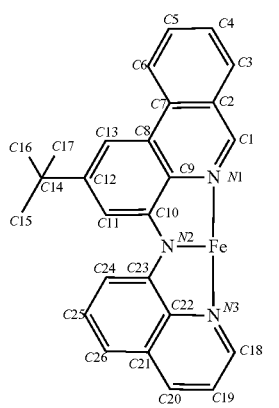

Synthesis of Fe($^{tBu-Phen}$NNN$^{Quin}$)$_2$ (3a)

Fe(OTf)$_2$ (0.020 g. 0.06 mmol), 2a (0.047 g, 0.12 mmol), NaO$^t$Bu (0.010 g, 0.13 mmol) were combined in a 20 mL scintillation vial and dissolved in THF (10 mL). The purple solution was stirred under inert conditions for 72 h over which time the solution turned a deep green. The solvent was removed and the product was washed with pentane (3×10 mL), and extracted with toluene. Isolated yield=0.039 g (78%). $^1$H NMR ($C_6D_6$, 300 MHz, 25° C.): δ 8.86 (s, 2H, $C_{13}$—H), 8.63, (d, 2H, $J_{HH}$=8.0 Hz, $C_{26}$—H), 8.54 (s, 2H, $C_1$—H), 8.06 (m, 4H, $C_3$—H, $C_{18}$—H), 7.73 (s, 2H, $C_{11}$—H), 7.62 (t, 2H, $J_{HH}$=8.0 Hz, $C_{25}$—H), 6.95 (m, 4H, $C_4$—H, $C_{29}$—H), 6.72 (d, 2H, $J_{HH}$=8.0 Hz, $C_{24}$—H), 6.63 (t, 2H, $J_{HH}$=7.5 Hz, $C_5$—H), 6.43 (d, 2H, $J_{HH}$=8.1 Hz, $C_6$—H), 5.85 (dd, 2H, $J_{HH}$=8.2, 4.9 Hz, $C_{19}$—H), 1.68 ppm (s, 18H, $^t$Bu). $^{13}$C{$^1$H} NMR ($C_6D_6$, 125 MHz, 25° C.): 153.1 ($C_{23}$), 152.6 ($C_1$), 151.1 ($C_{12}$), 149.9 ($C_{18}$), 145.0 ($C_{10}$), 132.3 ($C_4$), 131.8 ($C_9$), 131.3 ($C_{21\ or\ 22}$), 128.9 ($C_{20}$), 128.7 ($C_{25}$), 126.9 ($C_5$), 126.8 ($C_6$), 125.5 ($C_{2,\ 7\ or\ 8}$), 122.1 ($C_3$), 121.7 ($C_{19}$), 112.8 ($C_{26}$), 112.6 ($C_{24}$), 112.1 ($C_{13}$), 105.8 ($C_{11}$), 35.8 ($C_{14}$), 32.2 ppm ($C_{15,\ 16,\ 17}$); note: 3 peaks are not observed due to solvent overlap ($C_{2,\ 7,\ 8,\ 21,\ or\ 22}$). UV-Vis ($CH_3CN$): λ (ε) 262 (64 890), 319 (sh), 454 (26 030), 596 nm (17 990), 724 (8 510 M$^{-1}$cm$^{-1}$). Anal. Calcd for FeC$_{52}$H$_{44}$N$_6$: C, 77.48; H, 5.96. Found: C, 77.28; H, 6.11.

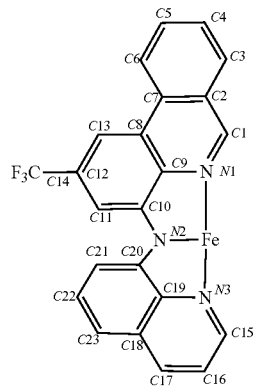

Synthesis of Fe($^{CF3-Phen}$NNN$^{Quin}$)$_2$ (3b)

Fe(OTf)$_2$ (0.013 g. 0.040 mmol), 2b (0.030 g, 0.077 mmol), NaO$^t$Bu (0.007 g, 0.08 mmol) were combined in a 20 mL scintillation vial and dissolved in THF (10 mL). The purple solution was stirred under inert conditions for 72 h over which time the solution turned a deep green. The solvent was removed and the product was washed with pentane (3×10 mL), and extracted with THF. Isolated yield=0.021 g (67%). $^1$H NMR ($C_6D_6$, 500 MHz, 25° C.): δ 8.96 (s, 2H, $C_{13}$—H), 8.52 (d, 2H, $J_{HH}$=8.0 Hz, $C_{23}$—H), 8.44 (s, 2H, $C_1$—H), 7.97 (dd, 2H, $J_{HH}$=5.0, 1.4 Hz, $C_{15}$—H), 7.81 (s, 2H, $C_{11}$—H), 7.54 (d, 2H, $J_{HH}$=8.3 Hz, $C_3$—H), 7.41 (t, 2H, $J_{HH}$=8.0 Hz, $C_{22}$—H), 6.92 (m, 2H, $C_{17}$—H), 6.82 (t, 2H, $J_{HH}$=7.4 Hz $C_4$—H), 6.76 (d, 2H, $J_{HH}$=8.0 Hz, $C_{21}$—H), 6.57 (t, 2H, $J_{HH}$=7.5 Hz $C_5$—H), 6.40 (d, 2H, $J_{HH}$=8.1 Hz, $C_6$—H), 5.90 ppm (dd, 2H, $J_{HH}$=8.2, 5.0 Hz, $C_{16}$—H). $^{13}$C {$^1$H} NMR ($C_6D_6$, 125 MHz): 154.4 ($C_1$), 153.7 ($C_{14}$), 152.3 ($C_{20}$), 151.9 ($C^{19}$), 150.4 ($C_{15}$), 147.3 ($C_{10}$), 133.1 ($C_{17}$), 131.2 ($C_7$), 131.0 (CO, 129.8 ($C_4$), 128.9 ($C_{22}$), 126.7 ($C_6$), 126.4 ($C_{2,\ 8,\ 9\ or\ 12}$), 125.7 ($C_{2,\ 8,\ 9,\ or\ 12}$), 122.4 ($C_3$), 121.8 ($C_{16}$), 114.7 ($C_{21}$), 114.0 ($C_{23}$), 108.7 ($C_{13}$), 105.6 ppm ($C_{11}$); note: 3 peaks are missing due to solvent overlap ($C_{2,\ 5,\ 8,\ 9\ or\ 12}$). $^{19}$F {$^1$H} NMR ($CDCl_3$, 470 MHz, 25° C.): δ −61.3 ppm. UV-Vis ($CH_3CN$): λ (ε) 259 (74 180), 319 (sh), 448 (29 300), 596 nm (17 800), 728 (9 370

$M^{-1}cm^{-1}$). Anal. Calcd for $FeC_{46}H_{26}N_6F_6$: C, 66.36; H, 3.15.

Found: C, 66.25; H, 3.32.

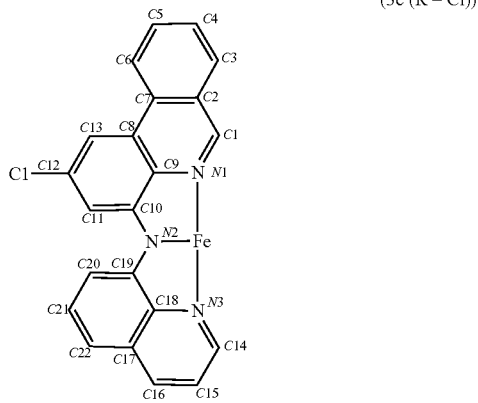

(3c (R = Cl))

Synthesis of $Fe(^{Cl\text{-}Phen}NNN^{Quin})_2$ $Fe(OTf)_2$ (0.025 g, 0.071 mmol), 2c (0.050 g, 0.14 mmol), NaO$^t$Bu (0.014 g, 0.14 mmol), and THF (10 mL). The purple solution was stirred under inert conditions for 48 h over which time the solution turned a deep green. The solvent was removed and the product was washed with pentane (3×10 mL), and extracted with toluene. Isolated yield=0.045 g (84%). $^1$H NMR ($C_6D_6$, 300 MHz, 25° C.): δ 8.66 (s, 2H, $J_{HH}$=2.0 Hz, $C_{13}$—H), 8.37, (s, 2H, $C_1$—H), 8.32 (d, 2H, $J_{HH}$=8.0 Hz, $C_{22}$—H), 7.97 (dd, 2H, $J_{HH}$=4.9, 1.4 Hz, $C_{14}$—H), 7.55 (s, 2H, $C_{11}$—H), 7.51 (t, 2H, $J_{HH}$=8.2 Hz, $C_6$—H), 7.41 (t, 2H, $J_{HH}$=8.0 Hz, $C_{21}$—H), 6.93 (dd, 2H, $J_{HH}$=8.2, 1.4 Hz, $C_{16}$—H), 6.81 (ddd, 2H, $J_{HH}$=8.3, 6.9, 1.3 Hz, $C_5$—H), 6.75 (d, 2H, $J_{HH}$=8.0 Hz, $C_{20}$—H), 6.57 (t, 2H, $J_{HH}$=7.5 Hz, $C_4$—H), 6.43 (d, 2H, $J_{HH}$=8.1 Hz, $C_3$—H), 5.94 (dd, 2H, $J_{HH}$=8.2, 5.0 Hz, $C_{15}$—H). $^{13}$C{$^1$H} NMR ($C_6D_6$, 125 MHz, 25° C.): 153.8 ($C_{10}$), 152.8 ($C_1$), 152.4 ($C_{12}$), 151.9 ($C_{19}$), 150.3 ($C_{10}$), 145.0 (CO, 136.1 ($C_8$), 132.8 ($C_{16}$), 130.9 ($C_{18}$), 130.5 ($C_7$), 129.4 ($C_5$), 128.7 ($C_2$), 128.6 ($C_{21}$), 127.6 ($C_4$), 126.8 ($C_{17}$), 126.6 ($C_3$), 122.4 ($C_6$), 121.8 ($C_{15}$), 114.4 ($C_{20}$), 113.9 ($C_{22}$), 113.87 ($C_{13}$), 108.3 ppm ($C_{11}$). UV-Vis ($CH_3CN$): λ (ε) 318 (sh), 445 (23 830), 592 (15 340), 703 nm (8 210 $M^{-1}cm^{-1}$).

Synthesis of [Fe($^{tBu\text{-}Phen}$NNN$^{Quin}$)$_2$][PF$_6$] ([3a][PF$_6$])

A 250 mL round-bottom flask was charged with $FeCl_3 \cdot 6H_2O$ (0.052 g, 0.19 mmol), 2a (0.15 g, 0.40 mmol), NaPF$_6$ (0.033 g, 0.19 mmol), and NaO$^t$Bu (0.038 g, 0.40 mmol). MeOH (50 mL) was added and the flask was stirred and refluxed at 100° C. overnight. The flask was then cooled to room temperature and stirred for 1 h where a brown precipitate formed. The mixture was then filtered over Celite and extracted with dichloromethane. The filtrate was concentrated and placed in the freezer overnight. The resulting precipitate was subject to the same treatment. Isolated yield=0.135 g (73%). $^1$H NMR (CDCl$_3$, 300 MHz, 25° C.): δ 30.5 (br), 20.1 (br), 11.2 (s), 10.4 (s), 3.00 (s), −10.0 (br), −30.6 (br), −32.3 (br), −49.3 (br), −54.8 (br), −66.8 (v br), −68.8 ppm (v br). UV-Vis/NIR (CH$_3$CN): λ (ε) 311 (sh), 414, (22 810), 512, (12 430), 1024 nm (4 560 $M^{-1}cm^{-1}$). μ$_{eff}$ (Evans method)=1.66 B. Anal. Calcd for FeC$_{52}$H$_{44}$N$_6$PF$_6$: C, 65.48; H, 4.65. Found: C, 65.70; H, 4.79.

Synthesis of [Fe($^{CF3\text{-}Phen}$NNN$^{Quin}$)$_2$][PF$_6$] ([3b][PF$_6$])

A 250 mL round-bottom flask was charged with FeCl$_3 \cdot 6H_2O$ (0.070 g, 0.26 mmol), 2b (0.20 g, 0.52 mmol), NaPF$_6$ (0.043 g, 0.26 mmol), and NaO$^t$Bu (0.050 g, 0.52 mmol). MeOH (50 mL) was added and the flask was stirred and refluxed at 100° C. overnight. The flask was then cooled to room temperature and the solvent removed. The brown solid was dissolved in minimal CH$_2$Cl$_2$ and added slowly to 100 mL of pentane to precipitate the compound. The mixture was then filtered and the solid collected. Isolated yield=0.180 g (72%). $^1$H NMR (CDCl$_3$, 300 MHz, 25° C.): δ 29.0 (br), 19.3 (br), 11.1 (s), 10.6 (s), 3.1 (s), 2.9 (s), −8.9 (br), −29.6 (br), −31.9 (br), −49.9 (br), −56.5 (br), −61.4 (v br), −64.7 ppm (v br). $^{19}$F NMR (CDCl$_3$, 282 MHz, 25° C.): δ −70.6 (d, 6F, J=712.8 Hz, PF$_6$), −82.0 ppm (s, 3F, CF$_3$). UV-Vis (CH$_3$CN): λ (ε) 312 (sh), 412 (22 630), 505 (11 100), 996 nm (4 000 $M^{-1}cm^{-1}$). μ$_{eff}$(Evans method)=1.72μ$_B$. Anal. Calcd for FeC$_{46}$H$_{26}$N$_6$F$_{12}$P: C, 56.52; H, 2.68. Found: C, 56.57; H, 2.66.

Synthesis of [Fe($^{Cl\text{-}Phen}$NNN$^{Quin}$)$_2$][PF$_6$] ([3c]$^+$ (R=Cl))

A 250 mL round-bottom flask was charged with FeCl$_3 \cdot 6H_2O$ (0.019 g, 0.070 mmol), 2a (0.050 g, 0.14 mmol), NaPF$_6$ (0.012 g, 0.070 mmol), and NaO$^t$Bu (0.014 g, 0.14 mmol). MeOH (20 mL) was added and the flask was stirred and refluxed at 100° C. overnight. The flask was then cooled to room temperature and the solvent removed. The brown solid was dissolved in minimal CH$_2$Cl$_2$ and added slowly to 100 mL of pentane to precipitate the compound. The mixture was then filtered and the solid collected. Isolated yield=0.055 g (86%). $^1$H NMR (CDCl$_3$, 300 MHz, 25° C.): δ 29.2 (br), 19.5 (br), 11.0 (s), 10.6 (s), 2.8 (s), 2.7 (s), −9.1 (br), −29.8 (br), −33.7 (br), −50.5 (br), −56.9 (v br), −61.9 (v br), −65.5 ppm (v br). UV-Vis/NIR (CH$_3$CN): λ (ε) 312 (sh), 410, (19 230), 495, (11 310), 1004 nm (3 340 $M^{-1}cm^{-1}$).

Synthesis of [Fe($^{CF3\text{-}Phen}$NNN$^{CF3\text{-}Phen}$)$_2$][PF$_6$] ([3m][PF$_6$])

A 250 mL round-bottom flask was charged with FeCl$_3 \cdot 6H_2O$ (0.032 g, 0.12 mmol), 2m (0.12 g, 0.24 mmol), NaPF$_6$ (0.020 g, 0.12 mmol), and NaO$^t$Bu (0.023 g, 0.24 mmol). MeOH (20 mL) was added and the flask was stirred and refluxed at 100° C. overnight. The flask was then cooled to room temperature and the solvent removed. The brown solid was dissolved in minimal fluorobenzene and added slowly to 100 mL of pentane to precipitate the compound. The mixture was then filtered and the solid collected. Isolated yield=0.09 g (63%). $^1$H NMR (CDCl$_3$, 300 MHz, 25° C.): δ 29.3 (br), 19.5 (br), 11.2 (s), 10.7 (s), 3.0 (s), 2.8 (s), −9.1 (br), −30.1 (br), −32.6 (br), −50.8 (br), −57.5 (br), −62.4 (v br), −65.7 ppm (v br). $^{19}$F NMR (CDCl$_3$, 282 MHz, 25° C.): δ −70.72 (d, 6F, J=713.2 Hz, PF$_6$), −83.2 ppm (s, 12F, CF$_3$).

Electrochemical Analysis

Figure 4:
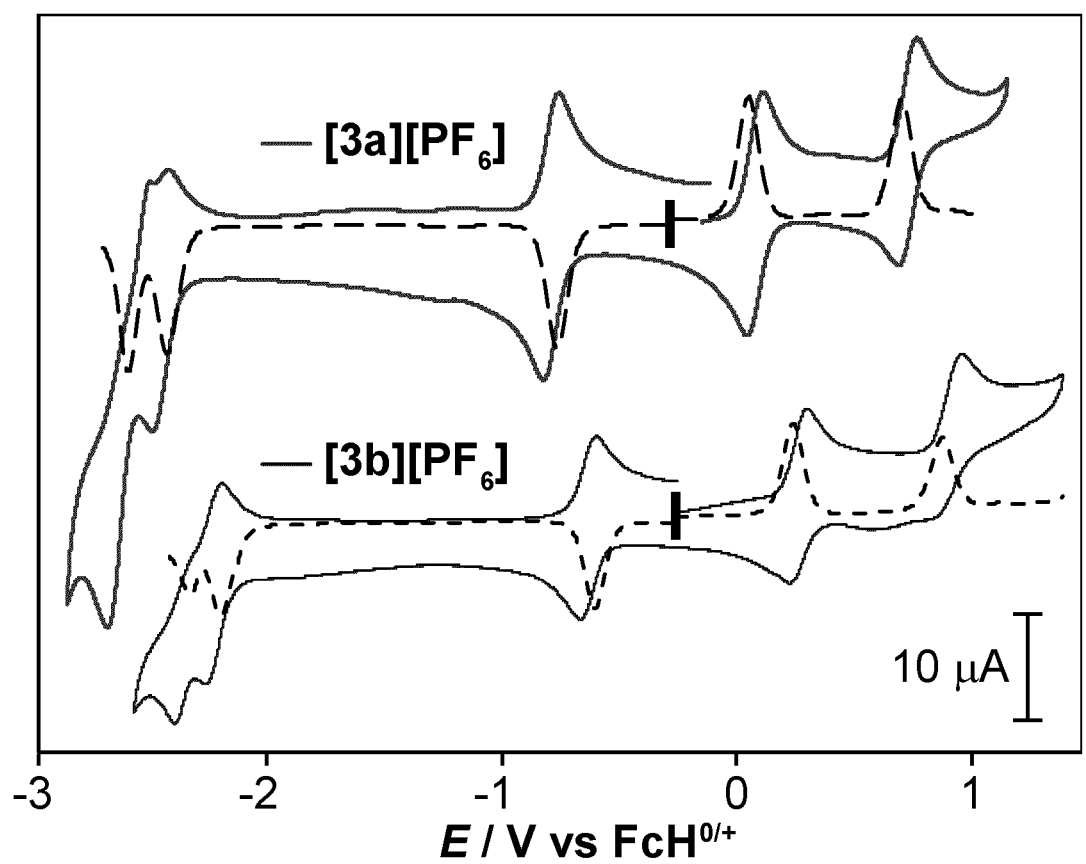
FIG. 4 shows examples of cyclic voltammograms (—) and differential pulse voltammograms (---) of [3a][PF$_6$] (top) and [3b][PF$_6$] (bottom) in CH$_3$CN with 0.10 M [nBu$_4$N][PF$_6$] as the supporting electrolyte, glassy carbon electrode. CV scan rates were 100 mV/s. Potentials are listed vs. the FcH$^{0/+}$ redox couple (FcH=ferrocene).

Voltammetric analysis of [3a-c][PF$_6$] revealed two additional (quasi) reversible oxidation events (FIG. 4, Table 1), and overlapping reductions below −2 V that may be phenanthridine-based, as similar cathodic events were not reported for the smaller π-system of Fe(BQA)$_2$ (Betley, T. A., Qian, B. A. & Peters, J. C. Group VIII Coordination chemistry of a pincer-type bis(8-quinolinyl)amido ligand. *Inorg. Chem.* 47, 11570-11582 (2008)).

TABLE 1

Redox potentials and electronic absorption spectral data for 2a-b, 3a-c and [3a-c][PF₆]

| Compound | $E_{1/2}$/V | $\Delta_{p/p}$/mV[a] | $i_{red}/i_{ox}$[b] | λ/nm (ε/M⁻¹ cm⁻¹) |
|---|---|---|---|---|
| 2a | — | — | — | 306 (9 680), 388 (12 270) |
| 2b | — | — | — | 305 (7 070), 379 (12 090) |
| 3a/[3a][PF₆] | −2.59[c] | — | — | 3a: 262 (64 890), 319 (sh), 454 |
|  | −2.43 | 46 | 1.02 | (26 030), 596 (17 990), 724 (8 510) |
|  | −0.77 | 67 | 1.02 | [3a][PF₆]: 311 (sh), 414, (22 810), |
|  | 0.05 | 68 | 0.94 | 512 (12 430), 1024 (4 560) |
|  | 0.70 | 78 | 0.87 |  |
| 3b/[3b][PF₆] | −2.33[c] | — | — | 3b: 259 (74 180), 319 (sh), 448 |
|  | −2.20 | 71 | 3.04[d] | (29 300), 596 (17 800), 728 (9 370) |
|  | −0.61 | 62 | 1.06 | [3b][PF₆]: 312 (sh), 412 (22 630), |
|  | 0.27 | 65 | 0.95 | 505 (11 100), 996 (4 000) |
|  | 0.87 | 120 | 0.52 |  |
| 3c/[3c][PF₆] | −2.44[c] | — | — | 3c: 318 (sh), 445 (23 830), 592 |
|  | −2.28[c] | — | — | (15 340), 703 (8 210) |
|  | −0.63 | 68 | 0.88 | [3c][PF₆]: 312 (sh), 410 (19 230), |
|  | 0.21 | 72 | 0.96 | 495 (11 310), 996 (3 340) |
|  | 0.84 | 204 | 0.14[e] |  |

[a]Peak to peak separation in a given redox couple. Recorded at scan rates of v = 100 mV/s.
[b]Ratio of cathodic to anodic currents for a given redox couple. Recorded at scan rates of v = 100 mV/s and determined from CVs of isolated peaks.
[c]Irreversible.
[d]Determined from wider scans including the second reduction. As such, the back oxidation of the doubly-reduced species may contribute to the reverse peak current.

Solid-State and Electronic Structures

The solid-state structures of [3a-b]$^{0/+}$ and 3c were determined by single-crystal X-ray diffraction (3a-b: FIG. 5a; [3a-b]⁺: FIG. 6; Table 2).

TABLE 2

Selected bond distances (Å) and angles (°) for 3a-c and [3a-b][PF₆].

|  | 3a | 3b | 3c | [3a][PF₆] | [3b][PF₆] |
|---|---|---|---|---|---|
| Fe-N$_{phen}$ |  |  |  |  |  |
| Fe1-N1 | 1.943(3) | 1.945(2) | 1.941(1) | 1.948(2) | 1.957(4) |
| Fe1-N4 | 1.944(3) | 1.955(2) | 1.941(1) | 1.973(2) | 1.958(4) |
| Fe-N$_{amido}$ |  |  |  |  |  |
| Fe1-N2 | 1.932(3) | 1.924(3) | 1.929(2) | 1.882(2) | 1.881(4) |
| Fe1-N5 | 1.938(3) | 1.932(2) | 1.933(2) | 1.901(2) | 1.906(4) |
| Fe-N$_{quin}$ |  |  |  |  |  |
| Fe1-N3 | 1.949(3) | 1.946(2) | 1.939(1) | 1.949(2) | 1.959(4) |
| Fe1-N6 | 1.944(3) | 1.956(2) | 1.947(1) | 1.970(2) | 1.965(4) |
| N$_{phen}$-C[a] |  |  |  |  |  |
| N1-C1 | 1.308(5) | 1.306(4) | 1.315(2) | 1.304(4) | 1.298(6) |
| N4-C23 | 1.313(4) | 1.309(4) | 1.311(2) | 1.307(3) | 1.307(6) |
| N4-C24 |  |  |  |  |  |
| N4-C27 |  |  |  |  |  |
| Intraligand angles |  |  |  |  |  |
| N1-Fe1-N3 | 165.64(11) | 166.46(11) | 166.22(6) | 167.02(9) | 166.76(18) |
| N1-Fe1-N2 | 82.76(12) | 82.77(10) | 82.94(6) | 83.67(9) | 83.64(17) |
| N2-Fe1-N3 | 82.88(12) | 83.69(10) | 83.30(6) | 83.47(9) | 83.18(17) |
| N4-Fe1-N6 | 166.13(12) | 165.92(10) | 166.26(6) | 164.86(9) | 166.97(17) |
| N4-Fe1-N5 | 83.19(11) | 82.89(10) | 83.27(6) | 82.51(9) | 83.12(17) |
| N5-Fe1-N6 | 82.97(12) | 83.03(10) | 83.14(6) | 82.40(9) | 83.87(18) |
| Interligand angles |  |  |  |  |  |
| N2-Fe1-N5 | 179.27(12) | 179.65(11) | 178.72(6) | 178.16(10) | 179.7(2) |
| N1-Fe1-N6 | 92.32(11) | 89.85(9) | 92.34(6) | 93.25(9) | 91.39(17) |
| N2-Fe1-N4 | 96.42(11) | 97.12(10) | 97.99(6) | 98.88(9) | 96.74(17) |
| N2-Fe1-N6 | 97.42(12) | 96.96(10) | 95.61(6) | 96.23(9) | 96.27(18) |
| N1-Fe1-N5 | 97.84(12) | 96.88(11) | 96.84(6) | 95.17(10) | 96.66(17) |
| N3-Fe1-N5 | 96.52(12) | 96.66(11) | 96.93(6) | 97.64(10) | 96.52(17) |
| N3-Fe1-N4 | 90.98(11) | 90.22(9) | 89.84(6) | 94.41(9) | 93.48(17) |

[a]"Imine-like" (C═N) carbon adjacent to N(4) in the phenanthridine arm, labeled C27 in 3a/[3a]⁺, C24 in 3b/[3b]⁺ and C23 in 3c.

In all complexes, Fe is in a distorted octahedral geometry, with trans-disposed amido nitrogens (N$_{amido}$—Fe—N$_{amido}$ 178-180°) and drawn-back intraligand N$_{phen}$—Fe—N$_{quin}$ angles (~166°). While heterocycle N$_{phen/quin}$—Fe bond distances are similar, a slightly shorter distance is observed for each anionic N$_{amido}$—Fe interaction. Changing the substituent in the 2-position of the phenanthridinyl unit does not significantly impact the coordination environment around Fe.

Comparing neutral and cationic compounds, the most pronounced difference is shorter N$_{amido}$—Fe bonds in [3a-b]⁺ which contracted by an average of 0.04 Å. The N$_{phen/quin}$—Fe distances do not differ significantly. In related pseudo-octahedral complexes of diarylamido ligands, redox-induced changes to N$_{amido}$-metal distances were found to be sensitive to the degree of mixing between filled metal orbitals and N(2p) lone pairs. For example, there were no significant changes in Nan-Kb-metal distances upon oxidation of Ni(II) complexes supported by bis(pyrazolyl) amido ligands (Hewage, J. S. et al. Homoleptic nickel(II) complexes of redox-tunable pincer-type ligands. Inorg. Chem. 53, 10070-10084 (2014)). Despite the presence of a redox-active Ni(II), the orbital from which oxidation occurred was largely localized on nitrogen with only weak mixing with Ni; the weaker ligand field precluded substantial (p+d) π interactions.

Figure 9:
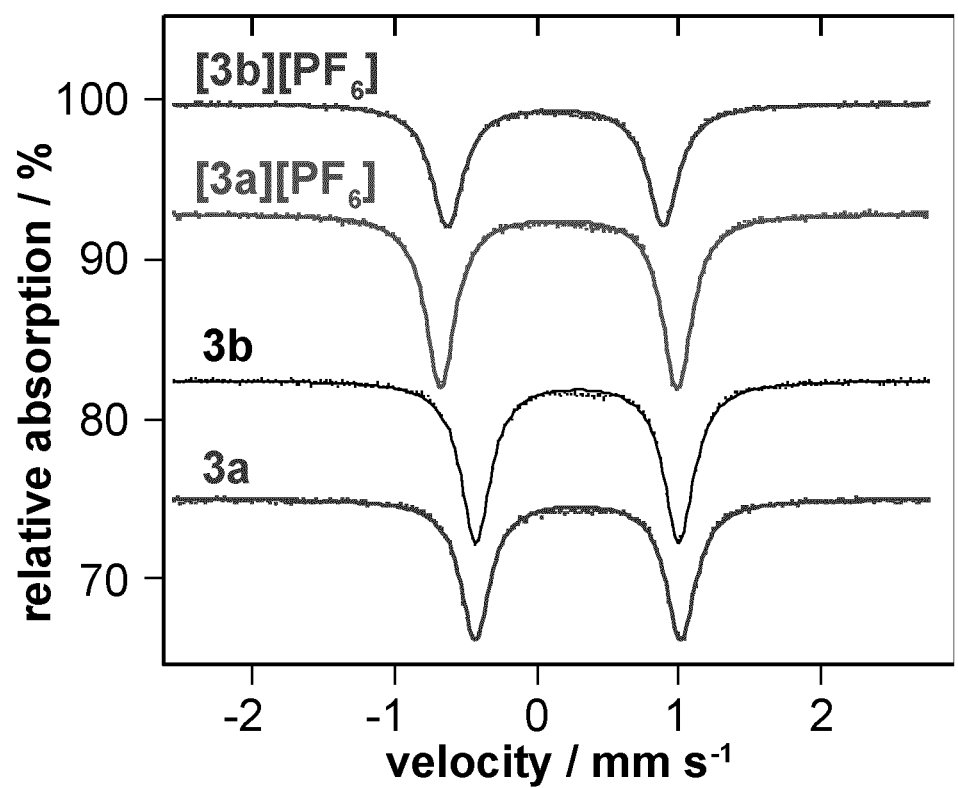
FIG. 9 shows an example of Mössbauer spectra (10 K) of 3a-b and [3a-b][PF$_6$].

In comparison, constriction of the N$_{amido}$—Fe distance following oxidation of 3a-b is attributable to depopulation of a HOMO with substantial N—Fe π-antibonding character (FIG. 1b). Density functional theory (DFT) calculations reinforce this interpretation. The two highest energy occupied orbitals (HOMO, HOMO-1) of 3a-b represent π anti-bonding overlap between the amido nitrogens and the metal centre ($\pi^*(p+d)$). The HOMO-2 presents substantial non-bonding character and is localized at iron (~67%). The next two highest energy MOs contain the corresponding π-bonding overlap. Therefore, 3a-b represent intermediate cases of the 'HOMO inversion' model (Mukherjee, S., Torres, D. E. & Jakubikova, E. HOMO inversion as a strategy for improving the light-absorption properties of Fe(II) chromophores. *Chem. Sci.* 8, 8115-8126 (2017)). Accordingly, the distorted coordination about the Fe-ions should be clearly identified by the presence of non-zero electric field gradients, quantified by zero-field 57 Fe Mossbauer spectral doublets (FIG. 9) observed for 3a-b that exhibit larger splitting (3a: $\Delta=1.442(1)$ mm·s$^{-1}$ with isomer shift $\delta=0.2911(6)$ mm·s$^{-1}$; 3b: $\Delta=1.425(1)$ mm·s$^{-1}$, $\delta=0.2863(5)$ mm·s$^{-1}$) than Fe(smif)$_2$ (Frazier, B. A., Wolczanski, P. T., Lobkovsky, E. B. & Cundari, T. R. Unusual electronic features and reactivity of the dipyridylazaallyl ligand: Characterizations of (smif)$_2$ M [M=Fe, Co, Co+, Ni; smif={(2-py)CH}$_2$ N] and [(TMS)$_2$NFe]$_2$ (smif)$_2$. *J. Am. Chem. Soc.* 131, 3428-3429 (2009)) ($\Delta=0.62(1)$ mm·s$^{-1}$, $\delta=0.30(1)$ mm·s$^{-1}$) that is a neutral pseudooctahedral Fe(II) complex of tridentate azaallyl ligands (smif=[(2-pyridinyl-CH)$_2$N]$^-$), with trans central N donors, flanking pyridyl donors, and very similar N$_{py}$—Fe—N$_{py}$ bond angles and central Fe—N distances (Frazier, B. A., Wolczanski, P. T., Lobkovsky, E. B. & Cundari, T. R. Unusual electronic features and reactivity of the dipyridylazaallyl ligand: Characterizations of (smif)$_2$M [M=Fe, Co, Co+, Ni; smif={(2-py)CH}$_2$N] and [(TMS)$_2$NFe]$_2$ (smif)$_2$. *J. Am. Chem. Soc.* 131, 3428-3429 (2009)) to 3a-b. Fe(smif)$_2$ is an example of full HOMO inversion, with carbon-based azaallyl HOMO and HOMO-1 MOs that do not significantly mix with Fe-based d-orbitals as a result of the presence of a node at the central N bound to Fe (Frazier, B. A., Wolczanski, P. T., Lobkovsky, E. B. & Cundari, T. R. Unusual electronic features and reactivity of the dipyridylazaallyl ligand: Characterizations of (smif)$_2$M [M=Fe, Co, Co+, Ni; smif={(2-py)CH}$_2$N] and [(TMS)$_2$NFe]$_2$ (smif)$_2$. *J. Am. Chem. Soc.* 131, 3428-3429 (2009)). Nor are isomer shifts and quadrupole splitting as affected by oxidation (e.g., for [3a-b]$^{0/+}$) as for other polypyridyl Fe complexes (Table 3).

TABLE 3

Hyperfine parameters for 3a-b and [3a-b][PF$_6$] and related compounds

| Compound | $\delta$/mms$^{-1}$ | $\Delta$/mms$^{-1}$ |
|---|---|---|
| 3a[a] | 0.2911(6) | 1.442(1) |
| 3b[a] | 0.2863(5) | 1.425(1) |
| [Fe(terpy)$_2$][ClO$_4$]$_2$[17] | 0.238 | 1.14 |
| [Fe(bpy)$_3$][ClO$_4$]$_2$[b18] | 0.325 | 0.39 |
| [Fe(2-arylazo-phenanthroline)$_2$][ClO$_4$]$_2$[b19] | 0.22 | 1.80 |
| Fe(2-pyridyl-CH)$_2$N)$_2$[b20] | 0.30(1) | 0.62(1) |
| [3a][PF$_6$][a] | 0.1563(5) | 1.661(1) |
| [3b][PF$_6$][a] | 0.1307(6) | 1.513(1) |
| [Fe(terpy)$_2$][ClO$_4$]$_3$[b21] | 0.07 | 3.43 |

[a]10K
[b]80K

Figure 10:
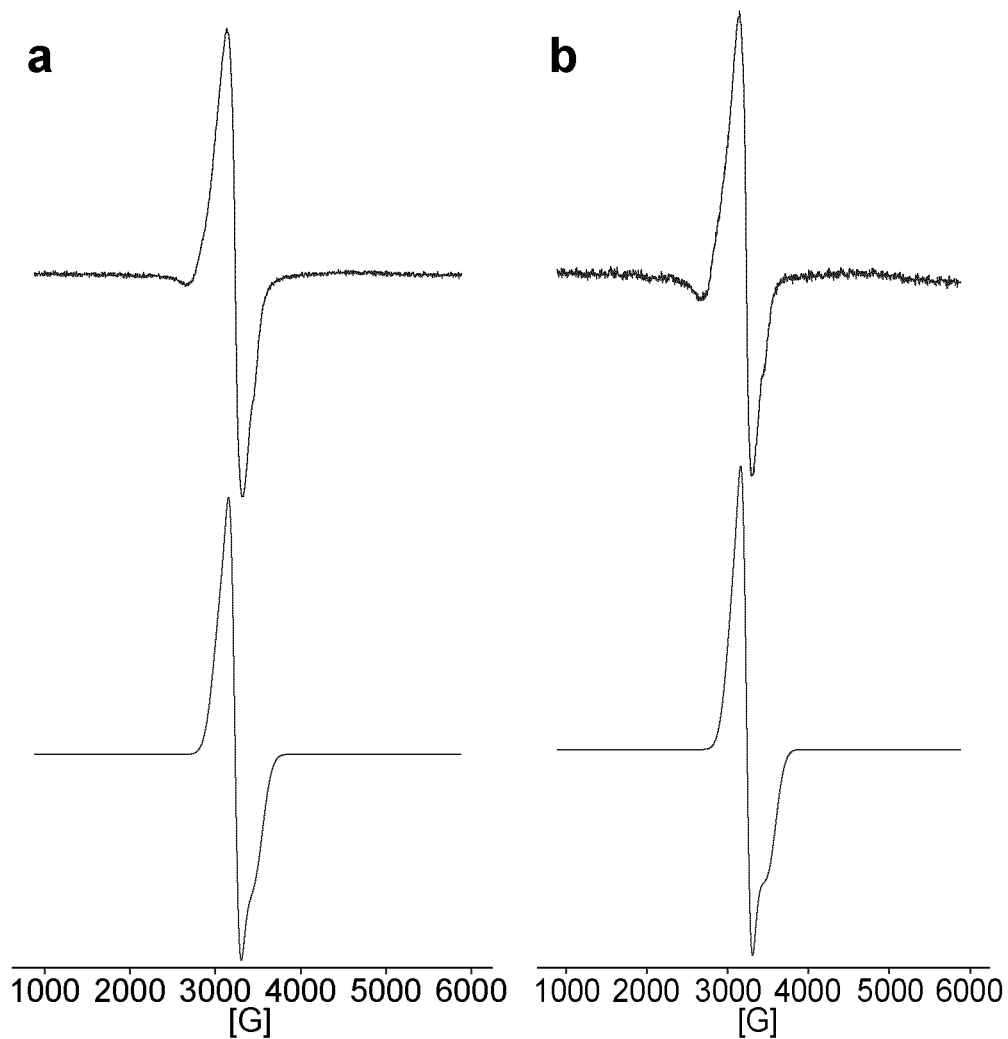
FIG. 10 shows an example of X-band EPR (electron paramagnetic resonance) spectrum (top) and simulations (bottom) in frozen CH$_2$Cl$_2$ glass at 20 K of (a) [3a][PF$_6$] and (b) [3b][PF$_6$] (ν=9.469 GHz, power=2.050 mW; [3b][PF$_6$]: ν=9.472 GHz, power=2.050 mW). Simulation parameters: [3a][PF$_6$]: g=[2.21 2.10 1.95], lw=10, HStrain=[700 150 600]; [3b][PF$_6$]: g=[2.20 2.10 1.93], lw=10, HStrain [700 150 600].
Figure 11:
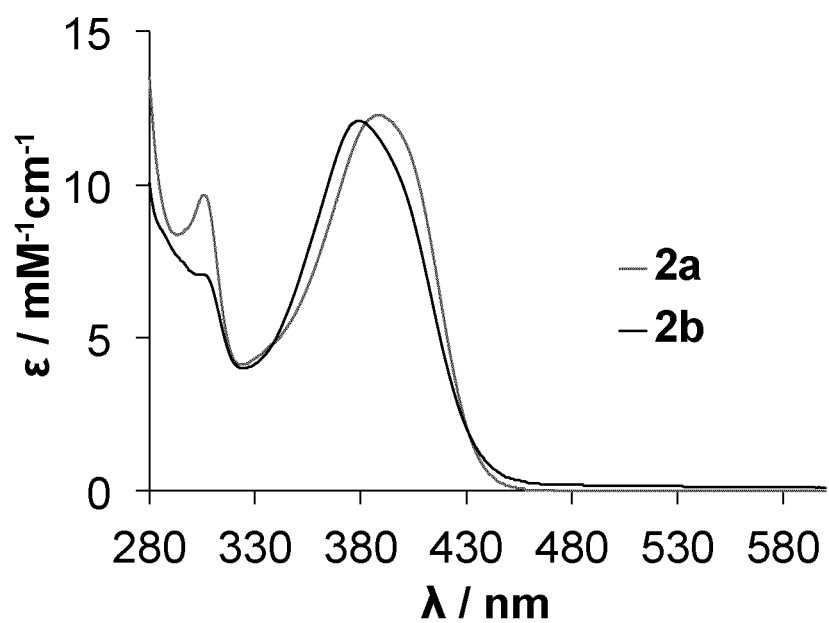
FIG. 11 shows an example of the UV-Vis absorption spectra of proligands 2a and 2b in CH$_3$CN.
Figure 12A:
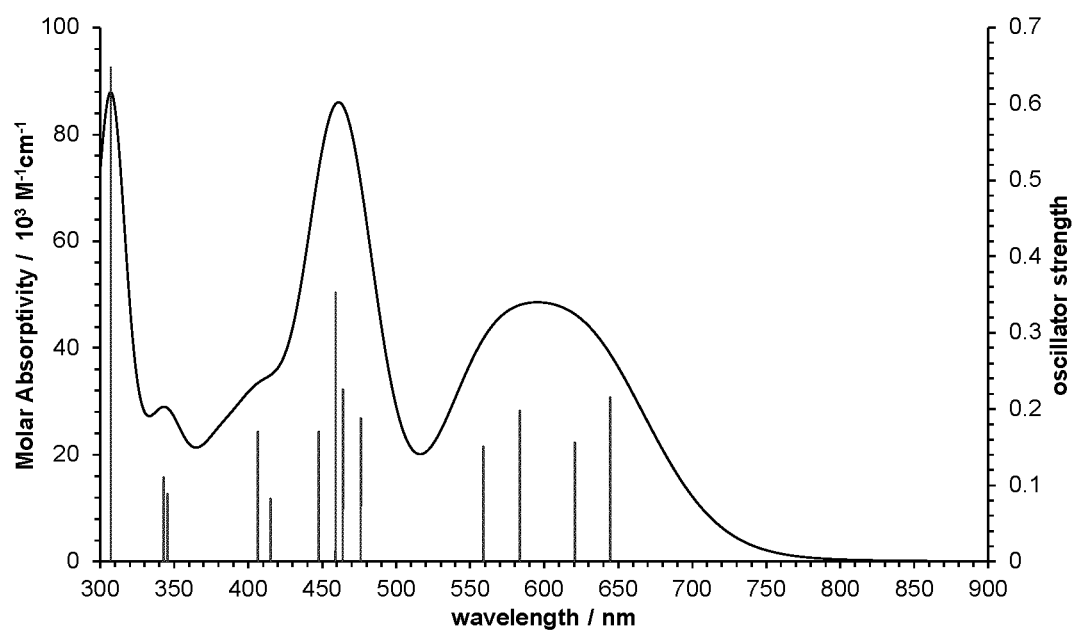
FIG. 12a shows an example of the TD-DFT generated spectrum for 3e showing most intense transitions (f>0.07).
Figure 12B:
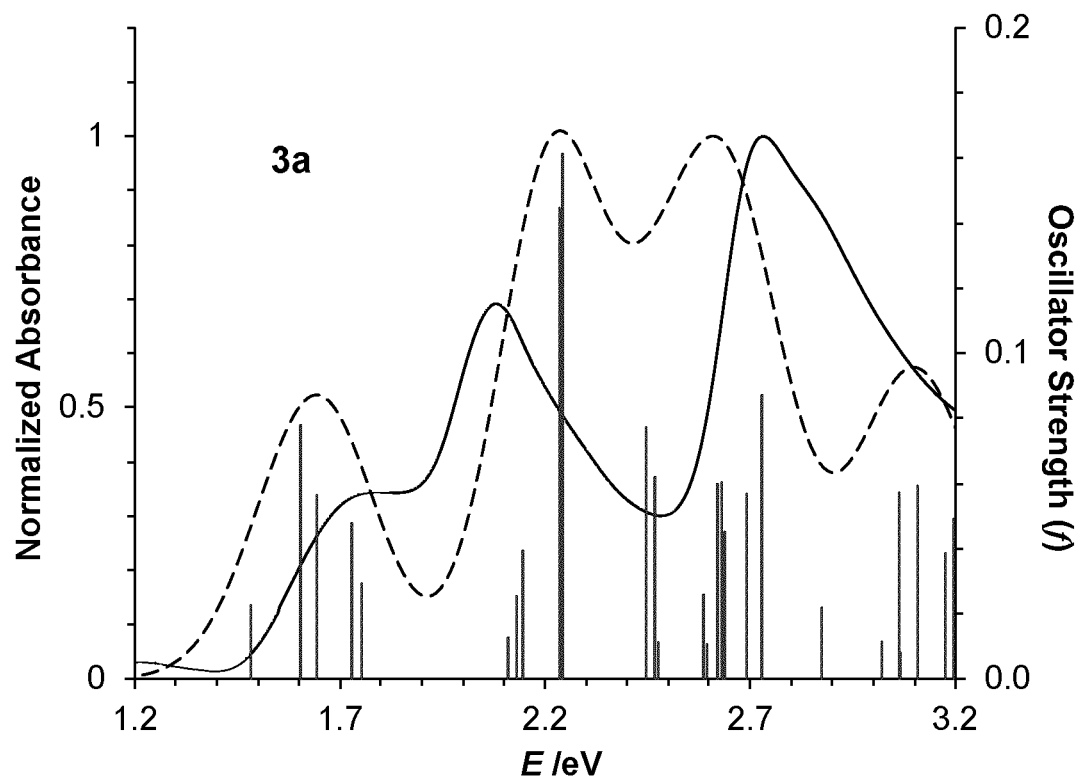
FIG. 12b shows an example of the TD-DFT simulated spectrum (---) and vertical excitation energies (red) superimposed on the experimental spectrum (-) of 3a in CH$_3$CN (SMD-M06L/6-31+G(d,p)//SMD-O3LYP/6-31+G(d,p); FWHM=2250 cm$^{-1}$; f>0.01).
Figure 12C:
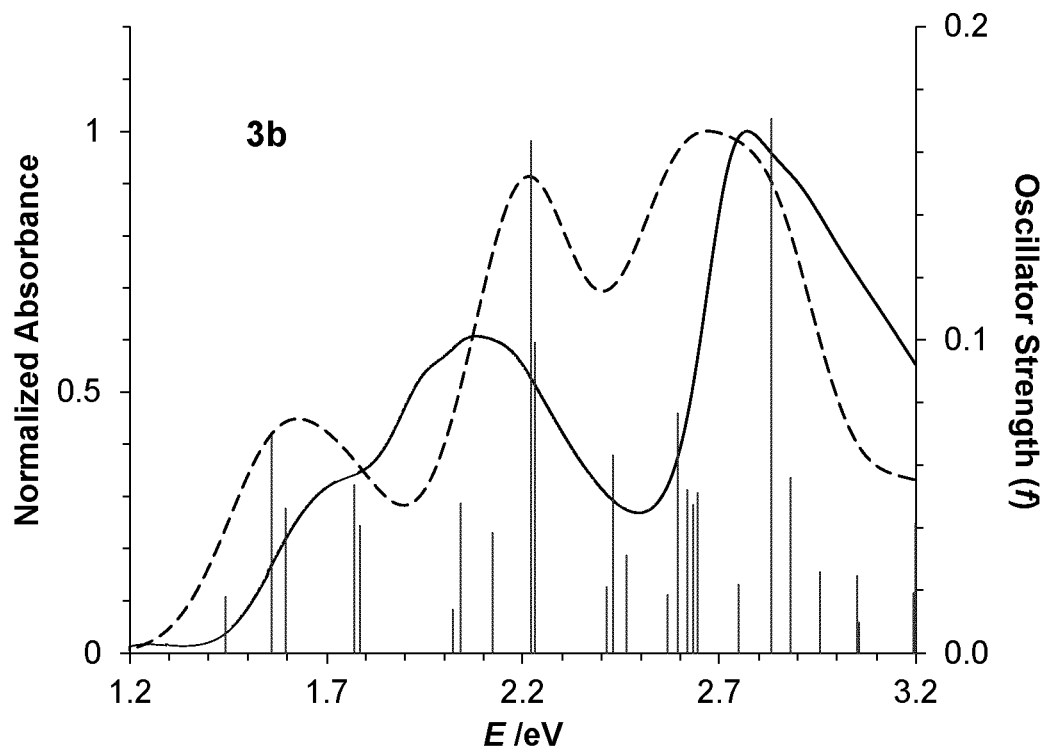
FIG. 12c shows an example of the TD-DFT simulated spectrum (---) and vertical excitation energies (red) superimposed on the experimental spectrum (-) of 3b in CH$_3$CN (SMD-M06L/6-31+G(d,p)//SMD-O3LYP/6-31+G(d,p); FWHM=2250 cm$^{-1}$; f>0.01).
Figure 13A:
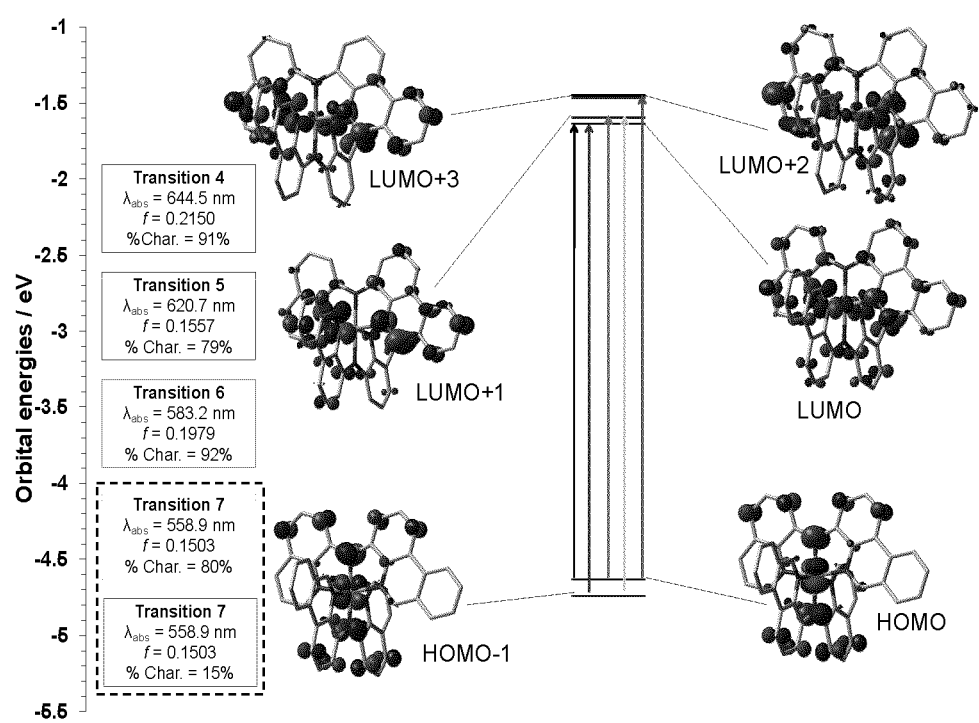
FIG. 13a shows examples of TD-DFT assignments to lowest energy charge transfer transitions for 3e (isosurface=0.045).
Figure 13B:
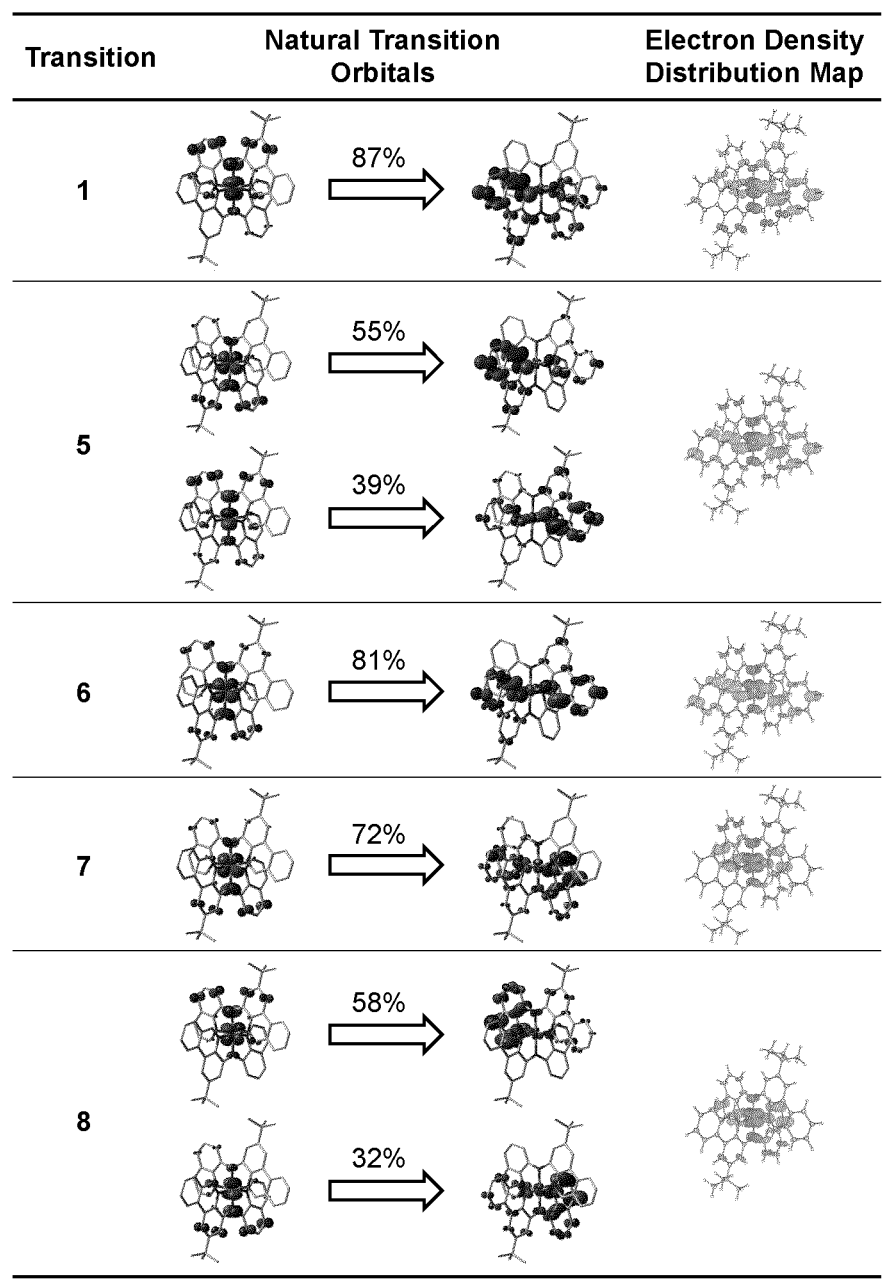
FIG. 13b shows examples of natural transition orbitals (NTOs; isosurface=0.04), and TD-DFT calculated electron density gain (green) and depletion (blue) distribution maps (isosurface=0.002) for the five lowest energy transitions in 3a (SMD-M06L/6-31+G(d,p)//SMD-O3LYP/6-31+G(d,p)). Where excitations are represented by more than one particle—hole pair, more than one NTO is included.
Figure 13C:
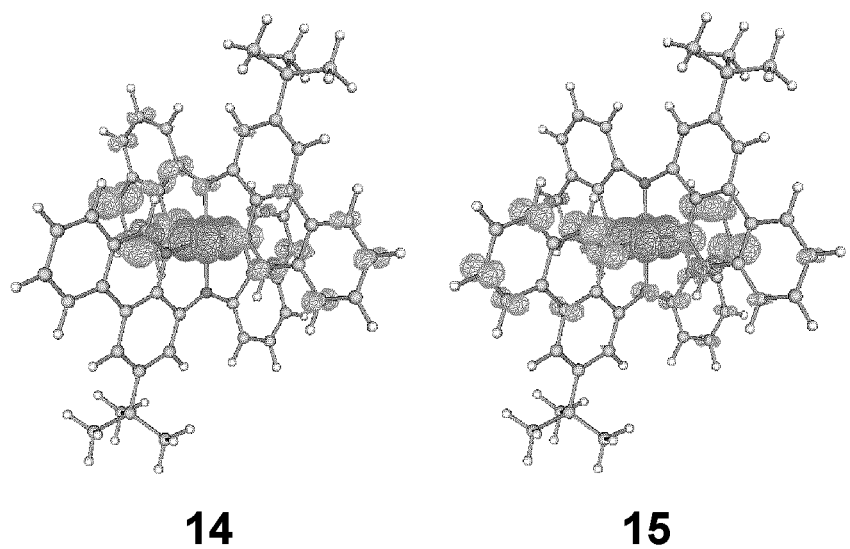
FIG. 13c shows examples of TD-DFT calculated electron density gain (green) and depletion (blue) distribution maps (isosurface=0.002) for MLCT-type transitions 14 (HOMO-2→LUMO+2) and 15 (HOMO-2→LUMO+3) of 3a (SMD-M06L/6-31+G (d, p)//SMD-O3LYP/6-31+G (d, p)).
Figure 13D:
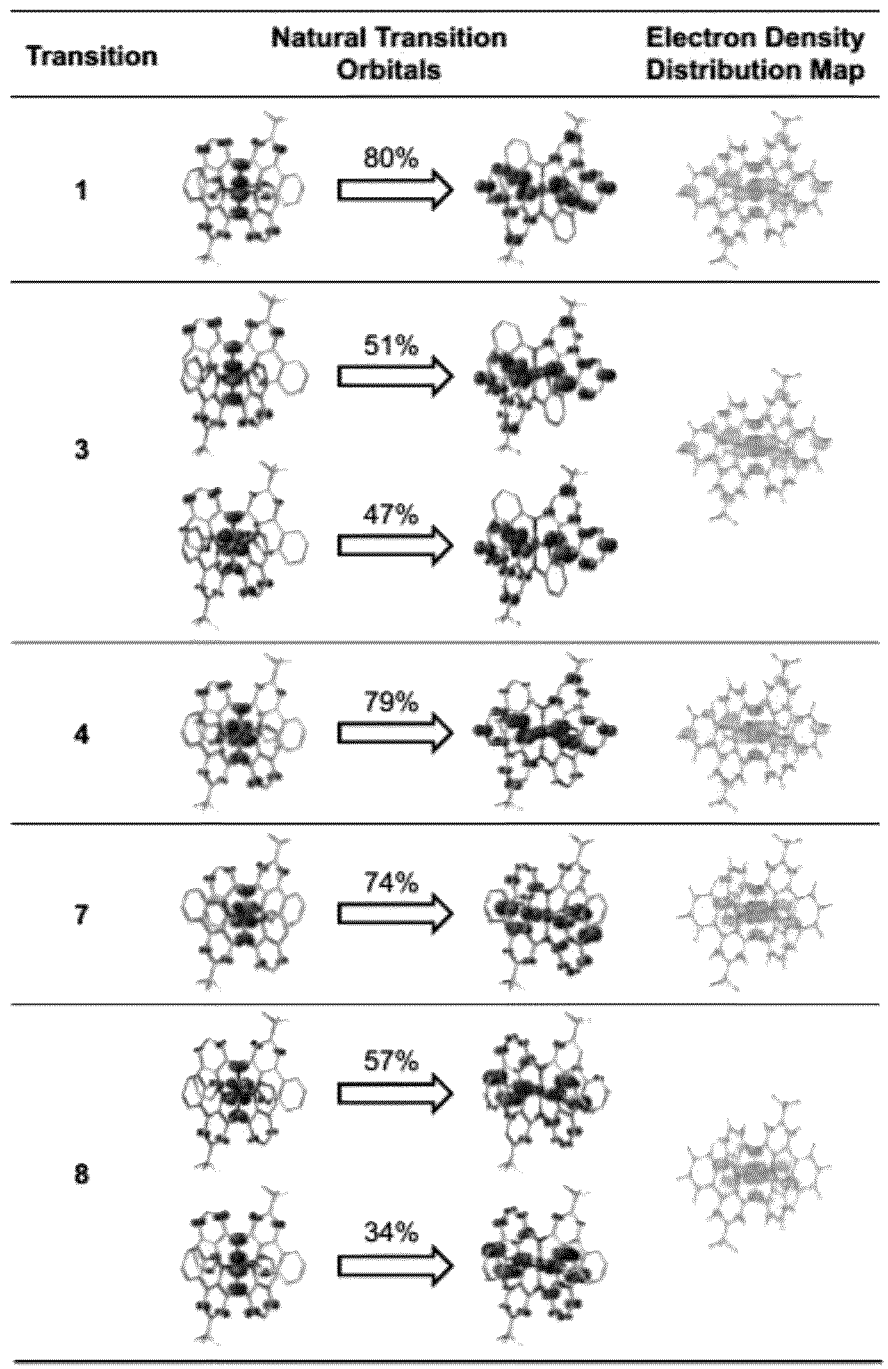
FIG. 13d shows examples of natural transition orbitals (NTOs; isosurface=0.04), and TD-DFT calculated electron density gain (green) and depletion (blue) distribution maps (isosurface=0.002) for the five lowest energy transitions in 3b (SMD-M06L/6-31+G(d,p)//SMD-O3LYP/6-31+G(d,p)). Where excitations are represented by more than one particle—hole pair, more than one NTO is included.
Figure 13E:
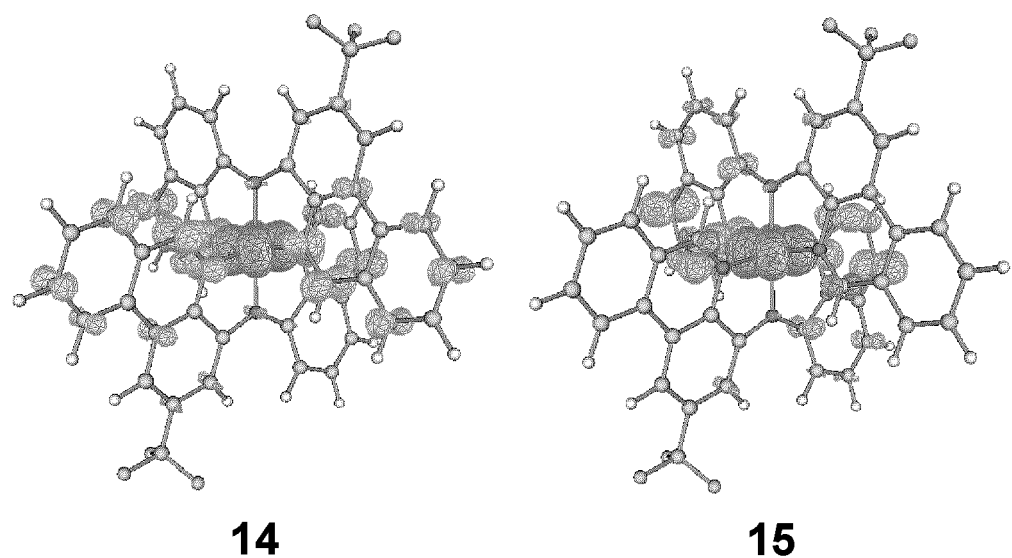
FIG. 13e shows examples of TD-DFT calculated electron density gain (green) and depletion (blue) distribution maps (isosurface=0.002) for MLCT-type transitions 14 (HOMO-2→LUMO+2) and 15 (HOMO-2→LUMO+3) of 3b (SMD-M06L/6-31+G(d,p)//SMD-O3LYP/6-31+G(d,p)).
Figure 14:
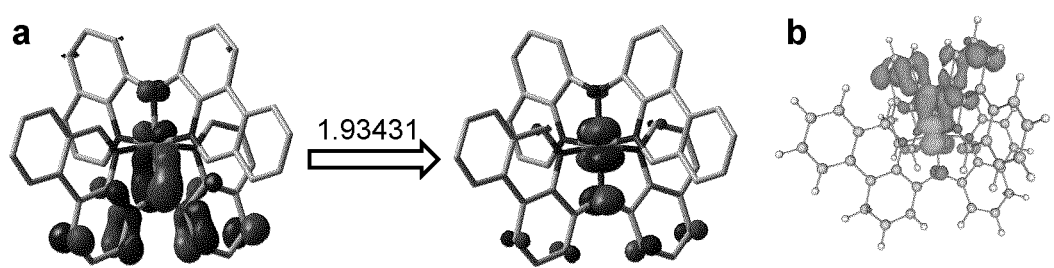
FIG. 14 shows an example of (a) β natural transition orbitals (NTOs (natural transition orbitals); no contribution from α electrons) with corresponding transition coefficient (isosurface=0.045), and (b) TD-DFT calculated electron density gain and electron density depletion distribution maps (isosurface=0.002) for transition 4 in [3e$^+$].
Figure 15:
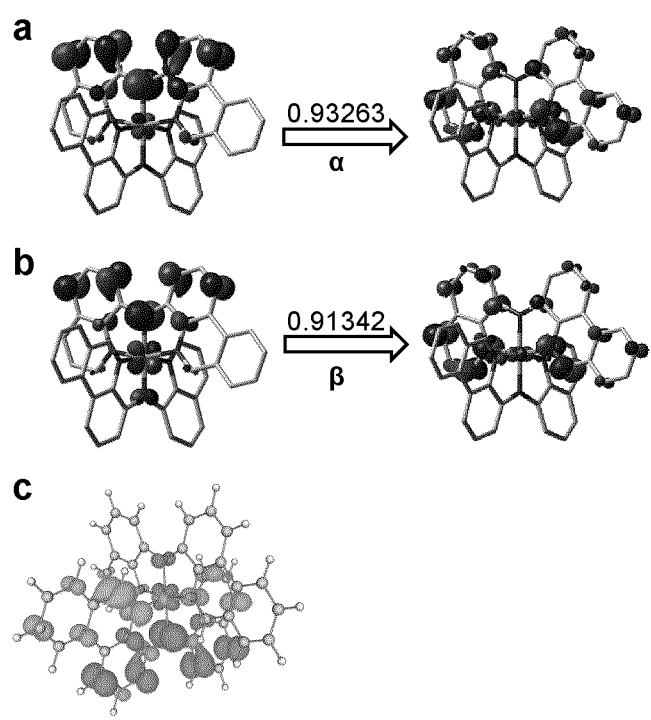
FIG. 15 shows examples of (a) α and (b) β NTOs with corresponding transition coefficients (isosurface=0.045), and (c) TD-DFT calculated electron density gain and electron density depletion distribution maps (isosurface=0.002) for transition 16 in [3e$^+$].
Figure 16:
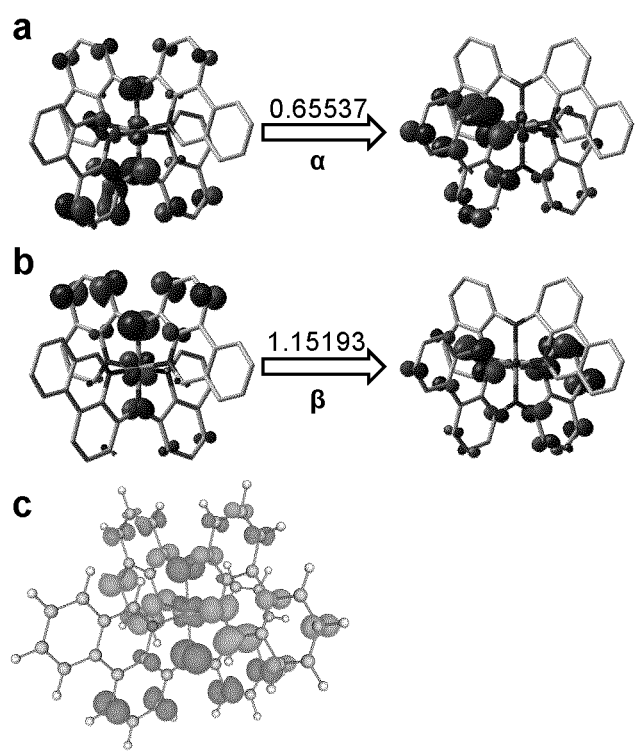
FIG. 16 shows examples of (a) α and (b) β NTOs with corresponding transition coefficients (isosurface=0.045), and (c) is the electron and hole distribution (isosurface=0.002) for transition 18 in [3e$^+$].

Focusing on trends within the two separate pairs of molecules, oxidation of [Fe(terpy)$_2$]$^{2+}$ to [Fe(terpy)$_2$]$^{3+}$ (Reiff, W. M., Baker, W. A. & Erickson, N. E. Binuclear, oxygen-bridged complexes of iron(III). New iron(III)-2,2′, 2″-terpyridine complexes. *J. Am. Chem. Soc.* 90, 4794-4800 (1968)), for example, resulted in larger relative changes in $\delta$ and $\Delta$ compared with [3a-b]$_{0/+}$, suggesting, without being bound by theory, that oxidation more strongly perturbs the electronic environment about Fe in [Fe(terpy)$_2$]$^{2+/3+}$ compared to [3a-b]$^{0/+}$, with a more symmetric electric field about the nucleus in the latter compound as evidenced by the significantly smaller value of A. Indeed, the EPR spectra of [3a-b][PF$_6$] collected at 20 K in CH$_2$Cl$_2$ glass contain asymmetric, broad resonances best modeled with slightly inequivalent g tensors (FIG. 10), unlike the rhombic signal observed for [Fe(BQA) 2]±(Betley, T. A., Qian, B. A. & Peters, J. C. Group VIII Coordination chemistry of a pincer-type bis(8-quinolinyl)amido ligand. *Inorg. Chem.* 47, 11570-11582 (2008)). This is inconsistent with localization of the unpaired electron at the metal, though resolved $^{14}$N hyperfine coupling was not observed under experimental conditions.

The lowest energy unoccupied MOs (LUMO, LUMO+1) have partial π-anti-bonding character between N-heterocyclic ligand nitrogens and Fe, but are largely (>60%) comprised of the π* system of the phenanthridinyl arms. MOs comprised of the remaining two Fe d orbitals that present metal-ligand σ-anti-bonding character (i.e., the e$_g$ states of the symmetric octahedral complex) are significantly destabilized. The ligand field of the phenanthridinyl/quinolinyl amido ligands therefore induces considerable N(2p)-Fe(3d) mixing, raising the energy of the mixed-character HOMO (Mukherjee, S., Torres, D. E. & Jakubikova, E. HOMO inversion as a strategy for improving the light-absorption properties of Fe(II) chromophores. *Chem. Sci.* 8, 8115-8126 (2017)), with the phenanthridinyl moieties dominating the lower energy unoccupied orbital manifolds and destabilizing metal-centered (MC) excited states in favour of charge transfer ones.

Steady-State and Transient Absorption (TA) Spectroscopy

Figure 5:
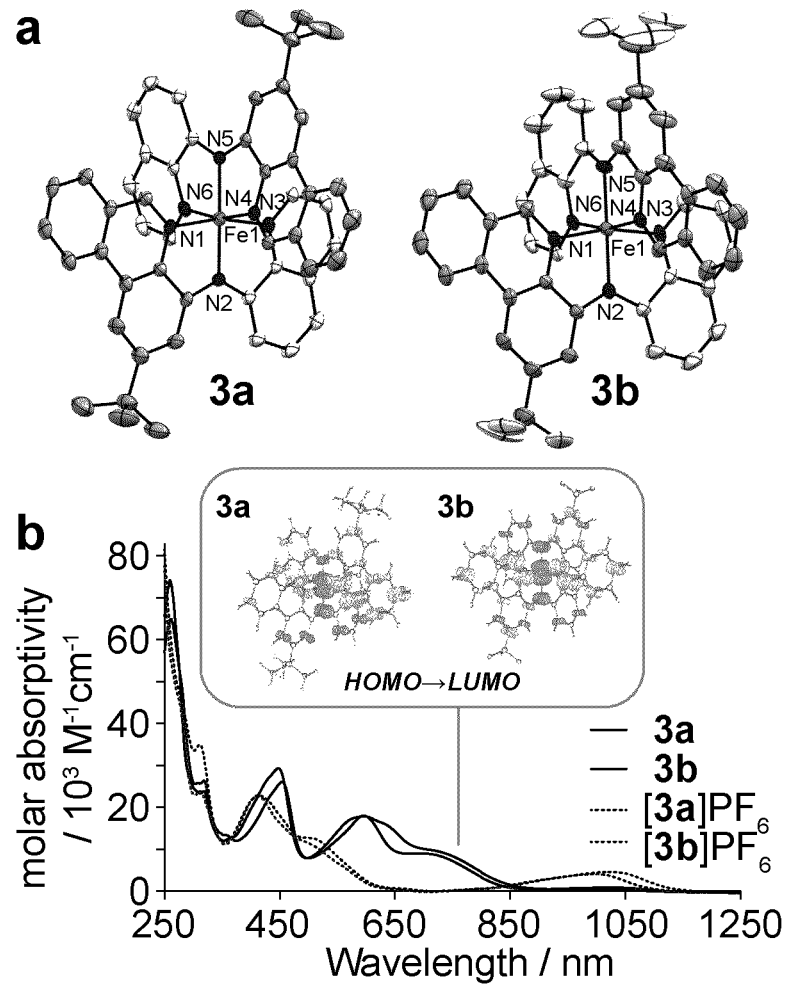
FIG. 5 shows examples of (a) solid-state X-ray diffraction structures of 3a and 3b, shown with ellipsoids at 50% probability levels and hydrogen atoms omitted for clarity. The distorted octahedral geometry of each Fe(II) centre is evident, as is the nearly linear arrangement of the trans-disposed amido nitrogen centres (N2 and N5) about the metal. Selected bond distances (A) and angles(°): 3a Fe1-N1 1.941(3), Fe1-N4 1.945(3), Fe1-N2 1.934(3), Fe1-N5 1.936(3), Fe1-N3 1.943(3), Fe1-N6 1.947(3), N1-Fe1-N3 165.77(12), N4-Fe1-N6 166.11(12), N2-Fe1-N5 179.23 (12); 3b Fe1-N1 1.945(2), Fe1-N4 1.955(2), Fe1-N2 1.924 (3), Fe1-N5 1.932(3), Fe1-N3 1.946(2), Fe1-N6 1.956(2), N1-Fe1-N3 166.46(11), N4-Fe1-N6 165.92(10), N2-Fe1-N5 179.65(11); (b) steady-state UV-Vis absorption spectra of 3a-b/[3a-b][PF$_6$] in CH$_3$CN showing the broad, panchromatic absorption of the Fe(II) complexes. Inset: TD-DFT (time-dependent density functional theory) (difference maps) showing electron density gain and depletion distribution maps (isosurface=0.002) illustrating the charge-transfer character of the three lowest energy transition (HOMO→LUMO) for 3a and 3b.
Figure 6:
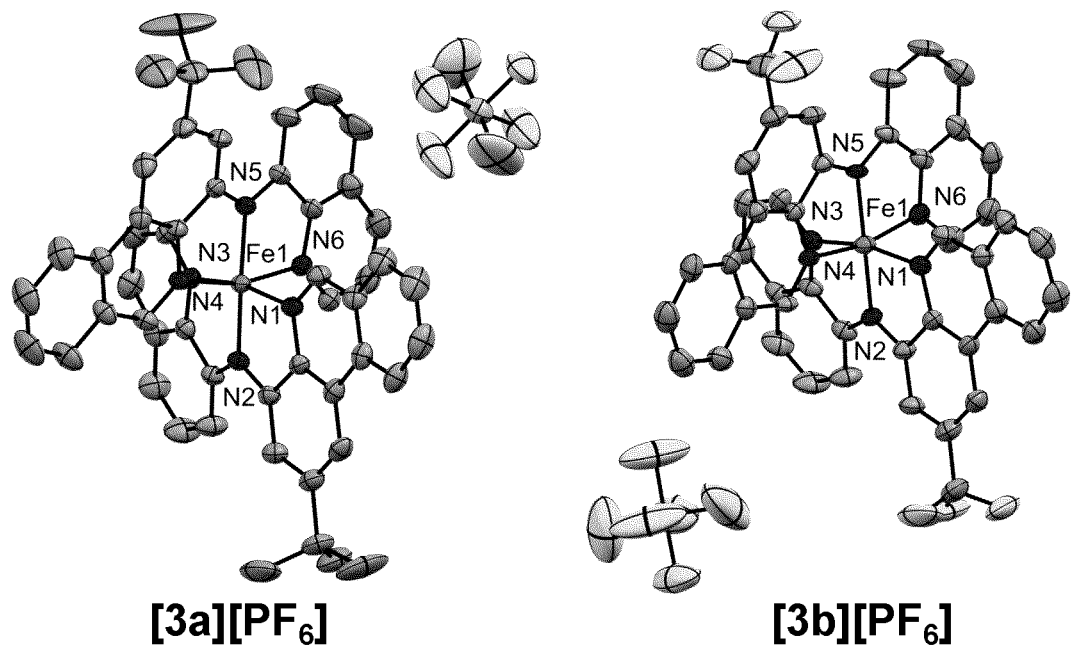
FIG. 6 shows, as an example, ORTEPs (Macrae, C. F. et al. Mercury CSD 2.0—New Features for the Visualization and Investigation of Crystal Structures. *J. Appl. Cryst.* 41, 466-470 (2008)) of [3a-b][PF$_6$] with thermal ellipsoids shown at 50% probability levels. Hydrogen atoms and solvent molecules are omitted for clarity.
Figure 7:
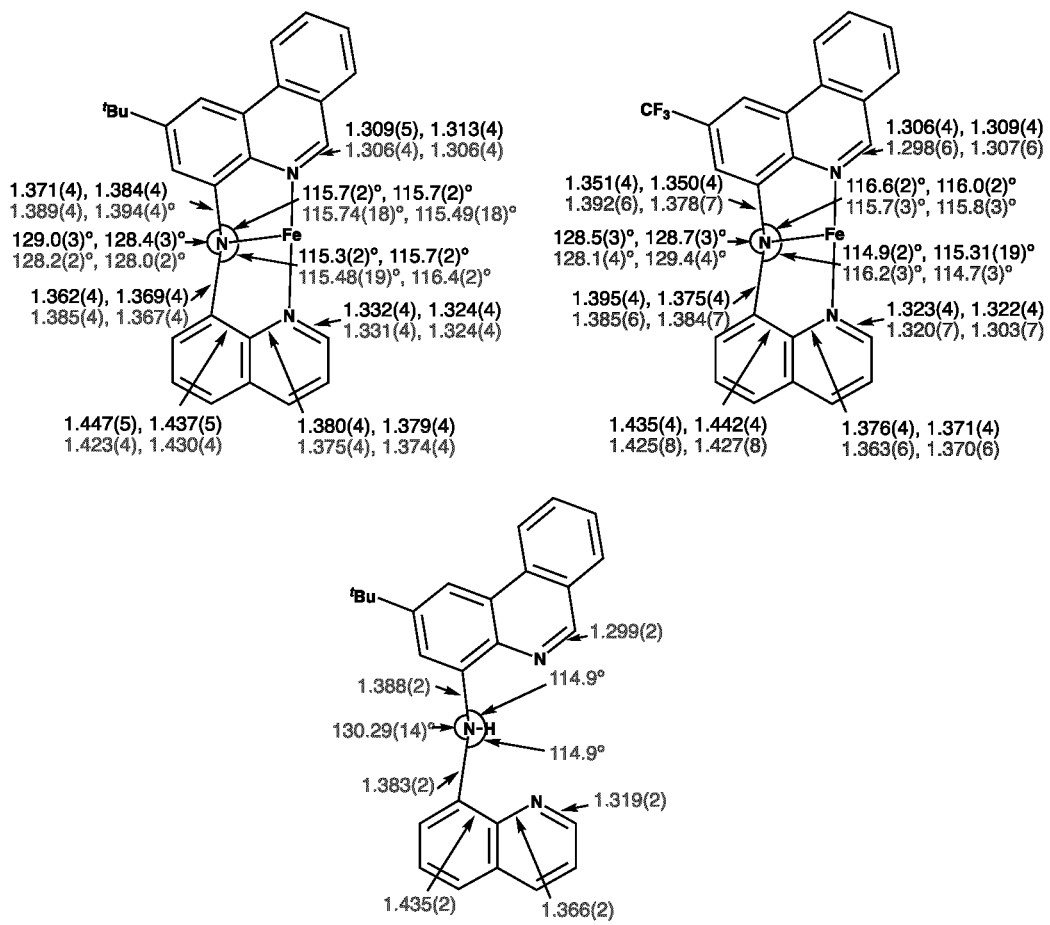
FIG. 7 shows, as examples, a comparison of bond distances and angles for 2a, 3a-b and [3a-b]$^+$.
Figure 8A:
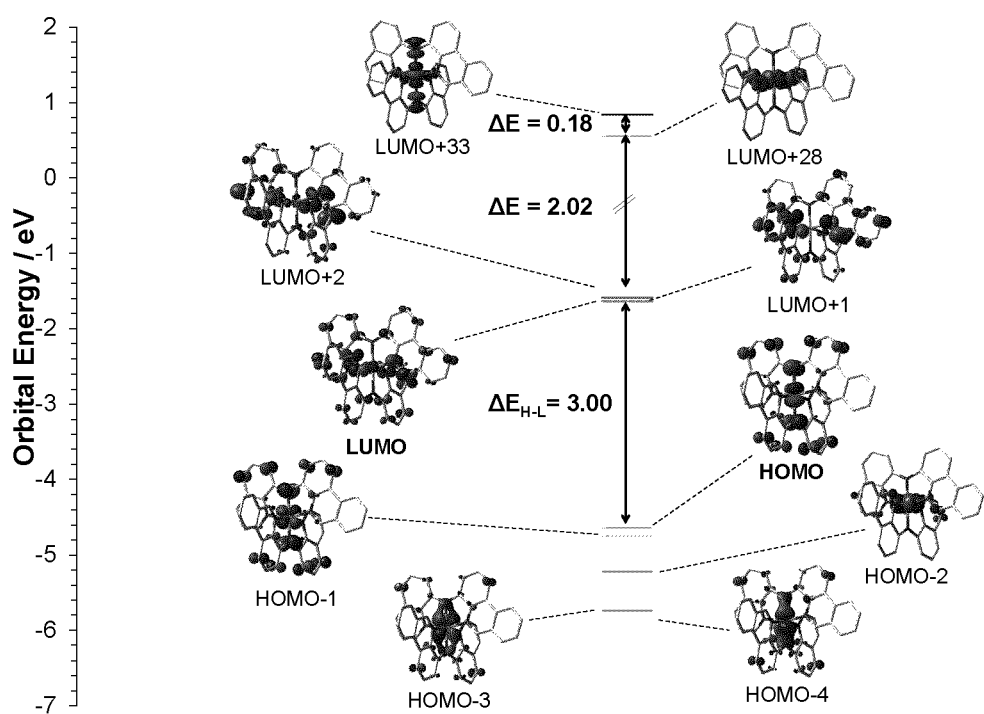
FIG. 8a shows an example of a DFT optimized extended MO diagram for 3e (isosurface=0.045).
Figure 8B:
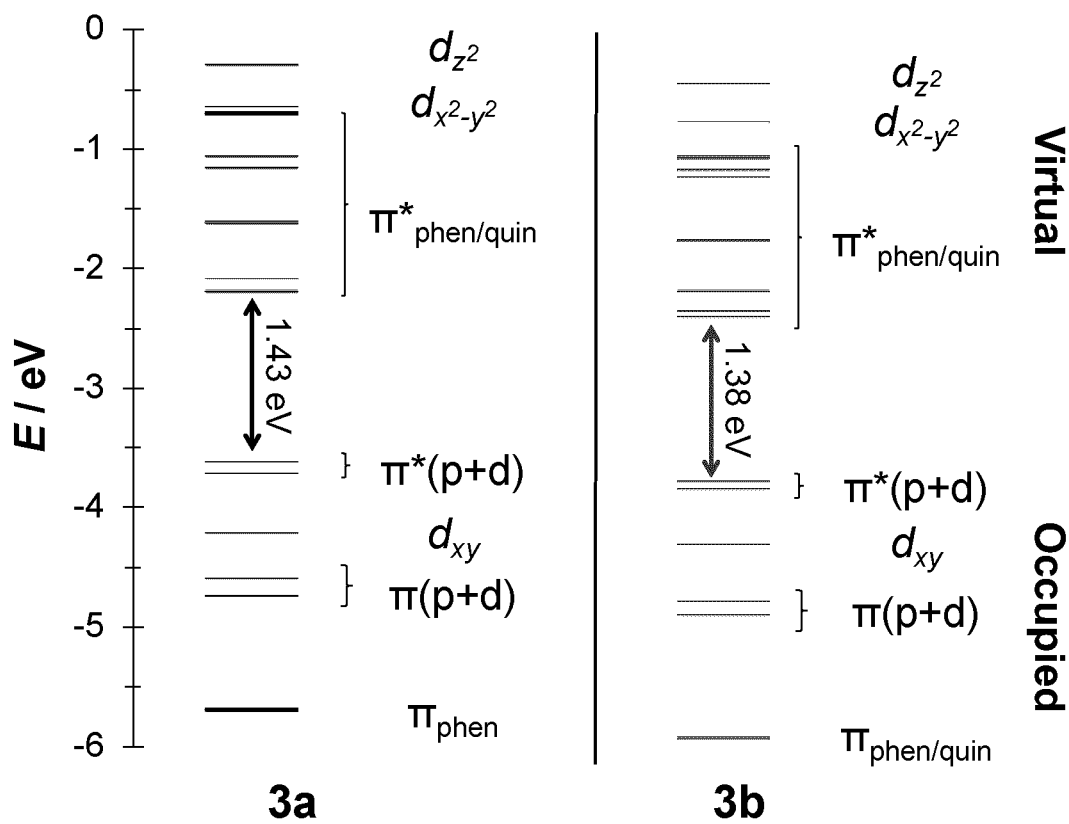
FIG. 8b shows an example of relative energies of the MOs calculated for 3a and 3b [SMD-M06L/6-31+G(d,p)//SMD-O3LYP/6-31+G(d,p)].
Figure 8C:
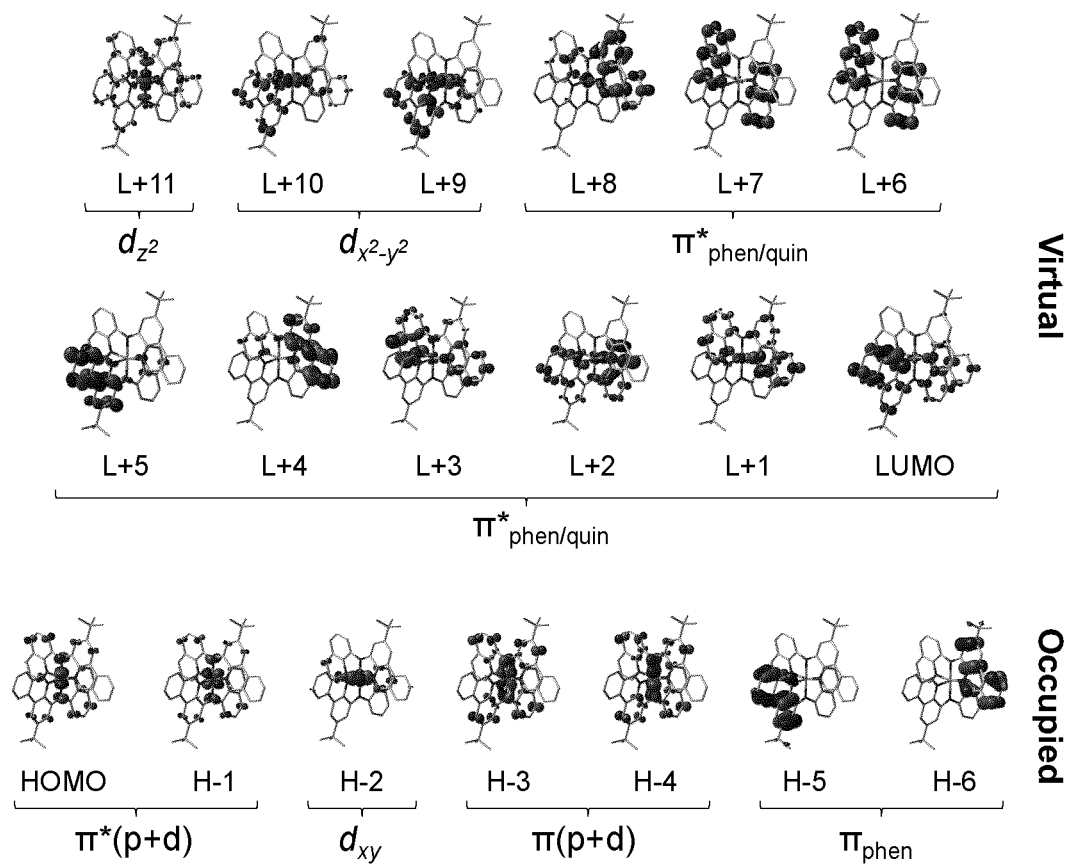
FIG. 8c shows an example of ground state MOs of 3a (isosurface=0.04; SMD-M06L/6-31+G(d,p)//SMD-O3LYP/6-31+G(d,p)).
Figure 8D:
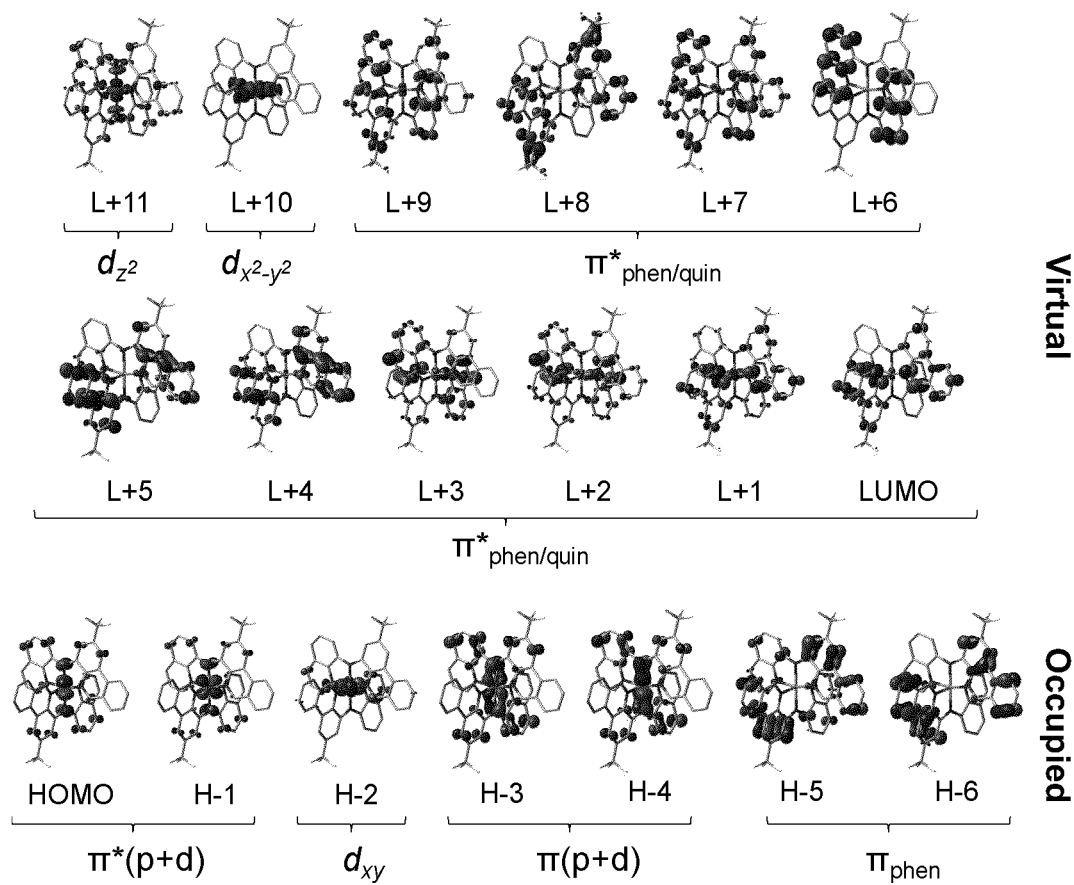
FIG. 8d shows an example of Ground state MOs of 3b (isosurface=0.04; SMD-M06L/6-31+G(d,p)//SMD-O3LYP/6-31+G(d,p)).

Steady-state UV-Vis spectra showed 3a-c absorb strongly across the visible spectrum (see FIG. 5). The high molar absorptivities ($\epsilon \sim 10$-30 mM$^{-1}$cm$^{-1}$) for broad peaks at ~450, 600 and 730 nm that tail off at ~850 nm are consistent with CT character to transitions throughout this region. Time-dependent DFT (TD-DFT) simulations support this assignment. The lowest energy spectral bands (650-900 nm) of 3a-b are dominated by five key transitions with similar CT character in which electron density is relocated from occupied π*(p+d) N$_{amido}$—Fe anti-bonding orbitals (HOMO, HOMO-1) to N-heterocycle ligand-based π* acceptor MOs (LUMO-LUMO+3). These transitions can be described as '$\pi_{anti-bonding}$-to-ligand charge transfer' (PALCT; Dixon, I. M., Khan, S., Alary, F., Boggio-Pasqua, M. & Heully, J. L. Probing the photophysical capability of mono and bis(cyclometallated) Fe(II) polypyridine complexes using inexpensive ground state DFT. *Dalton Trans.* 2014, 43, 15898-15905). Metal-to-ligand charge transfer (MLCT) transitions involving the Fe-localized HOMO-2 occur at higher energy [3a: 500-590 nm; 3b: 556-613 nm] while the corresponding PBLCT T ('$\pi_{bonding}$-to-ligand charge transfer') transitions involving the two MOs with π(p+d) N$_{amido}$—Fe bonding character (HOMO-3, HOMO-4) are found at slightly higher energy (3a: 475-510 nm, 3b: 430-515 nm; Table 4a-c). Noting the correlation between the spacing of the first one-electron oxidation and reduction potentials and MLCT energies (Lever, A. B. P. Electrochemical parametrization of metal complex redox potentials, using the ruthenium(III)/ruthenium(II) couple to generate a ligand electrochemical series. *Inorg. Chem.* 1990, 29, 1271-1285), the $\Delta E_{1/2}$ calculated for 3a-b (3a: 1.66 V; 3b: 1.59 V) are ~0.75 V lower than for [Fe(tpy)$_2$]$^{2+}$ (2.36 V), consistent with the significant red-shift to the lowest energy absorptions of the benzannulated complexes.

TABLE 4a

TD-DFT calculated excitation energies, oscillator strengths and MO characters for 3e (R = H). Only transitions with oscillator strengths greater than 0.07 are shown.

| Transition | $\lambda_{calc}$ (nm) | Oscillator Strength | Assignment | % Contribution[a] |
|---|---|---|---|---|
| 4 | 644.48 | 0.2150 | HOMO → LUMO | 91 |
| 5 | 620.67 | 0.1557 | HOMO-1 → LUMO | 79 |
| 6 | 583.24 | 0.1979 | HOMO → LUMO + 1 | 92 |
| 7 | 558.92 | 0.1503 | HOMO-1 → LUMO + 1 | 80 |
|  |  |  | HOMO → LUMO + 3 | 15 |
| 14 | 475.82 | 0.1879 | HOMO-2 → LUMO + 1 | 92 |
| 15 | 464.01 | 0.2261 | HOMO-2 → LUMO + 2 | 88 |
| 16 | 458.86 | 0.3522 | HOMO-2 → LUMO + 3 | 92 |
| 18 | 447.82 | 0.1704 | HOMO → LUMO + 5 | 75 |
|  |  |  | HOMO-1 → LUMO + 4 | 18 |
| 23 | 415.04 | 0.0823 | HOMO-3 → LUMO | 78 |
| 24 | 406.64 | 0.1706 | HOMO-4 → LUMO | 69 |
|  |  |  | HOMO-3 → LUMO + 1 | 19 |
| 43 | 345.59 | 0.0882 | HOMO → LUMO + 14 | 5 |
| 44 | 342.67 | 0.1106 | HOMO → LUMO + 13 | 58 |
|  |  |  | HOMO-1 → LUMO + 14 | 25 |
| 63 | 307.30 | 0.6478 | HOMO-6 → LUMO + 1 | 34 |
|  |  |  | HOMO-5 → LUMO | 20 |
|  |  |  | HOMO-4 → LUMO + 5 | 14 |

[a]Contributions >10% shown.

TABLE 4b

TD-DFT predicted vertical excitation energies, oscillator strengths (f > 0.01) and MO contributions (>10%) for 3a.

| No. | E/eV | f | MO contribution |
|---|---|---|---|
| 1 | 1.48 | 0.023 | H-1 → L + 1 (10%), HOMO → LUMO (79%) |
| 5 | 1.60 | 0.078 | H-1 → LUMO (47%), HOMO → L + 1 (30%) |
| 6 | 1.64 | 0.056 | H-1 → L + 1 (49%), H-1 → L + 3 (16%) |
| 7 | 1.73 | 0.048 | H-1 → L + 2 (51%), H-1 → L + 3 (20%) |
| 8 | 1.75 | 0.029 | H-1 → L + 2 (12%), H-1 → L + 3 (36%), HOMO → L + 2 (19%), HOMO → L + 3 (16%) |
| 11 | 2.11 | 0.013 | H-2 → LUMO (50%), H-1 → L + 4 (34%) |
| 12 | 2.13 | 0.025 | H-2 → LUMO (21%), H-1 → L + 4 (48%), H-1 → L + 5 (22%) |
| 13 | 2.15 | 0.039 | H-2 → LUMO (11%), H-1 → L + 5 (67%) |
| 14 | 2.24 | 0.145 | H-2 → L + 2 (78%) |
| 15 | 2.24 | 0.161 | H-2 → L + 3 (81%) |
| 16 | 2.45 | 0.077 | H-3 → LUMO (84%) |
| 17 | 2.47 | 0.062 | H-3 → L + 1 (76%) |
| 18 | 2.48 | 0.011 | H-2 → L + 1 (31%), HOMO → L + 6 (40%) |
| 23 | 2.59 | 0.026 | H-4 → LUMO (49%), H-2 → L + 4 (17%), H-2 → L + 5 (13%) |
| 24 | 2.60 | 0.011 | H-4 → LUMO (11%), H-4 → L + 1 (14%), H-2 → L + 4 (29%), H-2 → L + 5 (12%), H-1 → L + 6 (11%), HOMO → L + 7 (20%) |
| 25 | 2.62 | 0.060 | H-4 → L + 1 (45%), H-1 → L + 6 (10%), HOMO → L + 7 (17%) |
| 26 | 2.63 | 0.060 | H-2 → L + 4 (42%), H-1 → L + 7 (10%), HOMO → L + 7 (13%) |
| 27 | 2.64 | 0.045 | H-2 → L + 5 (56%), H-1 → L + 7 (11%), HOMO → L + 7 (10%) |
| 28 | 2.69 | 0.057 | H-4 → L + 2 (15%), H-1 → L + 7 (57%) |
| 29 | 2.73 | 0.087 | H-4 → L + 2 (27%), H-4 → L + 3 (45%), H-3 → L + 2 (10%) |
| 32 | 2.88 | 0.022 | H-1 → L + 9 (13%), HOMO → L + 8 (37%), HOMO → L + 9 (11%), HOMO → L + 11 (14%) |
| 35 | 3.02 | 0.011 | H-3 → L + 4 (79%) |
| 37 | 3.06 | 0.057 | H-2 → L + 6 (23%), H-1 → L + 8 (29%), H-1 → L + 9 (11%), H-1 → L + 10 (24%) |
| 38 | 3.07 | 0.008 | H-2 → L + 6 (70%), H-1 → L + 8 (11%) |
| 40 | 3.11 | 0.059 | H-1 → L + 8 (22%), H-1 → L + 9 (34%), HOMO → L + 9 (12%) |
| 42 | 3.18 | 0.039 | H-4 → L + 4 (83%) |
| 43 | 3.20 | 0.049 | H-4 → L + 5 (81%) |

TABLE 4c

TD-DFT predicted vertical excitation energies, oscillator strengths (f > 0.01) and MO contributions (>10%) for 3b.

| No. | E/eV | f | MO contribution |
|---|---|---|---|
| 1 | 1.44 | 0.018 | H-1 → L + 1 (18%), HOMO → LUMO (80%) |
| 3 | 1.56 | 0.069 | H-1 → LUMO (43%), HOMO → L + 1 (48%) |
| 4 | 1.60 | 0.046 | H-1 → L + 1 (75%), HOMO → LUMO (16%) |
| 7 | 1.77 | 0.054 | H-1 → L + 3 (71%), HOMO → L + 2 (21%) |
| 8 | 1.79 | 0.041 | H-1 → L + 2 (53%), HOMO → L + 3 (34%) |
| 9 | 2.02 | 0.014 | H-2 → LUMO (41%), HOMO → L + 5 (54%) |
| 11 | 2.04 | 0.048 | H-2 → LUMO (47%), H-1 → L + 4 (16%), HOMO → L + 5 (33%) |
| 13 | 2.12 | 0.039 | H-1 → L + 4 (78%), HOMO → L + 5 (11%) |
| 14 | 2.22 | 0.164 | H-2 → L + 1 (10%), H-2 → L + 2 (81%) |
| 15 | 2.23 | 0.099 | H-2 → L + 3 (88%) |

TABLE 4c-continued

TD-DFT predicted vertical excitation energies, oscillator strengths (f > 0.01) and MO contributions (>10%) for 3b.

| No. | E/eV | f | MO contribution |
|---|---|---|---|
| 16 | 2.41 | 0.021 | H-4 → LUMO (13%), H-2 → L + 1 (53%) |
| 17 | 2.43 | 0.063 | H-3 → LUMO (88%) |
| 18 | 2.46 | 0.031 | H-4 → LUMO (18%), H-3 → L + 1 (78%) |
| 21 | 2.57 | 0.019 | H-2 → L + 4 (82%) |
| 22 | 2.59 | 0.077 | H-4 → L + 1 (63%), HOMO → L + 7 (13%) |
| 24 | 2.62 | 0.052 | H-4 → LUMO (32%), H-3 → L + 2 (15%), H-2 → L + 5 (13%), H-1 → L + 7 (13%) |
| 25 | 2.63 | 0.047 | H-4 → L + 3 (10%), H-3 → L + 2 (68%) |
| 26 | 2.65 | 0.051 | H-4 → L + 2 (22%), H-3 → L + 3 (61%) |
| 30 | 2.75 | 0.022 | H-4 → L + 3 (25%), H-1 → L + 7 (42%), HOMO → L + 8 (19%) |
| 33 | 2.83 | 0.171 | H-4 → L + 2 (38%), H-3 → L + 3 (15%), H-1 → L + 8 (27%), HOMO → L + 9 (10%) |
| 34 | 2.88 | 0.056 | H-4 → L + 3 (49%) |
| 36 | 2.96 | 0.026 | H-1 → L + 9 (15%), H-1 → L + 11 (23%), HOMO → L + 10 (37%) |
| 37 | 3.05 | 0.025 | H-4 → L + 5 (11%), H-3 → L + 4 (86%) |
| 38 | 3.05 | 0.010 | H-4 → L + 4 (11%), H-3 → L + 5 (86%) |
| 41 | 3.19 | 0.019 | H-4 → L + 4 (59%), H-2 → L + 7 (24%) |
| 42 | 3.20 | 0.041 | H-4 → L + 5 (82%) |

Figure 17:
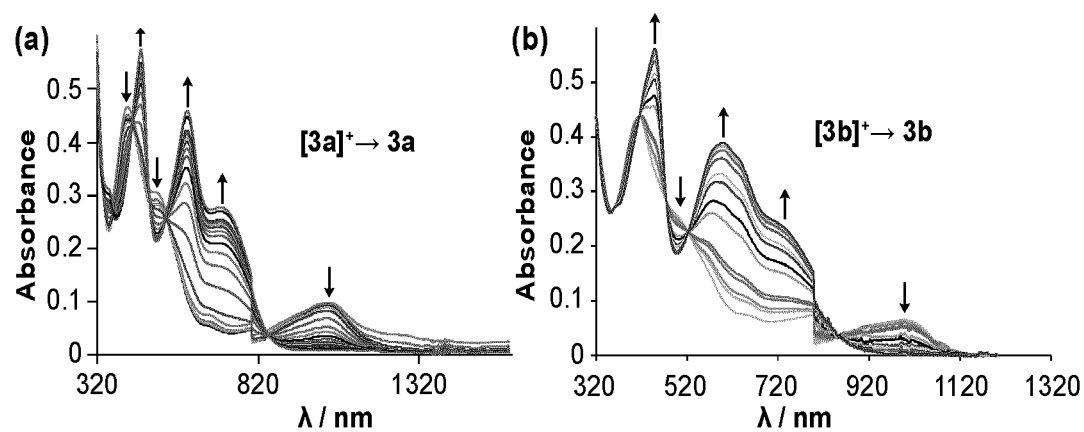
FIG. 17 shows examples of UV-Vis/NIR absorption spectra of (a) [3a][PF$_6$] and (b) [3b][PF$_6$] in 0.3 M nBu$_4$NPF$_6$ CH$_3$CN solution, with reductive potentials applied from −0.1 to −0.5 V.

In the one-electron oxidized complexes ([3a-b]PF$_6$) most of the absorptive cross-section was attenuated between 600-800 nm, in agreement with the loss of low-energy PALCT transitions. Broad and strong absorptions (ε~10-20 mM$^{-1}$cm$^{-1}$) were evident at ~410 and 510 nm. TD-DFT assigns these bands to CT transitions involving ligand π* acceptor orbitals (Tables 5a-c). LMCT/π$_{anti-bonding}$-to-metal CT-type transitions involving the singly occupied MO of [3a-b]$^+$ as the acceptor orbital appear at very low energy ($\lambda_{max}$~1000 nm). All features of the steady-state spectra of [3a-b]$^{0/+}$ were reproduced by spectroelectrochemistry (FIG. 17).

Corroborating data for [3a-b]$^{0/+}$ were also obtained for model complex 3e$^{0/+}$ where the tBu and CF$_3$ substituents of [3a-b]$^{0/+}$ have been replaced with a hydrogen (H). Results are consistent across the series.

TABLE 5a

TD-DFT calculated excitation energies, oscillator strengths and MO characters for [3e$^+$]. Only transitions with oscillator strengths greater than 0.07 are shown.

| Transition | $\lambda_{calc}$ (nm) | Oscillator Strength | Assignment | % Contribution$^a$ |
|---|---|---|---|---|
| 4 | 976.71 | 0.1101 | βHOMO-1 → βLUMO | 49 |
| | | | βHOMO → βLUMO | 28 |
| | | | βHOMO-3 → βLUMO | 15 |

TABLE 5a-continued

TD-DFT calculated excitation energies, oscillator strengths and MO characters for [3e$^+$]. Only transitions with oscillator strengths greater than 0.07 are shown.

| Transition | $\lambda_{calc}$ (nm) | Oscillator Strength | Assignment | % Contribution$^a$ |
|---|---|---|---|---|
| 16 | 518.55 | 0.3593 | βHOMO → βLUMO + 1 | 36 |
| | | | αHOMO → αLUMO | 32 |
| 18 | 490.60 | 0.1524 | βHOMO → βLUMO + 2 | 36 |
| | | | βHOMO → βLUMO + 1 | 14 |
| | | | αHOMO → αLUMO | 12 |
| 24 | 447.50 | 0.2118 | βHOMO-6 → βLUMO | 21 |
| | | | αHOMO-1 → αLUMO | 20 |
| | | | βHOMO-4 → βLUMO | 17 |
| | | | βHOMO-5 → βLUMO | 15 |
| 27 | 443.39 | 0.0961 | βHOMO-5 → βLUMO | 31 |
| 30 | 426.50 | 0.0781 | αHOMO-1 → αLUMO + 1 | 43 |
| | | | αHOMO-1 → αLUMO + 2 | 11 |
| 40 | 387.92 | 0.929 | βHOMO-1 → βLUMO + 4 | 25 |
| | | | βHOMO → βLUMO + 6 | 15 |
| | | | αHOMO → αLUMO + 6 | 12 |
| | | | βHOMO-1 → βLUMO + 2 | 10 |
| 58 | 347.60 | 0.0854 | αHOMO → αLUMO + 8 | 11 |
| | | | αHOMO → αLUMO + 9 | 10 |

TABLE 5b

TD-DFT predicted vertical excitation energies, oscillator strengths (f > 0.01) and MO contributions (>10%) for [3a]$^+$.

| No. | E/eV | f | MO contributions |
|---|---|---|---|
| 3 | 1.17 | 0.058 | H-2(B) → LUMO(B) (96%) |
| 9 | 1.91 | 0.034 | HOMO(A) → LUMO(A) (60%), HOMO(B) → L + 2(B) (10%), HOMO(B) → L + 4(B) (11%) |
| 10 | 1.96 | 0.019 | H-1(A) → LUMO(A) (28%), HOMO(A) → L + 1(A) (29%), H-6(B) → LUMO(B) (21%), HOMO(B) → L + 1(B) (12%) |
| 13 | 2.03 | 0.015 | H-1(A) → L + 5(A) (17%), HOMO(B) → L + 7(B) (32%) |
| 21 | 2.22 | 0.068 | H-6(B) → LUMO(B) (71%) |
| 24 | 2.32 | 0.040 | H-7(B) → LUMO(B) (65%), H-1(B) → L + 3(B) (15%) |
| 27 | 2.39 | 0.121 | H-1(B) → L + 3(B) (71%) |
| 29 | 2.43 | 0.066 | H-1(B) → L + 4(B) (83%) |
| 31 | 2.53 | 0.018 | HOMO(A) → L + 5(A) (32%), H-2(B) → L + 1(B) (48%) |
| 33 | 2.60 | 0.026 | HOMO(A) → L + 4(A) (79%) |

TABLE 5b-continued

TD-DFT predicted vertical excitation energies, oscillator strengths (f > 0.01) and MO contributions (>10%) for [3a]+.

| No. | E/eV | f | MO contributions |
|---|---|---|---|
| 35 | 2.64 | 0.013 | H-2(B) → L + 3(B) (90%) |
| 38 | 2.69 | 0.012 | H-1(A) → L + 4(A) (35%), HOMO(A) → L + 7(A) (10%), H-2(B) → L + 4(B) (14%) |
| 39 | 2.71 | 0.013 | H-1(A) → L + 4(A) (18%), HOMO(A) → L + 7(A) (30%), H-3(B) → L + 1(B) (21%) |
| 47 | 2.80 | 0.044 | H-2(A) → L + 2(A) (36%), H-1(A) → L + 5(A) (18%), HOMO(A) → L + 7(A) (16%) |
| 48 | 2.84 | 0.088 | H-2(A) → L + 2(A) (33%), H-1(A) → L + 5(A) (25%), HOMO(A) → L + 7(A) (16%) |

TABLE 5c

TD-DFT predicted vertical excitation energies, oscillator strengths (f > 0.01) and MO contributions (>10%) for [3b]+.

| No. | E/eV | f | MO contributions |
|---|---|---|---|
| 3 | 1.19 | 0.056 | H-2(B) → LUMO(B) (96%) |
| 9 | 1.91 | 0.026 | HOMO(A) → LUMO(A) (55%), HOMO(B) → L + 4(B) (20%) |
| 10 | 1.97 | 0.026 | HOMO(A) → L + 1(A) (66%) |
| 13 | 2.07 | 0.012 | HOMO(A) → L + 2(A) (22%), H-1(B) → L + 1(B) (17%), HOMO(B) → L + 4(B) (18%), HOMO(B) → L + 7(B) (11%) |
| 15 | 2.08 | 0.018 | H-1(A) → L + 1(A) (70%) |
| 22 | 2.28 | 0.016 | H-3(A) → L + 7(A) (10%), H-1(A) → L + 7(A) (17%), HOMO(A → L + 5(A) (10%), H-6(B) → LUMO(B) (18%), HOMO(B) → L + 9(B) (18%) |
| 23 | 2.28 | 0.030 | H-6(B) → LUMO(B) (47%) |
| 24 | 2.29 | 0.039 | H-1(B) → L + 2(B) (72%) |
| 26 | 2.38 | 0.013 | H-7(B) → LUMO(B) (20%), H-1(B) → L + 3(B) (70%) |
| 28 | 2.44 | 0.129 | H-7(B) → LUMO(B) (64%), H-1(B) → L + 3(B) (11%) |
| 29 | 2.47 | 0.043 | H-1(B) → L + 4(B) (80%) |
| 31 | 2.53 | 0.030 | HOMO(A) → L + 5(A) (34%), H-2(B) → L + 1(B) (42%) |
| 32 | 2.56 | 0.012 | H-2(B) → L + 2(B) (91%) |
| 33 | 2.60 | 0.020 | HOMO(A) → L + 4(A) (78%), HOMO(B) → L + 6(B) (10%) |
| 37 | 2.68 | 0.024 | H-2(A) → L + 1(A) (17%), H-2(B) → L + 3(B) (68%) |
| 38 | 2.69 | 0.013 | H-1(A) → L + 4(A) (37%), HOMO(A) → L + 7(A) (11%), H-3(B) → L + 1(B) (18%) |
| 40 | 2.71 | 0.012 | HOMO(A) → L + 7(A) (42%), H-3(B) → L + 1(B) (20%), HOMO(B) → L + 7(B) (13%) |
| 43 | 2.75 | 0.013 | H-1(A) → L + 6(A) (61%), H-3(B) → L + 2(B) (20%) |
| 44 | 2.75 | 0.012 | H-2(A) → L + 1(A) (36%), H-1(A) → L + 6(A) (26%), H-3(B) → L + 2(B) (17%), H-2(B) → L + 3(B) (12%) |
| 45 | 2.79 | 0.045 | H-2(A) → LUMO(A) (26%), H-2(A) → L + 2(A) (13%), HOMO(A) → L + 7(A) (10%) |
| 47 | 2.84 | 0.068 | H-2(A) → L + 2(A) (19%), H-1(A) → L + 5(A) (20%), HOMO(B) → L + 8(B) (20%) |
| 48 | 2.86 | 0.017 | H-3(B) → L + 3(B) (52%), HOMO(B) → L + 8(B) (34%) |
| 49 | 2.86 | 0.013 | H-2(A) → L + 3(A) (21%), H-1(B) → L + 5(B) (61%) |

Transient differential pump-probe spectra were collected to investigate the excited state dynamics of 3a-c. Solutions were excited into the lower energy end of the broad charge-transfer manifold ($\lambda_{excitation}$=780 nm and 390 nm) and probed with broadband white light.

Experimental Details—Transient Differential Pump-Probe Spectra

All samples were handled and prepared in a glovebox under Ar atmosphere. During spectroscopic measurements, solutions were also kept under Ar to prevent oxidation from exposure to air. UV-Vis spectra of solutions measured before and after the transient absorption laser experiments did not indicate any spectral changes, verifying the samples did not degrade during the time-resolved laser measurements. The pump-probe measurements were made using a Clark MXR CPA-2001 Ti:Sapphire laser system generating 150 fs laser pulses of 780 nm wavelength fundamental output with 1 kHz repetition rate, 50 µW power. The 780 nm fundamental wavelength was used to pump all samples. The probe beam was a white light continuum spanning 450-780 nm, generated by focusing 5% of the fundamental laser output into a sapphire crystal. A motorized delay stage controlled the relative time differentials between pump and probe pulses from time zero, when pump and probe pulse traverse the sample simultaneously, to 3 ns. The differential spectra were averaged over 3 seconds for each delay time point recorded and chirp corrected.

Figure 21:
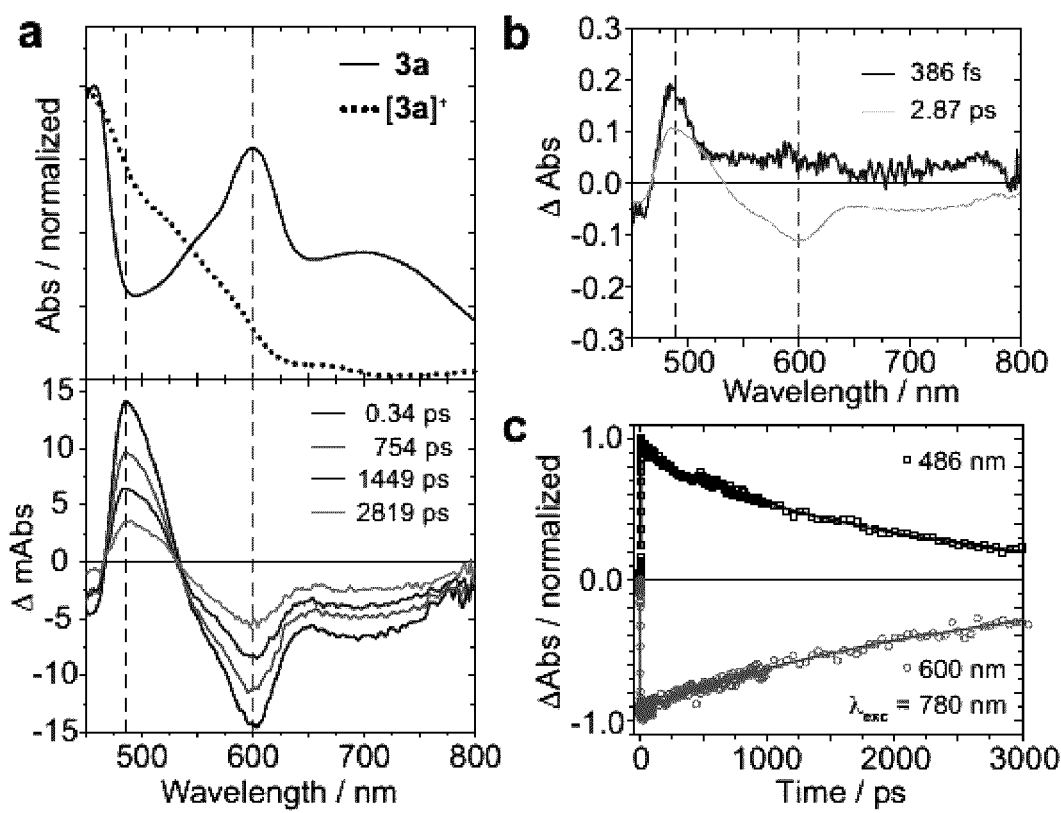
FIG. 21 shows examples of (a) steady-state absorption spectrum of $[3a]^{0/+}$ (top) and transient absorption (TA) spectra (bottom) of 3c in toluene at indicated time delays. (b) Global fit analysis principle components constructed from TA data. Spectra were generated using an excitation wavelength of 780 nm, as noted in the figure. The two shown components model the main spectral changes: appearance of the feature at 486 nm and formation of the transient bleaching. (c) Kinetic traces at indicated wavelengths (see legend) and exponential fits (solid lines, fitting results are summarized in Table 6a).
Figure 22:
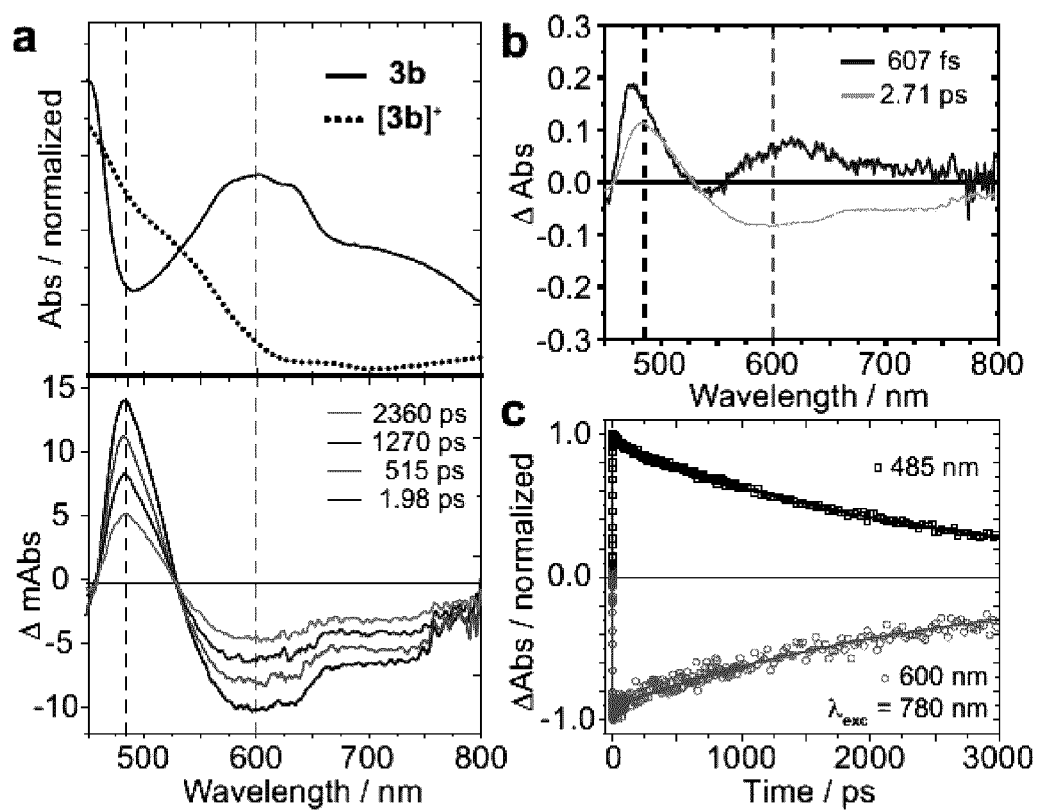
FIG. 22 shows examples of time-resolved absorption spectroscopy and excited state dynamics of 3b (a) steady-state absorption $[3b]^{0/+}$ (top) and transient absorption (TA) spectra (bottom) of 3b in toluene at indicated time delays. Spectra were generated using an excitation wavelength of 780 nm, as noted in the figure. The well-defined excited state absorption feature at 485 nm, which persists for nanoseconds, faithfully reproduces an absorption peak for $[3b]^+$ (black dashed line) in a region of reduced absorptive cross-section for 3b, highlighting the charge-transfer nature of the excited state. (b) Global fit analysis principle components constructed from TA data. The two shown components model the main spectral changes: a red shift of the 485 nm absorption and an increase and broadening of the transient bleach at 600 nm. (c) Kinetic traces (see legend) and exponential fits (solid lines, fitting results are summarized in Table 6a) following the decay of both the excited-state absorption and ground-state bleach at indicated wavelengths.
Figure 23:
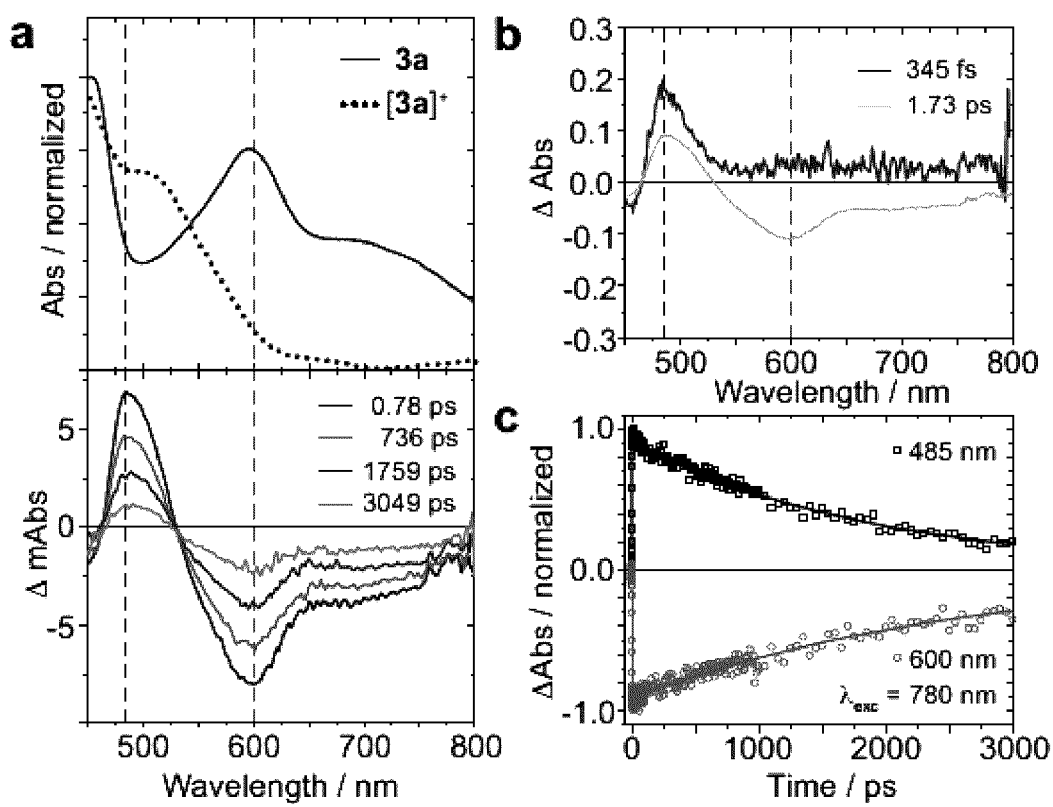
FIG. 23 shows examples of (a) steady-state absorption spectrum of $[3a]^{0/+}$ (top) and transient absorption (TA) spectra (bottom) of 3a in $CH_3CN$ at indicated time delays. (b) Global fit analysis principle components constructed from TA data. Spectra were generated using an excitation wavelength of 780 nm, as noted in the figure. The two shown components model the main spectral changes: a red shift of the initial ESA and formation of the transient bleaching. (c) Kinetic traces at indicated wavelengths (see legend) and exponential fits (solid lines, fitting results are summarized in Table 6a).

Similar features were observed for all three complexes 3a-c. For 3b, using 780 nm excitation, at early delay times of <1 ps, an excited-state absorption (ESA) band centered at 472 nm was initially observed, followed by a slight red-shift to the ESA and establishment of the ground-state bleach (GSB) which reached maximum intensity at 1.98 ps. The steady-state UV-Vis spectrum shows three main features at wavelengths greater than 400 nm—these are the broad transient bleaching features observed in the time-resolved spectra (toluene solution; FIG. 22). The broad GSB at 600 nm overlapped somewhat with the sharp ESA feature at 485 nm. From 1.98 ps to 3 ns, the ESA broadened slightly, which was attributed to the GSB weakening over this same period. The transient spectral features of 3a (toluene solution; FIG. 21) are similar to that of 3b, with rapid formation of a long-lived ESA at 486 nm within the first picosecond in toluene. This accompanies formation of a transient bleaching that reaches maximum intensity at 0.34 ps delay time. This is attributed to formation of a triplet state charge-transfer state ($^3$MLCT-like, here PALCT in character) from an initially formed 1 MLCT one, consistent with a fast rate of intersystem crossing (ISC) as is typically observed for iron polypyridyl complexes. At ~1.1 ps, both the ESA and GSB then decay with lifetimes of 2.0 and 2.6 ns, respectively (Table 6a). Principle component analysis illustrates these spectral changes, with Component 1 showing the initial excited state evolving to the long-lived PALCT state represented by Component 2. The principle component features of 3a and 3b are similar suggesting similar processes occur for both iron complexes. The most prominent features in the long-lived spectra observed by TA for 3a again match those of the singly oxidized [3a]$^+$.

TABLE 6a

Time constants obtained from fitting kinetics traces at indicated wavelengths with single exponential decay functions (780 nm excitation; see FIGS. 21-26).

| Compound | Solvent | $\lambda_{obs}$ (nm) | $T_{decay}$ (ps) |
|---|---|---|---|
| 3a | Toluene | 486 | 2041 ± 23 |
|    |         | 600 | 2625 ± 35 |
|    | Acetonitrile | 485 | 1866 ± 33 |
|    |              | 600 | 2614 ± 47 |
|    | THF | 489 | 2499 ± 20 |
|    |     | 600 | 2695 ± 42 |
| 3b | Toluene | 485 | 2454 ± 13 |
|    |         | 600 | 2669 ± 41 |
|    | Acetonitrile | 483 | 2221 ± 14 |
|    |              | 600 | 2562 ± 38 |
|    | THF | 483 | 2717 ± 23 |
|    |     | 600 | 2801 ± 41 |

To assign the nature of the excited states responsible for both the ESA and the GSB, the experimental transient spectra can be compared to those of the corresponding oxidized or reduced complexes (Brown, A. M., McCusker, C. E. & McCusker, J. K. Spectroelectrochemical identification of charge-transfer excited states in transition metal-based polypyridyl complexes. *Dalton Trans.* 2014, 43, 17635-17646). The potentials necessary to reduce 3a-b were quite negative (3a: −2.4 V; 3b: −2.2 V vs FcH$^{0/+}$) and overlapped with a second, irreversible reduction. As such, electrochemically generated spectra of the reduced species [3a-b]$^-$ could not be obtained. Nevertheless, the oxidized species [3a-b]$^+$ presented distinctive optical markers with which charge-transfer states may be distinguished from non-redox, ligand field ones. Notably, the well-defined ESA feature at 485 nm faithfully reproduced an absorption peak observed for [3b]$^+$ assigned to PALCT transitions in a region of reduced absorptive cross-section for 3b (see FIGS. 21 and 22). This feature can confidently be attributed to the redox nature of a charge-transfer state (Fatur, S. M., Shepard, S. G., Higgins, R. F., Shores, M. P. & Damrauer, N. H. A Synthetically tunable system to control MLCT excited-state lifetimes and spin states in iron(II) polypyridines. *J. Am. Chem. Soc.* 2017, 139, 4493-4505). Similarly, the strong bleach observed between 550-750 nm coincides with the loss of broad, panchromatic absorptive cross-section from 3b upon oxidation; [3b]$^+$ does not absorb at all over this spectral range. In comparison, the bleach of features close to 450 nm was not as pronounced, indicative of a trade-off in spectral intensity in this region upon oxidation, with the growth of a peak at 416 nm in [3b]$^+$ compensating for reduction of an absorption at 451 nm in 3b. Experimental limitations prevented acquisition of data in the region of the low energy absorption at 1000 nm.

The ESA and GSB fit equally well to single exponent rise and decay functions (FIGS. 21c and 22c). The rise of the ESA was faster than the instrument response time of 150 fs, consistent with the rapid formation of a 1 MLCT-like state and subsequent population of a $^3$MLCT-type one (Aubock, G. & Chergui, M. Sub-50-fs photoinduced spin crossover in [Fe(bpy)$_3$]$^{2+}$ *Nat. Chem.* 2015, 7, 629-633). Intersystem crossing to a $^3$MLCT state within tens of femtoseconds of population of a $^1$MLCT state has been established for a range of Fe(II) polypyridyl complexes, including [Fe(bpy)]$_3^{2+}$ (Gawelda, W. et al. Ultrafast nonadiabatic dynamics of [Fe$^{II}$(bpy)$_3$]$^{2+}$ in solution. *J. Am. Chem. Soc.* 2007, 129, 8199-8206). Global fit analysis identified two principle components in the TA spectra that resemble the characteristic spectra at 607 fs and 2.71 ps (FIG. 4b). An initial ESA was centered at 472 nm at 607 fs without a GSB, and at 2.71 ps the ESA has started to decay with the GSB fully established at 600 nm by that time. Decay of both the ESA and bleaching indicates a long-lived CT excited state with a lifetime of >2 ns for both 3a and 3b (Table 1). This is competitive with the longest lived charge-transfer excited states reported for LMCT excited states of Fe(III) complexes (Kjær, K. S.; et al. Luminescence and reactivity of a charge-transfer excited iron complex with nanosecond lifetime. *Science* 2019, 363, 249), and well beyond the MLCT lifetimes of Fe(II) analogues (Chabera, P. et Fe(II) hexa N-heterocyclic carbene complex with a 528 ps metal-to-ligand charge-transfer excited-state lifetime. *J. Phys. Chem. Lett.* 2018, 9, 459-463).

Figure 24:
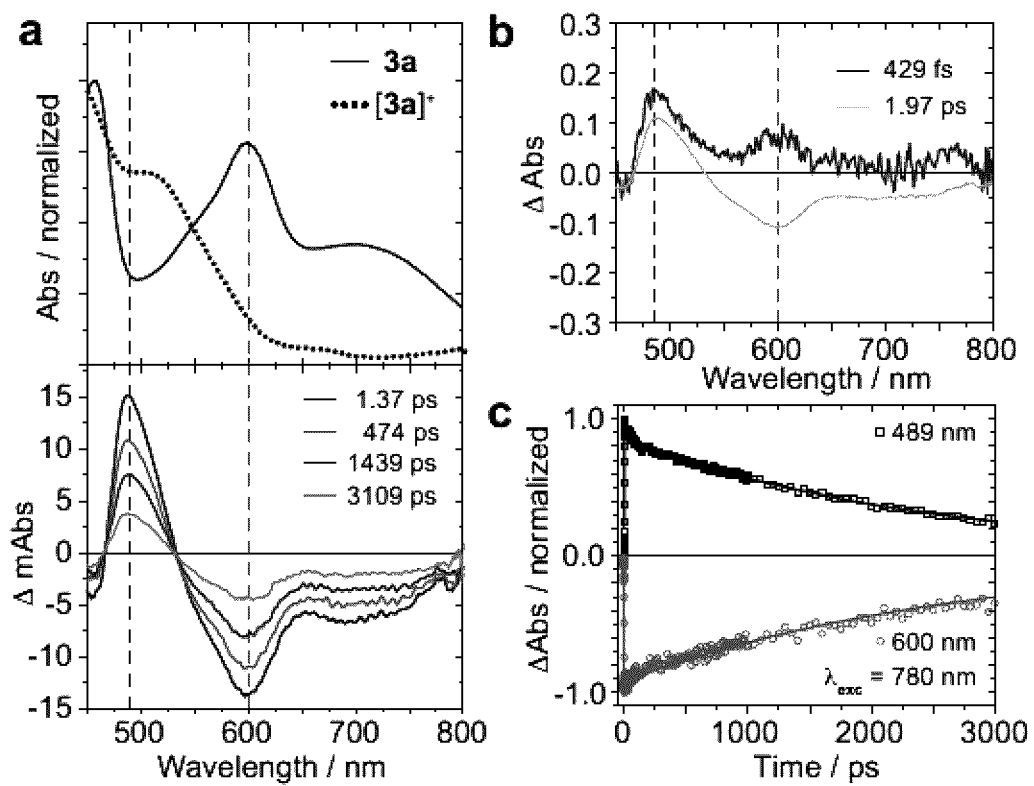
FIG. 24 shows examples of (a) steady-state absorption spectrum of $[3a]^{0/+}$ (top) and transient absorption (TA) spectra (bottom) of 3a in THF at indicated time delays. (b) Global fit analysis principle components constructed from TA data. Spectra were generated using an excitation wavelength of 780 nm, as noted in the figure. The two shown components model the main spectral changes: the initial ESA and formation of the transient bleaching. (c) Kinetic traces at indicated wavelengths (see legend) and exponential fits (solid lines, fitting results are summarized in Table 6a).
Figure 25:
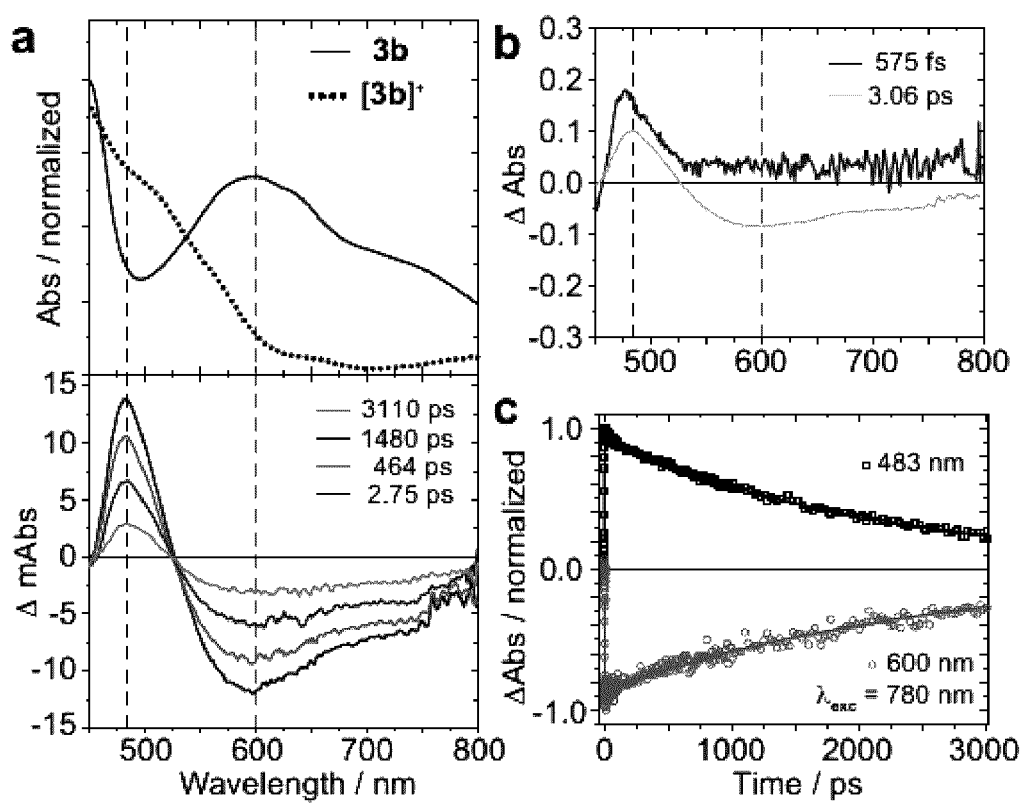
Figure 26:
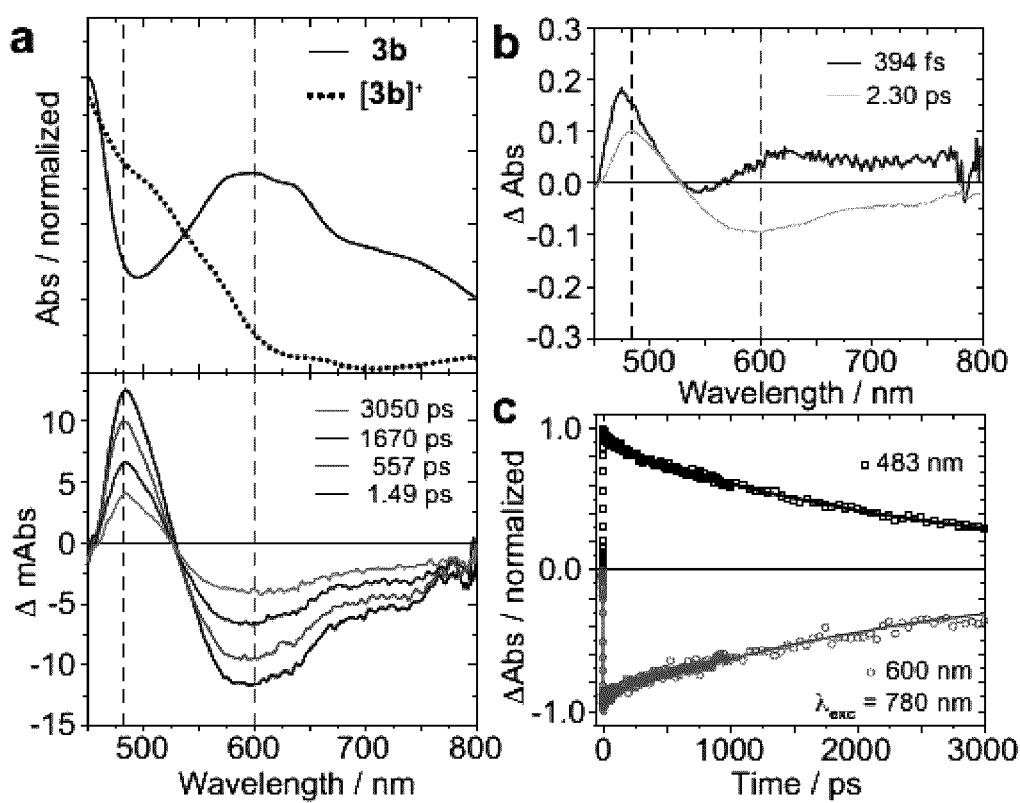
FIG. 26 shows examples of (a) steady-state absorption spectrum of $[3b]^{0/+}$ (top) and transient absorption (TA) spectra (bottom) of 3b in THF at indicated time delays. (b) Global fit analysis principle components constructed from TA data. Spectra were generated using an excitation wavelength of 780 nm, as noted in the figure. The two shown components model the main spectral changes: a red shift of the initial ESA and formation of the transient bleaching. (c) Kinetic traces at indicated wavelengths (see legend) and exponential fits (solid lines, fitting results are summarized in Table 6a).

Transient differential pump-probe spectra were collected for 3a-b in additional solvents to investigate any solvent dependence to the charge-transfer lifetimes (see FIGS. 21-26, Table 6a). Acetonitrile (FIG. 23 and FIG. 25) and tetrahydrofuran (THF; FIG. 24 and FIG. 26) solutions were excited into the lower energy end of the broad charge-transfer manifold ($\lambda_{excitation}$=780 nm) and probed with broadband white light. Similar transient spectral features are observed for both complexes, in all solvents (see FIGS. 23-26), with the most prominent features in the long-lived spectra observed by TA matching those of the singly oxidized complexes in their respective solvents. For 3a, the bleach lifetimes are all very similar, regardless of solvent (Table 7). For 3b, there is a little more variance, but all of them are still very similar. Solvent polarity does not appear to play a role in how the compounds relax. In the calculated electron-hole maps and NTOs, the symmetry of 3a-b means charge-transfer does not reorganize electron density in a strictly linear fashion. Accordingly, large changes in dipole moments are not expected and there is little solvent dependence of the CT lifetimes.

Recent theoretical and experimental work has shown that the excited state landscape of Fe(II) coordination complexes can be complex, as a high density of states and unexpectedly large spin-orbit coupling can enable spin-forbidden channels and render competitive different deactivation pathways (Ashley, D. C. & Jakubikova, E. Ironing out the photochemical and spin-crossover behavior of Fe(II) coordination compounds with computational chemistry. *Coord. Chem. Rev.*

Figure 27:
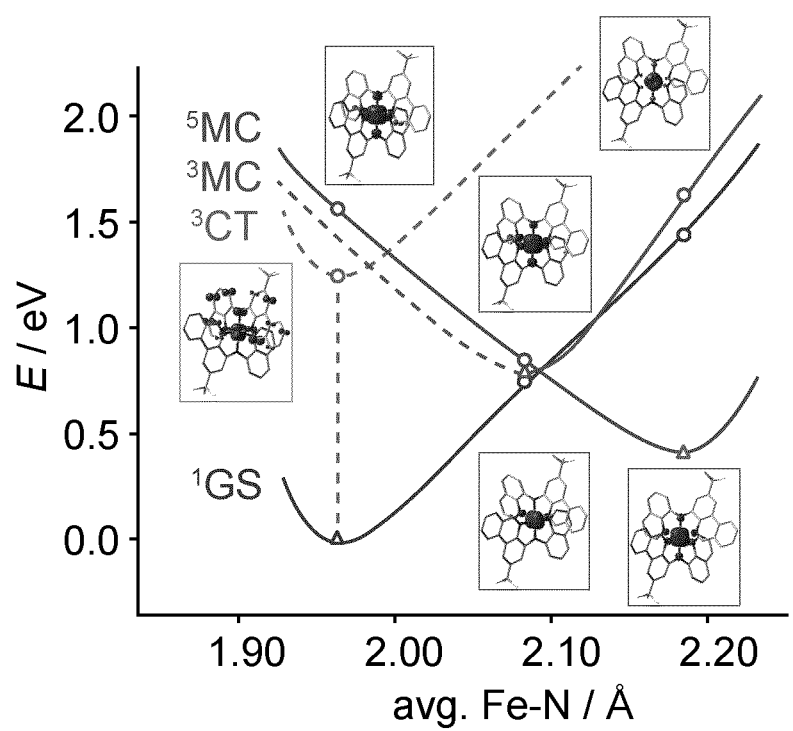
FIG. 27 shows examples of potential energies and average Fe—N equilibrium bond lengths for relevant electronic states of 3b (triangles) and potential surfaces (lines) drawn through the energy of each state at the geometry of the two other states (circles). Spin density maps (isosurface=0.004; see Table 7) are overlaid next to the relevant data points.

2017, 337, 97-111 and Francés-Monerris, A. et al. Synthesis and computational study of a pyridylcarbene Fe(II) complex: Unexpected effects of fac/mer isomerism in metal-to-ligand triplet potential energy surfaces. *Inorg. Chem.* 2018, 57, 10431-10441). In a simplified picture, $^3$MLCT states of Fe(II) coordination complexes are usually considered to decay via $^3$MLCT→$^3$MC→$^5$MC pathways, although the extent of participation of the typically highly distorted quintet state can depend on the ligand field. Here, DFT revealed that the lowest-lying metal-centered triplet ($^3$MC) and quintet ($^5$MC) states are destabilized with respect to the ground-state minimum (FIG. 27) The lowest-lying triplet excited state in the ground state geometry is calculated to have substantial charge-transfer character with diminished spin density at Fe (Table 7). The increased energies of the lowest-lying MC excited states suggest that the nanosecond CT lifetimes are attributable to an increase in the activation barrier for the decay of the MLCT-type state (here, $^3$PALCT) to $^3$MC and lower-lying $^5$MC states, respectively.

TABLE 7

Quantum chemically calculated properties of 3b. Calculated properties include relative total energies ($E_{rel}$) in eV, average Fe—N bond distances in Å (Avg. Fe—N), and Mulliken Spin Densities on iron (SD(Fe)).

| Geometry | State | $E_{rel}$/eV | Avg. Fe—N/Å | SD (Fe) |
|---|---|---|---|---|
| $^1$3b (ground state) | $^1$3b | 0.00 | 1.963 | — |
| | $^3$3b | 1.25 | | 0.82 |
| | $^5$3b | 1.56 | | 3.87 |
| $^3$3b (triplet, $^3$T) | $^1$3b | 0.75 | 2.083 | — |
| | $^3$3b | 0.80 | | 2.08 |
| | $^5$3b | 0.84 | | 3.78 |
| $^5$3b (quintet, $^5$Q) | $^1$3b | 1.44 | 2.185 | — |
| | $^3$3b | 1.63 | | 2.22 |
| | $^5$3b | 0.41 | | 4.21 |

Experimentally, the strong ESA features observed in the time-resolved spectra of 3a-b are also inconsistent with long-lived metal-centered triplets or quintets. $^3$MC states for Fe systems are typically spectroscopically elusive.[27] Similarly, formation of a metal-centered quintet state tends to result in significant attenuation of optical density ($\Delta\varepsilon$~10$^3$ M$^{-1}$cm$^{-1}$) as σ-anti-bonding $e_g$-type orbitals are populated.[48] For example, in [Fe(terpy)$_2$]$^{2+}$ and [Fe(bpy)$_3$]$^{2+}$ excited-state thermalization increases N—Fe distances by –0.2 Å which in turn decreases metal-ligand overlap, reducing MLCT peak intensity.[42] For [Fe(terpy)$_2$]$^{2+}$, the rapid formation and decay of a charge-transfer state into a ligand-field state was also established using TA, with assignment of CT character similarly made by correlating excited state features with electrochemically-generated ones.[42] In that case, the diagnostic marker of a charge-separated species (a reduced terpy$^-$ signal) decayed rapidly within the first picosecond of the evolution of the excited state. For 3a-b, the ESA at 485 nm persisted for nanoseconds.

The quintet state predicted by DFT presents long average N—Fe distances compared with the ground state. As a result of this strong distortion, such states do not appear to play a significant role in the decay cascade despite lying at relatively low energy. In comparison, the contraction of N$_{amido}$—Fe distances in 3a-b upon oxidation should also be replicated in charge-transfer excited states, maintaining close contacts with the chelating ligands and explaining the intensity of CT peaks observed by TA. This also portends greater photostability. Contrary to ligand-field and fully MLCT excited states (with depopulation of MOs with non-bonding character), metal-ligand interactions in 3a-b largely strengthen upon excitation as orbitals with anti-bonding character are depopulated. In addition, 7-extended phenanthridine based ligands have been shown to increase the rigidity of photoexcited Cu(I) complexes leading to blue-shifted emission compared with smaller quinoline congeners (Mondel, R., Lozada, I. B., Davis, R. L., Williams, J. A. G. & Herbert, D. E. Site-selective benzannulation of N-heterocycles in bidentate ligands leads to blue-shifted emission from [(P^N)Cu]$_2$(μ-X)$_2$ dimers. *Inorg. Chem.* 2018, 57, 4966-4978), The exceptionally long, nanosecond excited state CT lifetimes observed for 3a-b may also benefit from reduced conformational freedom, which could inhibit dynamic processes that lead to intersystem crossing and otherwise faster relaxation.

Transient differential pump-probe spectra using excitation light at the higher energy end of the broad charge-transfer manifold ($\lambda_{excitation}$=390 nm), then probed with broadband white light gave very similar features to the results using lower energy (780 nm) excitation. This supports the claim that the complexes represented in this invention can broadly absorb visible light for use in the applications name herein. To generate lower wavelength, higher energy light, a BBO crystal generated the second harmonics of the fundamental wavelength and was followed with two short-pass filters to pump samples at 390 nm. Similar to what is noted above, the probe beam was a white light continuum spanning 450-780 nm, generated by focusing 5% of the fundamental laser output into a sapphire crystal. A motorized delay stage controlled the relative time differentials between pump and probe pulses from time zero, when pump and probe pulse traverse the sample simultaneously, to 3 ns. The differential spectra were averaged over 3 seconds for each delay time point recorded and chirp corrected.

Analysis of TA Spectra; 780 nm Excitation

The higher energy (390 nm) excitation gave similar excited state lifetimes (Table 6b).

TABLE 6b

Time constants obtained from kinetics traces in toluene shown in FIG. 22 and FIG. 21 at indicated wavelengths, fit to single exponential decay functions. Excitation wavelength = 780 nm.

| Compound | $\lambda_{abs}$ (nm) | $\tau_{decay}$ (ps) |
|---|---|---|
| 3a | 486 | 2041 ± 23 |
|    | 600 | 2625 ± 35 |
| 3b | 485 | 2454 ± 13 |
|    | 600 | 2669 ± 41 |

Analysis of Transient Absorption (TA) Spectra of 3a-c: Higher Energy Excitation (390 nm)

Using higher energy excitation (390 nm), the transient spectral features of 3a and 3c (FIGS. 19 and 20) were still similar to that of 3b (FIG. 18), with initial formation of an excited state absorption (ESA) at 450 nm, which shifts 34 nm to 484 nm within the first picosecond. This accompanied formation of a transient bleaching that reached a maximum at 1.1 ps delay time. The initial fast decay of the ESA of at 450 nm coincided with the rise of the ground state bleaching (GSB) at 609 nm. This may reflect formation of a triplet state ($^3$MLCT-like) from an initially formed $^1$MLCT one, consistent with a fast rate of intersystem crossing (ISC) typically observed for iron polypyridyl complexes (Gawelda, W. et al. Ultrafast Nonadiabatic Dynamics of [Fe$^{II}$(bpy)$_3$]$^{2+}$ in Solution. *J. Am. Chem. Soc.* 129, 8199-8206 (2007); Shepard, S.

G., Fatur, S. M., Rappe, A. K. & Damrauer, N. H. Highly Strained Iron (II) Polypyridines: Exploiting the Quintet Manifold To Extend the Lifetime of MLCT Excited States. *J. Am. Chem. Soc.* 138, 2949-2952 (2016)). Both the ESA and GSB then decayed with lifetimes of 2.2 and 4.3 ns, respectively (FIG. 19b). The shorter lifetime of the ESA compared to the GSB is due to overlapping transient absorption and transient bleaching components and thus an overall weaker signal to noise ratio. Principle component analysis illustrates these spectral changes in FIG. 19c, with Component 1 showing the initial excited state evolving to the long-lived MLCT state represented by Component 2. The principle component features of 3a and 3b were indeed similar suggesting that similar processes occur for both iron complexes. The most prominent features in the long-lived spectra observed by TA for 3a again matched those of the singly oxidized complexes.

With respect to 3b, at early delay times of <1 ps, an excited-state absorption (ESA) band centered at 485 nm was observed, followed by a ground-state bleach (GSB) which reached maximum intensity at ~1.1 ps. While the steady-state UV-Vis spectrum showed three main features at wavelengths greater than 400 nm, a single, broad transient bleaching feature was mainly observed in the time-resolved spectra (FIG. 19a) at 617 nm and overlapped somewhat with the sharp ESA. From 1.1 to 3001 ps, the ESA red-shifted slightly and broadened, behavior (without being limited by theory) thought to be attributed to the GSB weakening over this period. The formation of the longer-lived GSB coincided with the decay component of the ESA at 485 nm. At higher energy excitation (390 nm), the ESA and bleaching (GBS) still indicate a long-lived excited state with a lifetime of ~4 ns (Table 7).

TABLE 7

Figure 18:
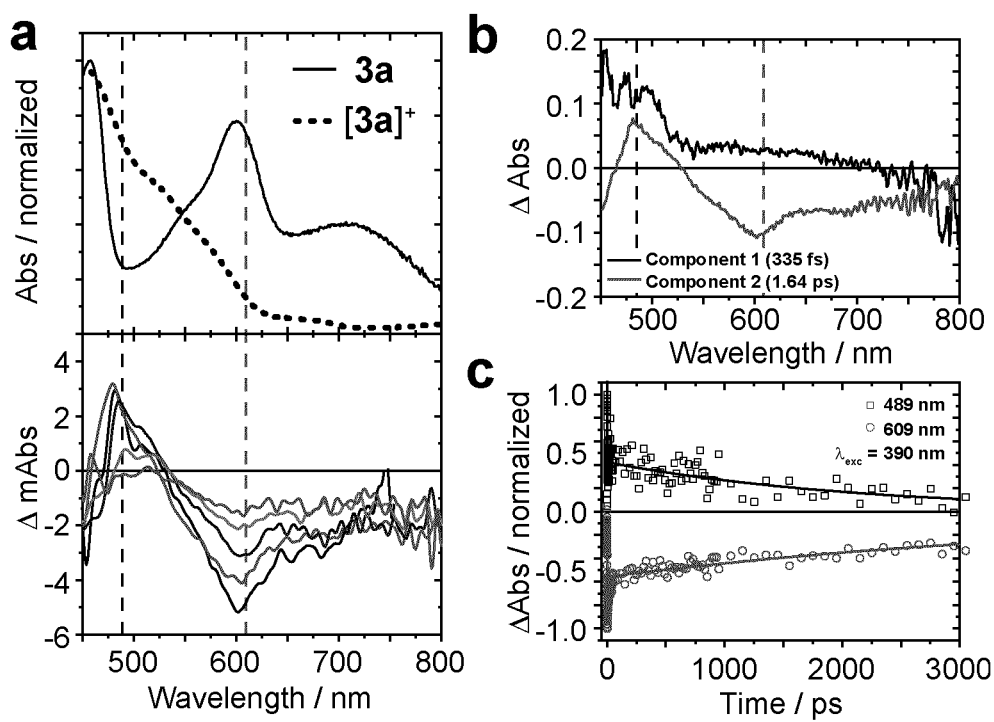
FIG. 18 shows examples of (a) steady-state absorption spectrum of [3a]$^{0/+}$ (top) and transient absorption (TA) spectra (bottom) of 3a in toluene at indicated time delays. (b) Global fit analysis principle components constructed from TA data. Spectra were generated using an excitation wavelength of 390 nm, as noted in the figure. The two shown components model the main spectral changes: a blue shift of the initial 489 nm absorption and formation of the transient bleaching. (c) Kinetic traces at indicated wavelengths (see legend) and exponential fits (solid lines, fitting results are summarized in Table 6). The fast initial decay at 489 nm coincides with the rise of the bleach signal at 609 nm.
Figure 19:
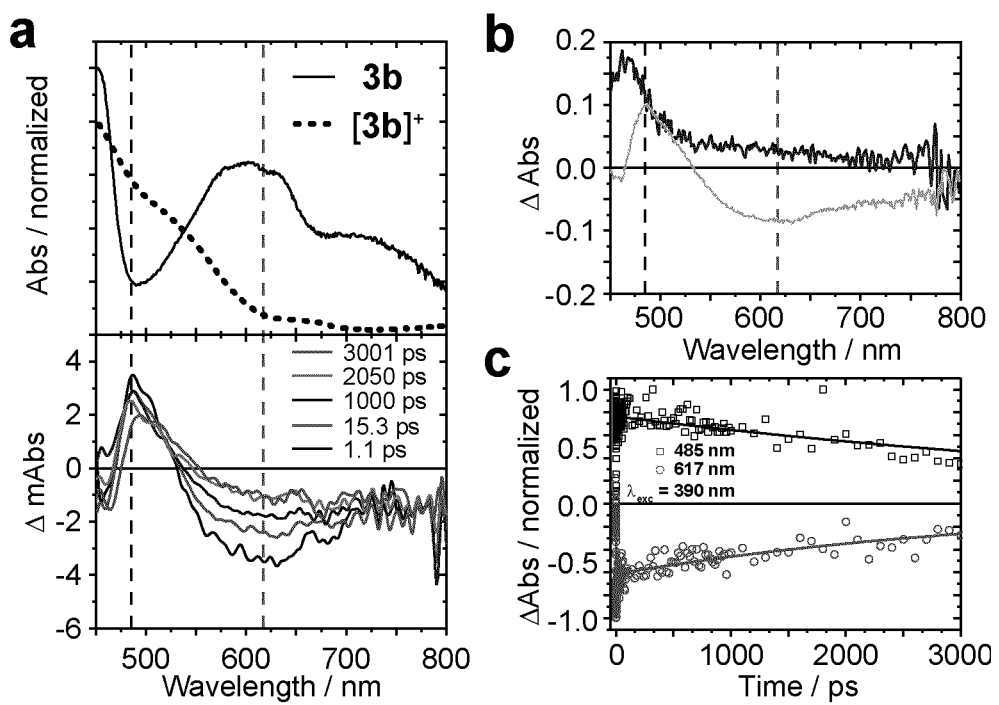
FIG. 19 shows examples of (a) steady-state absorption spectrum of [3b]$^{0/+}$ (top) and transient absorption (TA) spectra (bottom) of 3b in toluene at indicated time delays. (b) Global fit analysis principle components constructed from TA data. Spectra were generated using an excitation wavelength of 390 nm, as noted in the figure. The two shown components shown model the main spectral changes: A shift of the 485 nm absorption and an increase and broadening of the transient bleach at 617 nm. (c) Kinetic traces at indicated wavelengths (see legend) and exponential fits (solid lines, fitting results are summarized in Table 6).
Figure 20:
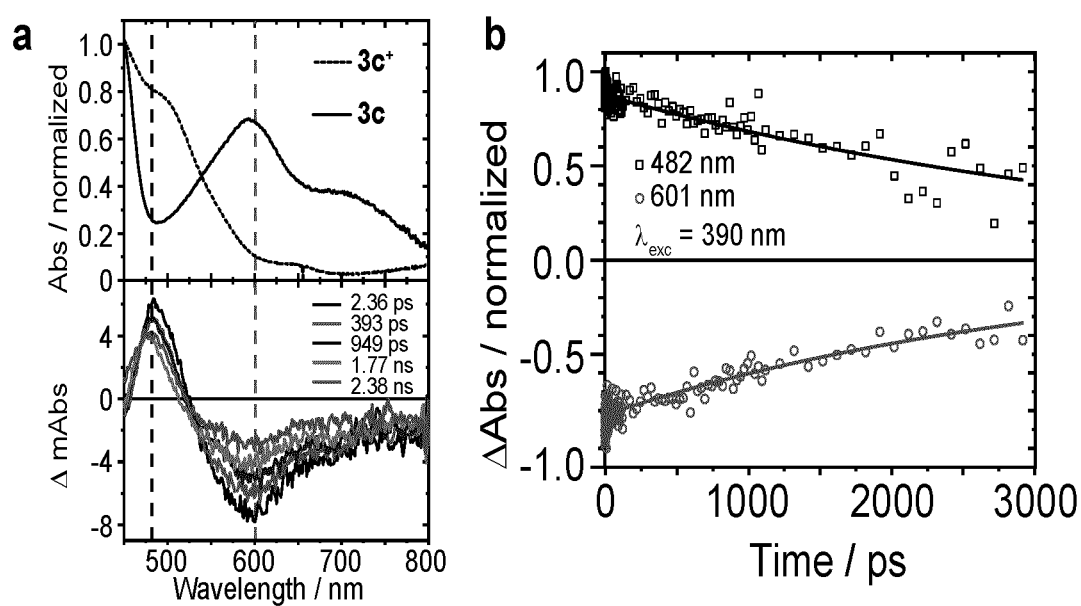
FIG. 20 shows examples of (a) steady-state absorption spectrum of [3c]$^{0/+}$ (top) and transient absorption (TA) spectra (bottom) of 3c in acetonitrile at indicated time delays. (b) Kinetic traces at indicated wavelengths (see legend) and exponential fits (solid lines, fitting results are summarized in Table 6). Spectra were generated using an excitation wavelength of 390 nm, as noted in the figure.

Time constants obtained from kinetics traces shown in FIGS. 18, 19 and 20 at indicated wavelengths, fit to single exponential decay functions ($\lambda_{excitation}$ = 390 nm).

| | $\lambda_{obs}$ (nm) | $T_{rise}$ (ps) | $T_1$ (ps) | $T_2$ (ps) |
|---|---|---|---|---|
| 3b | 485 | — | — | 5951 ± 625 |
| | 617 | 0.25 ± 0.03 | 9.6 ± 1.7 | 3542 ± 302 |
| 3a | 489 | — | 0.33 ± 0.07 | 2185 ± 277 |
| | 609 | 0.44 ± 0.04 | 14.4 ± 2.2 | 4334 ± 392 |
| 3c | 482 | — | 1.10 ± 1.14 | 4046 ± 183 |
| | 601 | — | 14.6 ± 8.6 | 3254 ± 159 |

The GSB was fitted with single exponent rise and decay functions, while the ESA could only be described by two-exponent functions (FIG. 19c). The rise of the ESA was faster than the instrument response time of 150 fs, consistent with rapid formation of a $^1$MLCT-like state (Aubock, G. & Chergui, M. Sub-50-fs photoinduced spin crossover in [Fe (bpy)3]2+. *Nat. Chem.* 7, 629-633 (2015)). Global fit analysis was used to identify two principle components in the TA spectra (FIG. 19b). The principle components resembled the characteristic spectra at 421 fs and 1.07 ps. An initial ESA is centered at 466 nm at 421 fs without a GSB, and at 1.07 ps the ESA has red shifted to 485 nm with the GSB fully established at 617 nm by that time. For both complexes, the rise time of the >600 nm CT absorption match well with the first decay constant at <490 nm, indicating the fast relaxation of an initial excited state and subsequent population of a long-lived CT state, with CT excited-state lifetimes of ~4 ns for both 3a and 3b. This is better than the reported longest charge-transfer excited-state lifetime accessible for LMCT (Chabera, P. et al. A Low-spin Fe(III) complex with 100-ps ligand-to-metal charge transfer photoluminescence. *Nature* 543, 695-699 (2017)) in an Fe(III) complex or the corresponding MLCT for its Fe(II) analog (Chabera, P. et al. Fe(II) hexa N-heterocyclic carbene complex with a 528 ps metal-to-ligand charge-transfer excited-state lifetime. *J. Phys. Chem. Lett.* 9, 459-463 (2018)).

The above disclosure generally describes the present invention. Although specific terms have been employed herein, such terms are intended in a descriptive sense and not for purposes of limitation.

Patent applications, patents, and publications are cited herein to assist in understanding the embodiments described. All such references cited herein are incorporated herein by reference in their entirety and for all purposes to the same extent as if each individual publication or patent or patent application was specifically and individually indicated to be incorporated by reference in its entirety for all purposes. To the extent publications and patents or patent applications incorporated by reference contradict the disclosure contained in the specification, the specification is intended to supersede and/or take precedence over any such contradictory material.

Although specific embodiments of the invention have been described herein in detail, it will be understood by those skilled in the art that variations may be made thereto without departing from the spirit of the invention or the scope of the appended claims.

It will be understood that certain of the above-described structures, functions, and operations of the above-described embodiments are not necessary to practice the present invention and are included in the description simply for completeness of an exemplary embodiment or embodiments. In addition, it will be understood that specific structures, functions, and operations set forth in the above-described referenced patents and publications can be practiced in conjunction with the present invention, but they are not essential to its practice. It is therefore to be understood that the invention may be practiced otherwise than as specifically described without actually departing from the spirit and scope of the present invention as defined by the appended claims.

We claim:

1. A metal complex having the structure of Formula I:

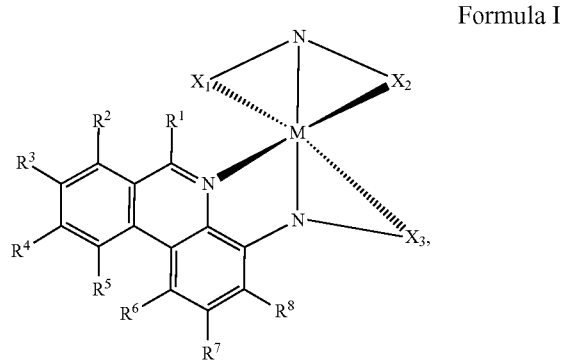

Formula I a salt, hydrate, solvate, tautomer, optical isomer, or combination thereof;
wherein:
$R^1$ to $R^8$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic;

$X_1$ to $X_3$ are each independently selected from a substituted or unsubstituted aromatic, or a substituted or unsubstituted heteroaromatic; and M is a metal.

2. The complex of claim 1, wherein $R^1$ to $R^8$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted arylalkenyl group, substituted or unsubstituted arylalkynyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group;

wherein $R^1$ to $R^8$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group;

wherein $R^1$ to $R^8$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group;

wherein $R^1$ to $R^8$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group; or wherein $R^1$ to $R^8$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group.

3. The complex of claim 1, wherein $R^7$ is selected from H, a carboxylic acid group, carboxyl group, phosphate group, halo group, substituted or unsubstituted alkyl group, or substituted or unsubstituted haloalkyl group and $R^2$ to $R^6$ and $R^8$ are each independently selected from H or substituted or unsubstituted alkyl group;

wherein $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^2$ to $R^6$ and $R^8$ are each independently selected from H or substituted or unsubstituted $C_1$-$C_6$ alkyl group;

wherein $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^2$ to $R^6$ and $R^8$ are each H;

wherein $R^7$ is selected from a carboxylic acid group, carboxyl group, phosphate group, halo group, substituted or unsubstituted $C_1$-$C_6$ alkyl group, or substituted or unsubstituted $C_1$-$C_6$ haloalkyl group; or wherein $R^1$ is selected from a carboxylic acid group, carboxyl group, halo group, $C_1$-$C_6$ alkyl group, or $C_1$-$C_6$ haloalkyl group.

4. A metal complex having the structure selected from:

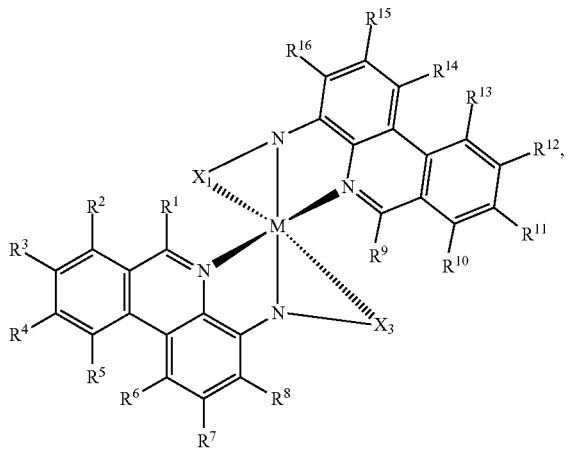

Formula Ia

-continued

Formula Ib

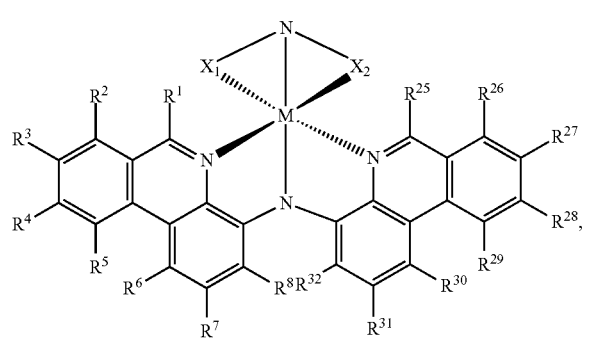

Formula Ic

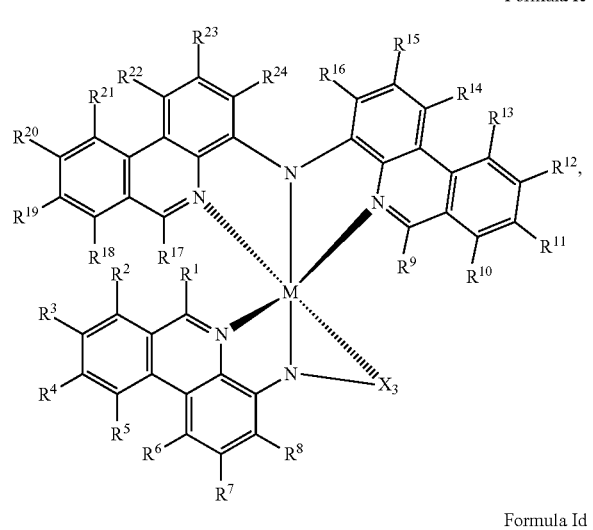

Formula Id

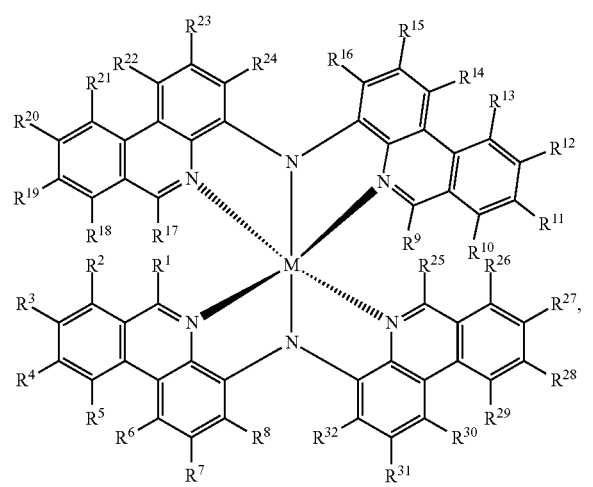

a salt, hydrate, solvate, tautomer, optical isomer, or combination thereof,
wherein:
$R^1$ to $R^{32}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic;

$X_1$ to $X_3$ are each independently selected from a substituted or unsubstituted aromatic, or a substituted or unsubstituted heteroaromatic; and M is a metal.

5. The complex of claim 4, wherein $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted arylalkenyl group, substituted or unsubstituted arylalkynyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group;

wherein $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group;

wherein $R^1$ to $R^{32}$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group;
    wherein $R^1$ to $R^{32}$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group; or
    wherein $R^1$ to $R^{32}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group.

6. The complex of claim 4, wherein $R^7$, $R^{15}$, $R^{23}$, and $R^{31}$ are each independently selected from H, a carboxylic acid group, carboxyl group, phosphate group, halo group, substituted or unsubstituted alkyl group, or substituted or unsubstituted haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted alkyl group;
    wherein $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted $C_1$-$C_6$ alkyl group; or
    wherein $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to 10 4, $R^{16}$ to $R^{22}$, $R^{24}$ to $R^{30}$, and $R^{32}$ are each H.

7. The complex of claim 4, wherein $R^7$, $R^{15}$, $R^{23}$, and $R^{31}$ are each independently selected from a carboxylic acid group, carboxyl group, phosphate group, halo group, substituted or unsubstituted $C_1$-$C_6$ alkyl group, or substituted or unsubstituted $C_1$-$C_6$ haloalkyl group; or
    wherein $R^7$, $R^{15}$, $R^{23}$, and $R^{31}$ are each independently selected from a carboxylic acid group, carboxyl group, halo group, $C_1$-$C_6$ alkyl group, or $C_1$-$C_6$ haloalkyl group.

8. A metal complex having the structure selected from:

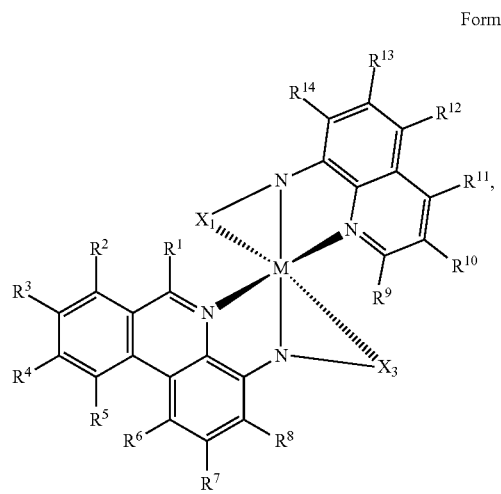

Formula Ie

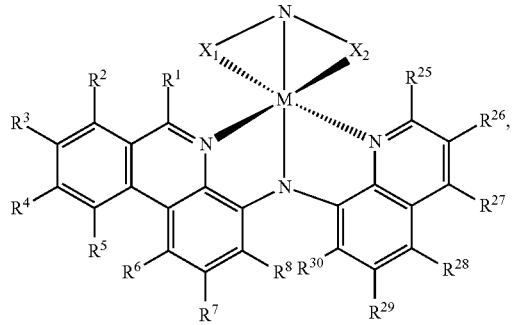

Formula If

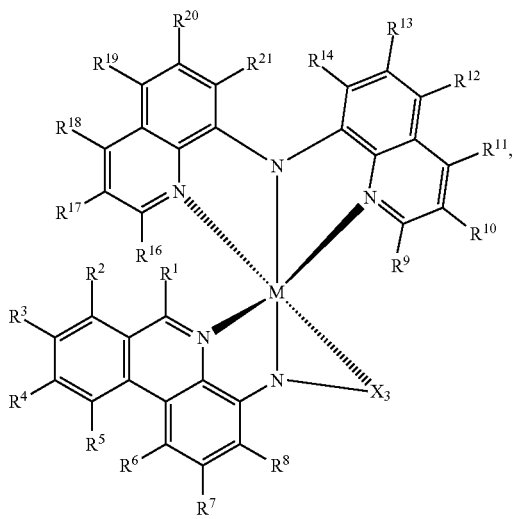

Formula Ig

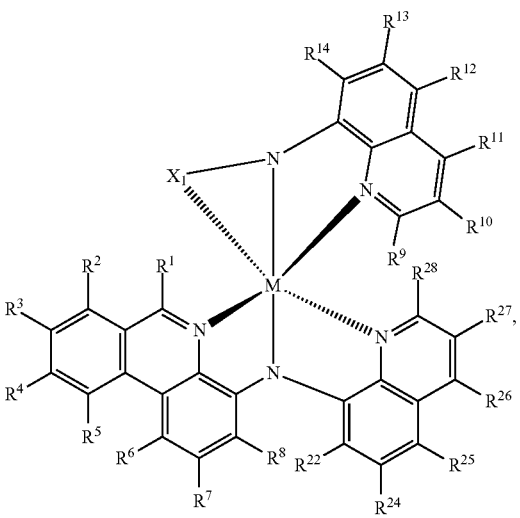

Formula Ih

-continued

Formula Ii

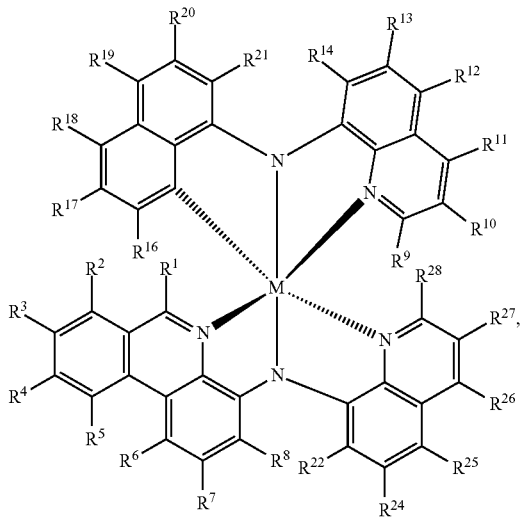

a salt, hydrate, solvate, tautomer, optical isomer, or combination thereof;
wherein:
$R^1$ to $R^{14}$, $R^{16}$ to $R^{22}$, $R^{24}$ to $R^{28}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic;
$X_1$ to $X_3$ are each independently selected from a substituted or unsubstituted aromatic, or a substituted or unsubstituted heteroaromatic;
and M is a metal.

9. The complex of claim 8, wherein $R^1$ to $R^{14}$, $R^{16}$ to $R^{22}$, $R^{24}$ to $R^{28}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group;
wherein $R^1$ to $R^{14}$, $R^{16}$ to $R^{22}$, $R^{24}$ to $R^{28}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group;
wherein $R^1$ to $R^{14}$, $R^{16}$ to $R^{22}$, $R^{24}$ to $R^{28}$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group wherein $R^1$ to $R^{14}$, $R^1$ to $R^{22}$, $R^{24}$ to $R^{28}$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group; or
wherein $R^1$ to $R^{14}$, $R^1$ to $R^{22}$, $R^{24}$ to $R^{28}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group.

10. The complex of claim 8, wherein $R^7$ is selected from H, a carboxylic acid group, carboxyl group, phosphate group, halo group, substituted or unsubstituted alkyl group, or substituted or unsubstituted haloalkyl group and $R^1$ to $R^6$, $R^8$ to $R^{14}$, $R^{16}$ to $R^{22}$, $R^{24}$ to $R^{28}$ are each independently selected from H or substituted or unsubstituted alkyl group;
wherein $R^7$ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{28}$ are each independently selected from H or substituted or unsubstituted $C_1$-$C_6$ alkyl group; or wherein R⁷ is selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{28}$ are each H.

11. The complex of claim 8, wherein R⁷ is selected from a carboxylic acid group, carboxyl group, phosphate group, halo group, substituted or unsubstituted $C_1$-$C_6$ alkyl group, or substituted or unsubstituted $C_1$-$C_6$ haloalkyl group; or wherein R⁷ is selected from a carboxylic acid group, carboxyl group, halo group, $C_1$-$C_6$ alkyl group, or $C_1$-$C_6$ haloalkyl group.

12. A metal complex according to claim 1 having the structure selected from:

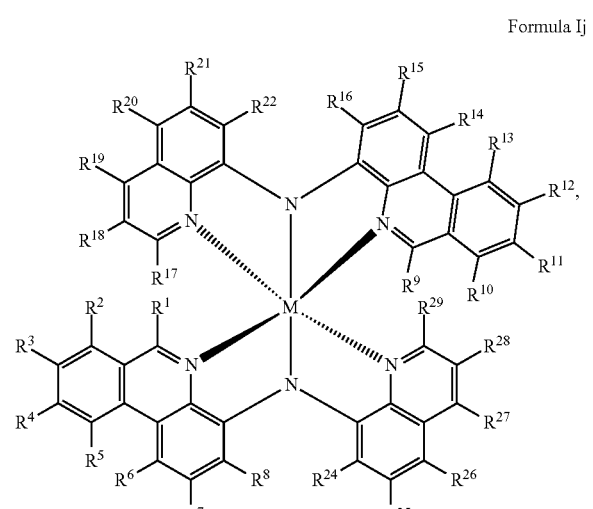

Formula Ij

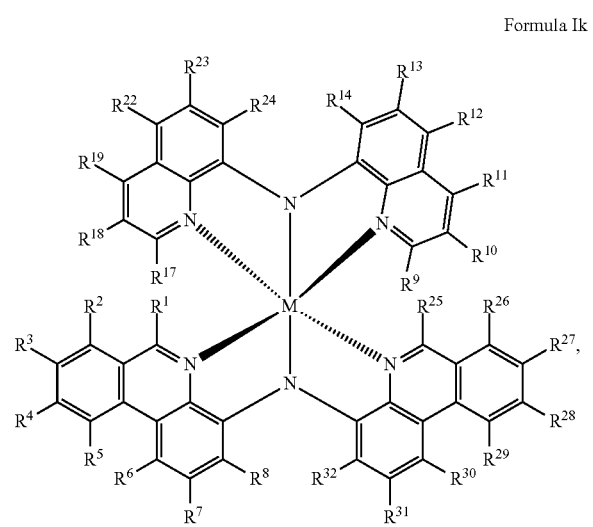

Formula Ik

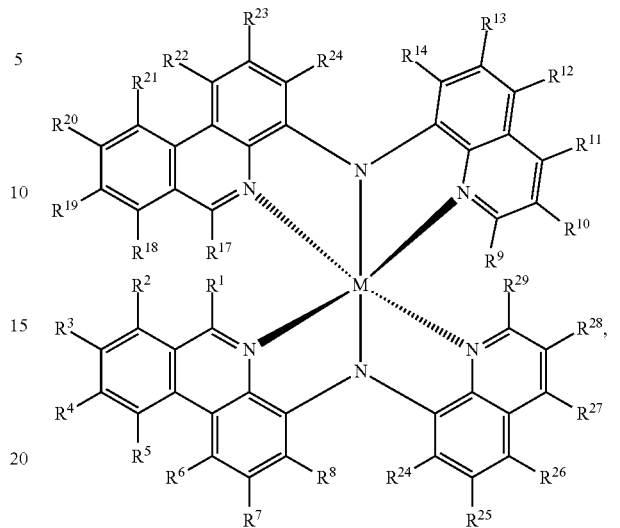

Formula Im

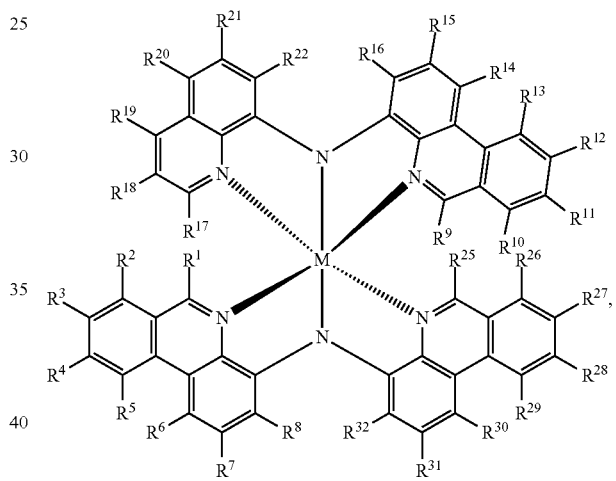

Formula In a salt, hydrate, solvate, tautomer, optical isomer, or combination thereof;

wherein:
$R^1$ to $R^{32}$ are each independently selected from H, carboxylic acid group, carboxyl group, phosphate group, phosphonic acid group, hydroxamic acid group, amido group, halo group, hydroxyl group, amino group, nitro group, a substituted or unsubstituted carboxylhydrocarbon group, a substituted or unsubstituted hydrocarbon group, a substituted or unsubstituted heterogeneous group, a substituted or unsubstituted carbocyclic group, a substituted or unsubstituted heterocyclic group, substituted or unsubstituted aromatic, or a substituted or unsubstituted heteroaromatic;

$X_1$ to $X_3$ are each independently selected from a substituted or unsubstituted aromatic, or a substituted or unsubstituted heteroaromatic; and M is a metal.

13. The complex of claim 12, wherein $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, a substituted or unsubstituted heterocyclic group, a substituted or unsubstituted aromatic group, a substituted or unsubstituted heteroaromatic group, substituted or unsubstituted alkylcarbonyl group, substituted or unsubstituted arylcarbonyl group, substituted or unsubstituted cycloalkylcarbonyl group, substituted or unsubstituted heterocyclylcarbonyl group, substituted or unsubstituted aminoalkyl group, substituted or unsubstituted alkylaminoalkyl group, substituted or unsubstituted heterocyclylalkyl group, substituted or unsubstituted aralkyl group, substituted or unsubstituted alkylthio group, substituted or unsubstituted alkylamino group, substituted or unsubstituted arylamino group, substituted or unsubstituted heteroarylamino group, substituted or unsubstituted aralkylamino group, substituted or unsubstituted alkylaminoalkylamino group, substituted or unsubstituted arylthio group, substituted or unsubstituted aralkylthio group, substituted or unsubstituted aryloxy group, substituted or unsubstituted aralkoxy group, substituted or unsubstituted heterocyclylalkoxy group, substituted or unsubstituted heterocyclyloxyalkyl group, substituted or unsubstituted cycloalkyl group, or substituted or unsubstituted cycloalkenyl group;
- wherein $R^1$ to $R^{32}$ are each independently selected from H, a carboxylic acid group, carboxyl group, phosphate group, phosphonic acid group, hydroxamic acid group, amido group, halo group, hydroxyl group, cyano group, amino group, nitro group, substituted or unsubstituted carboxylalkyl group, substituted or unsubstituted carboxylalkenyl group, substituted or unsubstituted carboxylalkynyl group, substituted or unsubstituted alkyl group, substituted or unsubstituted alkenyl group, substituted or unsubstituted alkynyl group, substituted or unsubstituted haloalkyl group, substituted or unsubstituted hydroxyalkyl group, substituted or unsubstituted alkoxy group, substituted or unsubstituted alkylcarbonyl group, substituted or unsubstituted aminoalkyl group, or substituted or unsubstituted alkylaminoalkyl group;
- wherein $R^1$ to $R^{32}$ are each independently selected from H, a carboxylic acid group, carboxyl group, phosphate group, halo group, hydroxyl group, cyano group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, substituted or unsubstituted $C_1$-$C_6$ haloalkyl group, substituted or unsubstituted $C_1$-$C_6$ alkoxy group, or substituted or unsubstituted $C_1$-$C_6$ aminoalkyl group;
- wherein $R^1$ to $R^{32}$ are each independently selected from H, a carboxylic acid group, carboxyl group, phosphate group, halo group, amino group, nitro group, substituted or unsubstituted $C_1$-$C_6$ alkyl group, substituted or unsubstituted $C_2$-$C_6$ alkenyl group, substituted or unsubstituted $C_2$-$C_6$ alkynyl group, or substituted or unsubstituted $C_1$-$C_6$ haloalkyl group; or
- wherein $R^1$ to $R^{32}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group.

14. The complex of claim 12, wherein $R^7$, $R^{15}$, $R^{23}$, and $R^{31}$ are each independently selected from H, a carboxylic acid group, carboxyl group, phosphate group, halo group, substituted or unsubstituted alkyl group, or substituted or unsubstituted haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted alkyl group;
- wherein $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each independently selected from H or substituted or unsubstituted $C_1$-$C_6$ alkyl group;
- wherein $R^7$, $R^{15}$, $R^{23}$, and $R^{31}$ are each independently selected from H, a carboxylic acid group, carboxyl group, phosphate group, halo group, substituted or unsubstituted $C_1$-$C_6$ alkyl group, or substituted or unsubstituted $C_1$-$C_6$ haloalkyl group and $R^1$ to $R^6$, $R^8$ to $R^{14}$, $R^{16}$ to $R^{22}$, $R^{24}$ to $R^{30}$, and $R^{32}$ are each H.

15. The complex of claim 1, wherein $R^7$, $R^{15}$, $R^{23}$, and $R^{31}$ are each independently selected from a carboxylic acid group, carboxyl group, phosphate group, halo group, substituted or unsubstituted $C_1$-$C_6$ alkyl group, or substituted or unsubstituted $C_1$-$C_6$ haloalkyl group; or
- wherein $R^7$, $R^{15}$, $R^{23}$, and $R^{31}$ are each independently selected from a carboxylic acid group, carboxyl group, halo group, $C_1$-$C_6$ alkyl group, or $C_1$-$C_6$ haloalkyl group.

16. The complex of claim 1, wherein $X_1$ to $X_3$ are each independently selected from substituted or unsubstituted monocyclic aromatic groups, substituted or unsubstituted polycyclic aromatic groups, substituted or unsubstituted monocyclic heteroaromatic groups, or substituted or unsubstituted polycyclic heteroaromatic groups;
- wherein $X_1$ to $X_3$ are each independently selected from substituted or unsubstituted phenyl, substituted or unsubstituted naphthyl, substituted or unsubstituted tetrahydronaphthyl, substituted or unsubstituted indanyl, substituted or unsubstituted biphenyl, substituted or unsubstituted phenanthryl, substituted or unsubstituted anthryl, substituted or unsubstituted acenaphthyl, substituted or unsubstituted pyrrolyl, substituted or unsubstituted imidazolyl, substituted or unsubstituted thiazolyl, substituted or unsubstituted oxazolyl, substituted or unsubstituted furanyl, substituted or unsubstituted thiophenyl, substituted or unsubstituted triazolyl, substituted or unsubstituted pyrazolyl, substituted or unsubstituted isoxazolyl, substituted or unsubstituted isothiazolyl, substituted or unsubstituted pyridinyl, substituted or unsubstituted pyrazinyl, substituted or unsubstituted pyridazinyl, substituted or unsubstituted pyrimidinyl, substituted or unsubstituted triazinyl, substituted or unsubstituted indolyl, substituted or unsubstituted benzofuranyl, substituted or unsubstituted benzothiophenyl, substituted or unsubstituted benzimidazolyl, substituted or unsubstituted benzthiazolyl, substituted or unsubstituted quinolinyl, substituted or unsubstituted isoquinolinyl, substituted or unsubstituted quinazolinyl, or substituted or unsubstituted quinoxalinyl; or
- wherein if $X_1$ to $X_3$ are each independently selected from substituted or unsubstituted heteroaromatic groups, at least one heteroatom of the ring of the heteroaromatic group is covalently bonded to M.

17. The complex of claim 4, wherein $X_1$ to $X_3$ are each independently selected from substituted or unsubstituted monocyclic aromatic groups, substituted or unsubstituted polycyclic aromatic groups, substituted or unsubstituted monocyclic heteroaromatic groups, or substituted or unsubstituted polycyclic heteroaromatic groups;

wherein $X_1$ to $X_3$ are each independently selected from substituted or unsubstituted phenyl, substituted or unsubstituted naphthyl, substituted or unsubstituted tetrahydronaphthyl, substituted or unsubstituted indanyl, substituted or unsubstituted biphenyl, substituted or unsubstituted phenanthryl, substituted or unsubstituted anthryl, substituted or unsubstituted acenaphthyl, substituted or unsubstituted pyrrolyl, substituted or unsubstituted imidazolyl, substituted or unsubstituted thiazolyl, substituted or unsubstituted oxazolyl, substituted or unsubstituted furanyl, substituted or unsubstituted thiophenyl, substituted or unsubstituted triazolyl, substituted or unsubstituted pyrazolyl, substituted or unsubstituted isoxazolyl, substituted or unsubstituted isothiazolyl, substituted or unsubstituted pyridinyl, substituted or unsubstituted pyrazinyl, substituted or unsubstituted pyridazinyl, substituted or unsubstituted pyrimidinyl, substituted or unsubstituted triazinyl, substituted or unsubstituted indolyl, substituted or unsubstituted benzofuranyl, substituted or unsubstituted benzothiophenyl, substituted or unsubstituted benzimidazolyl, substituted or unsubstituted benzthiazolyl, substituted or unsubstituted quinolinyl, substituted or unsubstituted isoquinolinyl, substituted or unsubstituted quinazolinyl, or substituted or unsubstituted quinoxalinyl; or wherein if $X_1$ to $X_3$ are each independently selected from substituted or unsubstituted heteroaromatic groups, at least one heteroatom of the ring of the heteroaromatic group is covalently bonded to M.

18. The complex of claim 8, wherein $X_1$ to $X_3$ are each independently selected from substituted or unsubstituted monocyclic aromatic groups, substituted or unsubstituted polycyclic aromatic groups, substituted or unsubstituted monocyclic heteroaromatic groups, or substituted or unsubstituted polycyclic heteroaromatic groups;

wherein $X_1$ to $X_3$ are each independently selected from substituted or unsubstituted phenyl, substituted or unsubstituted naphthyl, substituted or unsubstituted tetrahydronaphthyl, substituted or unsubstituted indanyl, substituted or unsubstituted biphenyl, substituted or unsubstituted phenanthryl, substituted or unsubstituted anthryl, substituted or unsubstituted acenaphthyl, substituted or unsubstituted pyrrolyl, substituted or unsubstituted imidazolyl, substituted or unsubstituted thiazolyl, substituted or unsubstituted oxazolyl, substituted or unsubstituted furanyl, substituted or unsubstituted thiophenyl, substituted or unsubstituted triazolyl, substituted or unsubstituted pyrazolyl, substituted or unsubstituted isoxazolyl, substituted or unsubstituted isothiazolyl, substituted or unsubstituted pyridinyl, substituted or unsubstituted pyrazinyl, substituted or unsubstituted pyridazinyl, substituted or unsubstituted pyrimidinyl, substituted or unsubstituted triazinyl, substituted or unsubstituted indolyl, substituted or unsubstituted benzofuranyl, substituted or unsubstituted benzothiophenyl, substituted or unsubstituted benzimidazolyl, substituted or unsubstituted benzthiazolyl, substituted or unsubstituted quinolinyl, substituted or unsubstituted isoquinolinyl, substituted or unsubstituted quinazolinyl, or substituted or unsubstituted quinoxalinyl; or wherein if $X_1$ to $X_3$ are each independently selected from substituted or unsubstituted heteroaromatic groups, at least one heteroatom of the ring of the heteroaromatic group is covalently bonded to M.

19. The complex of claim 1, wherein M is a metal selected from a transition metal, or an isotopic form thereof optionally, M is selected from scandium, titanium, vanadium, chromium, manganese, iron, cobalt, nickel, copper, zinc, ruthenium, rhodium, palladium, iridium, silver, platinum, or gold; or M is selected from iron, chromium, iridium, or rhodium.

20. The complex of claim 4 wherein M is a metal selected from a transition metal, or an isotopic form thereof optionally, M is selected from scandium, titanium, vanadium, chromium, manganese, iron, cobalt, nickel, copper, zinc, ruthenium, rhodium, palladium, iridium, silver, platinum, or gold; or M is selected from iron, chromium, iridium, or rhodium.

21. The complex of claim 8, wherein M is a metal selected from a transition metal, or an isotopic form thereof optionally, M is selected from scandium, titanium, vanadium, chromium, manganese, iron, cobalt, nickel, copper, zinc, ruthenium, rhodium, palladium, iridium, silver, platinum, or gold; or M is selected from iron, chromium, iridium, or rhodium.

22. The complex of claim 12 wherein M is a metal selected from a transition metal, or an isotopic form thereof optionally, M is selected from scandium, titanium, vanadium, chromium, manganese, iron, cobalt, nickel, copper, zinc, ruthenium, rhodium, palladium, iridium, silver, platinum, or gold; or M is selected from iron, chromium, iridium, or rhodium.

23. The complex of claim 1, wherein the complex is a salt; optionally, the salt has at least one counterion selected from halide ions, $NO_3^-$, $ClO_4^-$, $OH^-$, $H_2PO_4^-$, $HSO_4^-$, $^-BF_4$, $^-PF_6$, sulfonate ions, carboxylate ions or combinations thereof.

24. A metal complex according to claim 1 having the structure selected from:

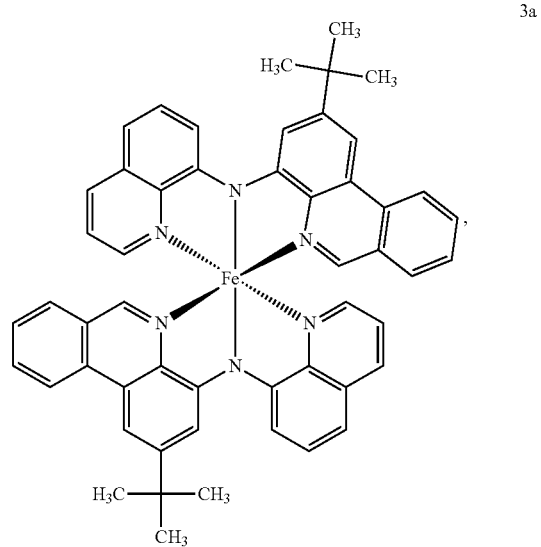
3a

-continued
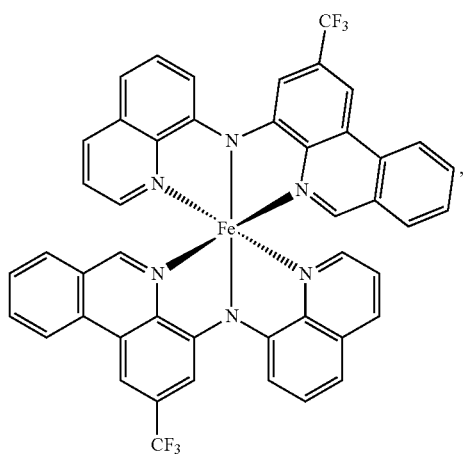
3b
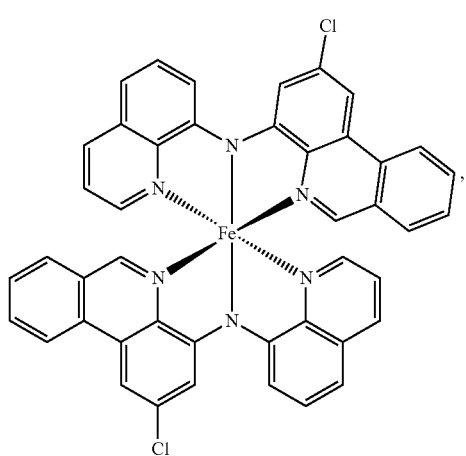
3c
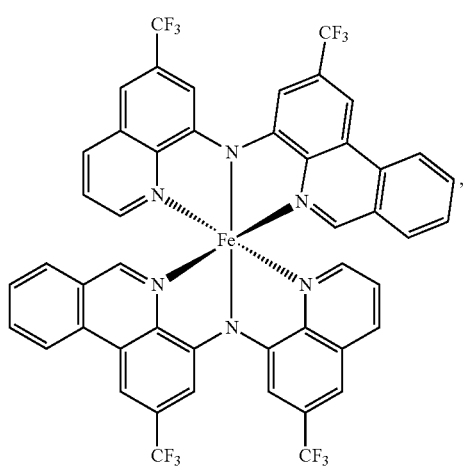
3d
-continued
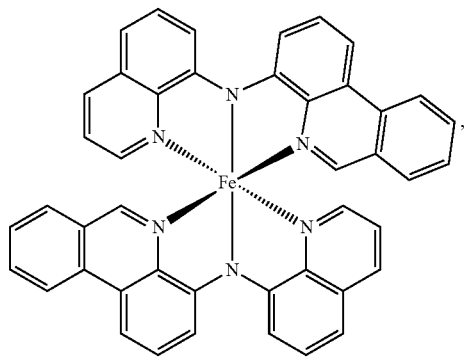
3e
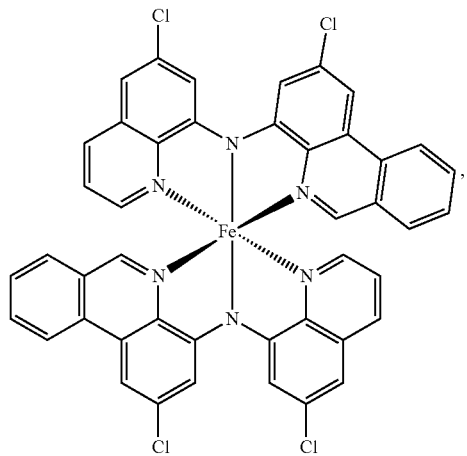
3f
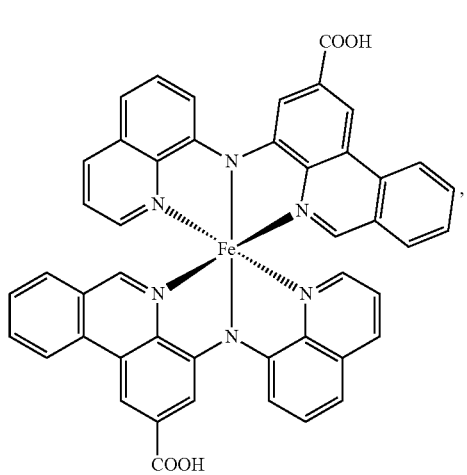
3g -continued
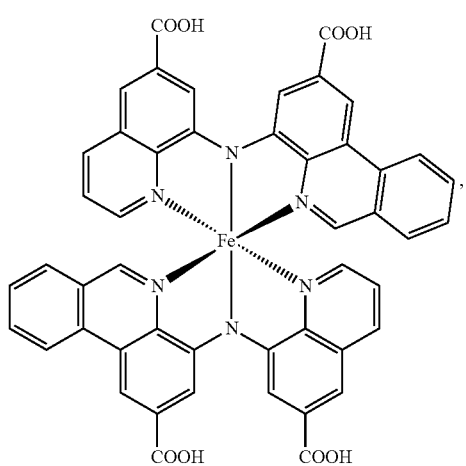
3h
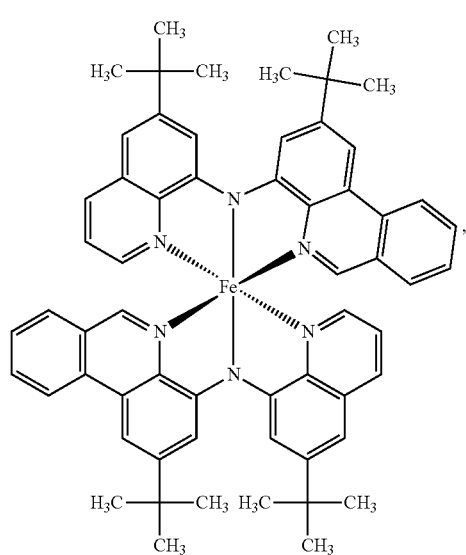
3i
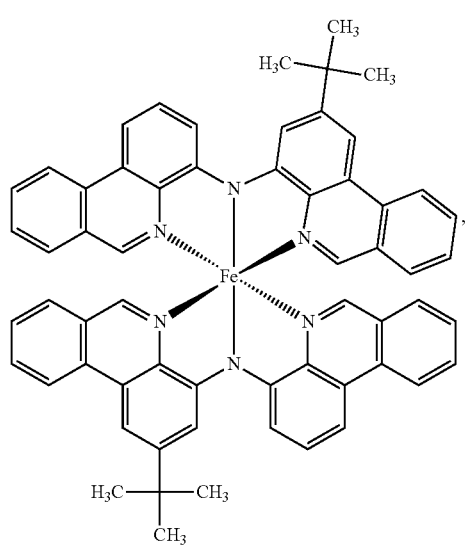
3j
-continued
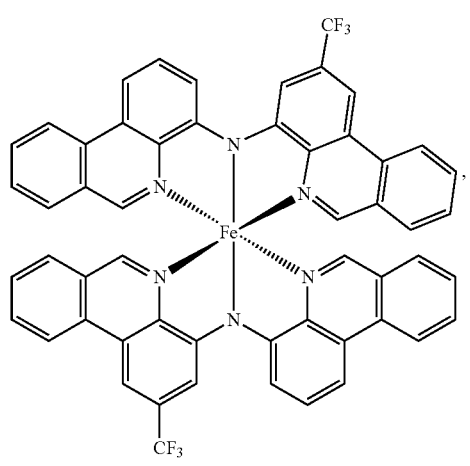
3k
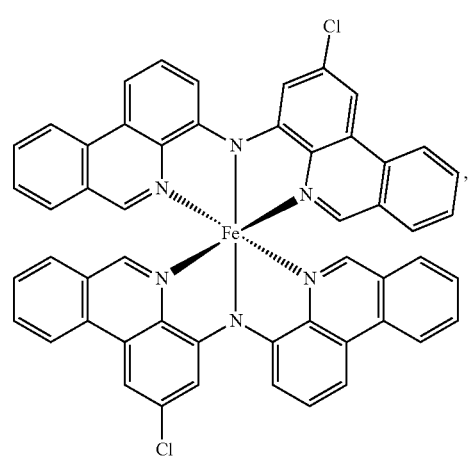
3l
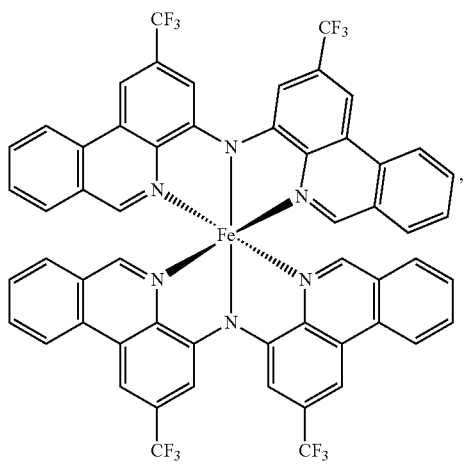
3m -continued

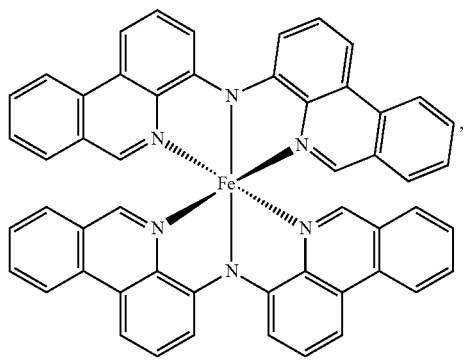
3n

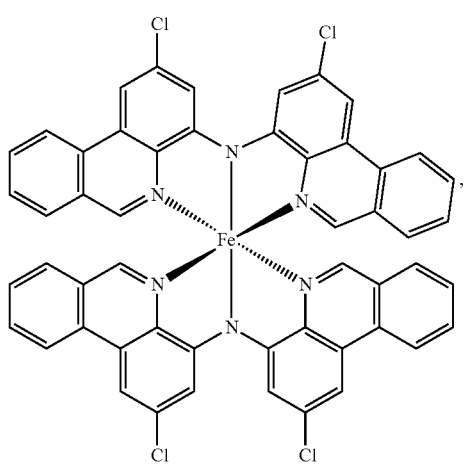
3o

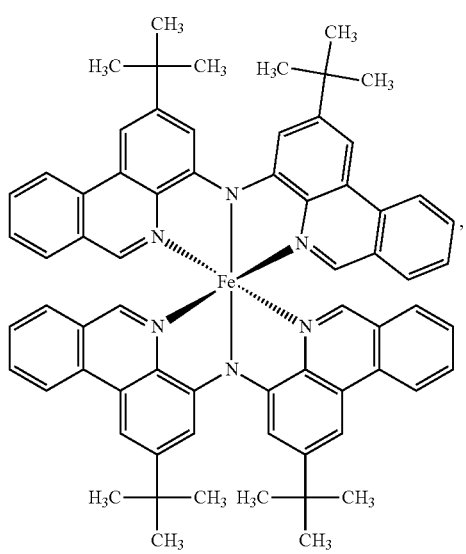
3p

-continued

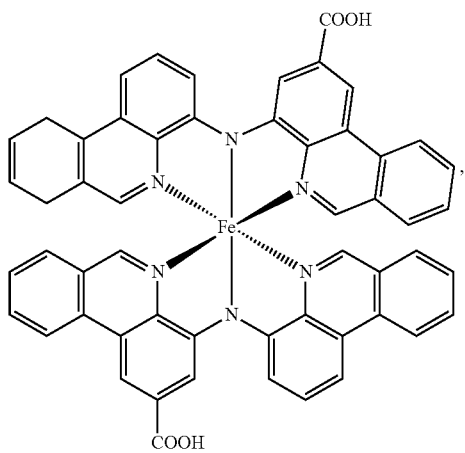
3q

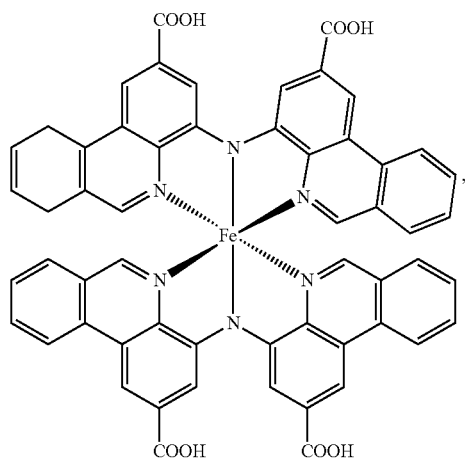
3r a salt, hydrate, solvate, tautomer, optical isomer, or combination thereof.

25. The complex of claim 24, wherein the metal complex is selected from 3c, 3d, 3f, 3k, 3l, 3m, 3o, a salt, hydrate, solvate, tautomer, optical isomer, or combination thereof.

26. The complex of claim 24, wherein the complex is a salt.

27. The complex of claim 26, wherein the salt has at least one counterion selected from halide ions, $NO_3^-$, $ClO_4^-$, $OH^-$, $H_2PO_4^-$, $HSO_4^-$, $^-BF_4$, $^-PF_6$, sulfonate ions, carboxylate ions or combinations thereof.

28. The complex of claim 1, wherein the metal complex excludes:

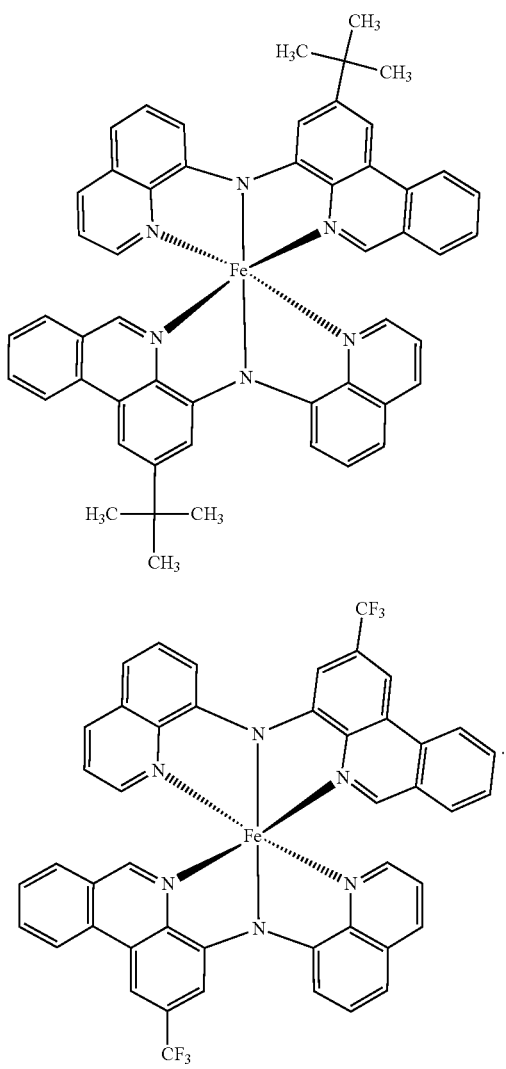

29. The complex of claim 1, wherein the metal complex is substantially stable towards oxidation; optionally, the metal complex is substantially stable towards oxidation in ambient air.

30. The complex of claim 1, wherein at least one of the R groups is a group useful for tethering to a semiconductor; optionally, the at least one of the R groups is carboxylic acid or phosphate group.

31. The complex of claim 1, wherein the metal complex exhibits panchromatic absorption; optionally, the panchromatic absorption is in the visible range of the electromagnetic spectrum.

32. The complex of claim 1, wherein the complex is capable of absorbing sunlight; or wherein the complex is capable of absorbing visible light of all colors, optionally, less than about 920 nm.

33. The complex of claim 1, wherein the complex has a molar absorptivity cross-section that is about 10 $mM^{-1}cm^{-1}$ to about 30 $mM^{-1}cm^{-1}$, about 15 $mM^{-1}cm^{-1}$ to about 30 $mM^{-1}cm^{-1}$, about 10 $mM^{-1}cm^{-1}$ to about 25 $mM^{-1}cm^{-1}$, or about 10 $mM^{-1}cm^{-1}$ to about 20 $mM^{-1}cm^{-1}$.

34. The complex of claim 1, wherein the complex has a long-lived charge-transfer excited state; optionally, the metal complex has a charge-transfer excited state lifetime from about 1 ns to about 7 ns; about 1 ns to about 6 ns; about 1 ns to about 5 ns; about 2 ns to about 4.5 ns, about 2 ns to about 4.3 ns; about 2.2 ns to about 5 ns; about 2.5 ns to about 5 ns; or about 3 ns to about 5 ns.

35. A composition comprising at least one metal complex according to claim 1.

36. A photosensitizer comprising at least one metal complex according to claim 1.

37. A catalyst comprising at least one metal complex according to claim 1; optionally, the catalyst is a photocatalyst.

38. An electronic device comprising at least one metal complex according to claim 1; optionally, the device is an organic electronic device; the device is a solar cell including a hybrid solar cell, an organic solar cell, or a dye-sensitized solar cell (DSC); the device is a solid-state dye-sensitized solar cell (ssDSC); or the device is an organic light emitting diode (OLED) or an organic transistor.

\* \* \* \* \*